(12) United States Patent
Nishizono et al.

(10) Patent No.: US 10,566,879 B2
(45) Date of Patent: Feb. 18, 2020

(54) ELECTRONIC DEVICE

(71) Applicant: Renesas Electronics Corporation, Tokyo (JP)

(72) Inventors: Shinji Nishizono, Tokyo (JP); Tadashi Shimizu, Tokyo (JP); Tomohiro Nishiyama, Tokyo (JP); Norikazu Motohashi, Tokyo (JP)

(73) Assignee: RENESAS ELECTRONICS CORPORATION, Koutou-ku, Tokyo (JP)

( * ) Notice: Subject to any disclaimer, the term of this patent is extended or adjusted under 35 U.S.C. 154(b) by 307 days.

(21) Appl. No.: 15/563,011

(22) PCT Filed: Sep. 14, 2015

(86) PCT No.: PCT/JP2015/075999
§ 371 (c)(1),
(2) Date: Sep. 29, 2017

(87) PCT Pub. No.: WO2017/046841
PCT Pub. Date: Mar. 23, 2017

(65) Prior Publication Data
US 2018/0367012 A1    Dec. 20, 2018

(51) Int. Cl.
*H02K 11/33*    (2016.01)
*H01L 23/528*   (2006.01)
(Continued)

(52) U.S. Cl.
CPC ............ *H02K 11/33* (2016.01); *H01L 23/528* (2013.01); *H01L 24/48* (2013.01); *H02M 7/537* (2013.01);
(Continued)

(58) Field of Classification Search
CPC ................................ H02K 11/33; H02K 11/30
See application file for complete search history.

(56) References Cited

U.S. PATENT DOCUMENTS 8,803,383 B2 *  8/2014  Miyachi ................. H02K 11/33
                                                  310/68 D
8,957,557 B2 *  2/2015  Yamasaki ............ B62D 5/0406
                                                  310/68 D
(Continued)

FOREIGN PATENT DOCUMENTS

JP    06-299952 A    10/1994
JP    2004-297847 A  10/2004
(Continued)

OTHER PUBLICATIONS

International Search Report of PCT/JP2015/075999 dated Dec. 8, 2015 [PCT/ISA/210].

*Primary Examiner* — Errol V Fernandes
(74) *Attorney, Agent, or Firm* — Sughrue Mion, PLLC

(57) ABSTRACT

A first semiconductor device having a power transistor for switching is mounted on a power wiring substrate PB1; a semiconductor device PKG6 having a driving circuit for driving the first semiconductor device and a semiconductor device PKG5 having a control circuit for controlling the semiconductor device PKG6 are mounted on a first principal surface of a control wiring substrate PB2; and a semiconductor device PKG4 having a regulator circuit is mounted on a second principal surface of the control wiring substrate PB2. On the first principal surface of the control wiring substrate PB2, the semiconductor device PKG5 and the semiconductor device PKG6 are mounted in a second area out of the second area and a third area adjacent to each other via a first area in which a plurality of holes HC3 are arranged. On the second principal surface of the control wiring substrate PB2, the semiconductor device PKG4 is mounted in a fifth area out of a fourth area positioned opposite the second area and the fifth area positioned opposite the third area.

19 Claims, 39 Drawing Sheets

(51) Int. Cl.
 _H01L 23/00_ (2006.01)
 _H02M 7/537_ (2006.01)
 _H02P 27/06_ (2006.01)

(52) U.S. Cl.
 CPC .... *H01L 2224/48105* (2013.01); *H02P 27/06* (2013.01)

(56) References Cited

U.S. PATENT DOCUMENTS

| | | | |
|---|---|---|---|
| 9,000,633 B2 * | 4/2015 | Yamasaki | B62D 5/0406 |
| | | | 310/64 |
| 9,088,195 B2 * | 7/2015 | Yamasaki | B62D 5/0406 |
| 9,124,155 B2 * | 9/2015 | Yamasaki | B62D 5/0406 |
| 9,586,615 B2 * | 3/2017 | Asao | B62D 5/0406 |
| 9,780,619 B2 * | 10/2017 | Fujimoto | H02K 5/22 |
| 9,944,312 B2 * | 4/2018 | Inada | B62D 5/0406 |
| 2012/0104886 A1 | 5/2012 | Yamasaki et al. | |

FOREIGN PATENT DOCUMENTS

| | | |
|---|---|---|
| JP | 2007-242703 A | 9/2007 |
| JP | 2009-261122 A | 11/2009 |
| JP | 2011-176999 A | 9/2011 |
| JP | 2013-062959 A | 4/2013 |
| JP | 2013-103534 A | 5/2013 |
| JP | 2014-086658 A | 5/2014 |

* cited by examiner

ELECTRONIC DEVICE

TECHNICAL FIELD

The present invention relates to an electronic device, and, for example, the present invention can be preferably used for an electronic device for motor driving.

BACKGROUND ART

Japanese Patent Laid-Open No. 2013-62959 (Patent Document 1), Japanese Patent Laid-Open No. 2011-176999 (Patent Document 2), and Japanese Patent Laid-Open No. 2004-297847 (Patent Document 3) describe a technique relating to a motor driving device.

RELATED ART DOCUMENTS

Patent Documents

Patent Document 1: Japanese Patent Application Laid-open No. 2013-62959
Patent Document 2: Japanese Patent Application Laid-open No. 2011-176999
Patent Document 3: Japanese Patent Application Laid-open No. 2004-297847

SUMMARY OF THE INVENTION

Problems to be Solved by the Invention

In electronic devices used for motor driving and the like, it is desirable to improve their performance.

Other problems and novel features will be understood from the description of this specification and the accompanying drawings.

Means for Solving the Problems

According to an embodiment, an electronic device includes: a first wiring substrate; a second wiring substrate opposing the first wiring substrate; a first semiconductor device having a power transistor for switching; and a second semiconductor device having a driving circuit for driving the first semiconductor device. Further, the electronic device includes: a third semiconductor device having a voltage generation circuit for converting, into a second power supply voltage, a first power supply voltage supplied from outside; and a fourth semiconductor device having a control circuit that operates with the second power supply voltage supplied from the third semiconductor device and controls the second semiconductor device. The first wiring substrate includes a plurality of first hole portions through which a plurality of connection members electrically connecting the first wiring substrate and the second wiring substrate are inserted respectively. The first semiconductor device is mounted on the second wiring substrate. Out of a second area and a third area adjacent to each other via a first area in which the plurality of first hole portions are arranged on the first principal surface of the first wiring substrate, the second semiconductor device and the fourth semiconductor device are mounted on the second area. Out of a fourth area positioned opposite the second area and a fifth area positioned opposite the third area on the second principal surface of the first wiring substrate, the third semiconductor device is mounted on the fifth area.

Effects of the Invention

According to an embodiment, the performance of the electronic device can be improved.

BRIEF DESCRIPTIONS OF THE DRAWINGS

DETAILED DESCRIPTION OF PREFERRED EMBODIMENTS

Figure 1:
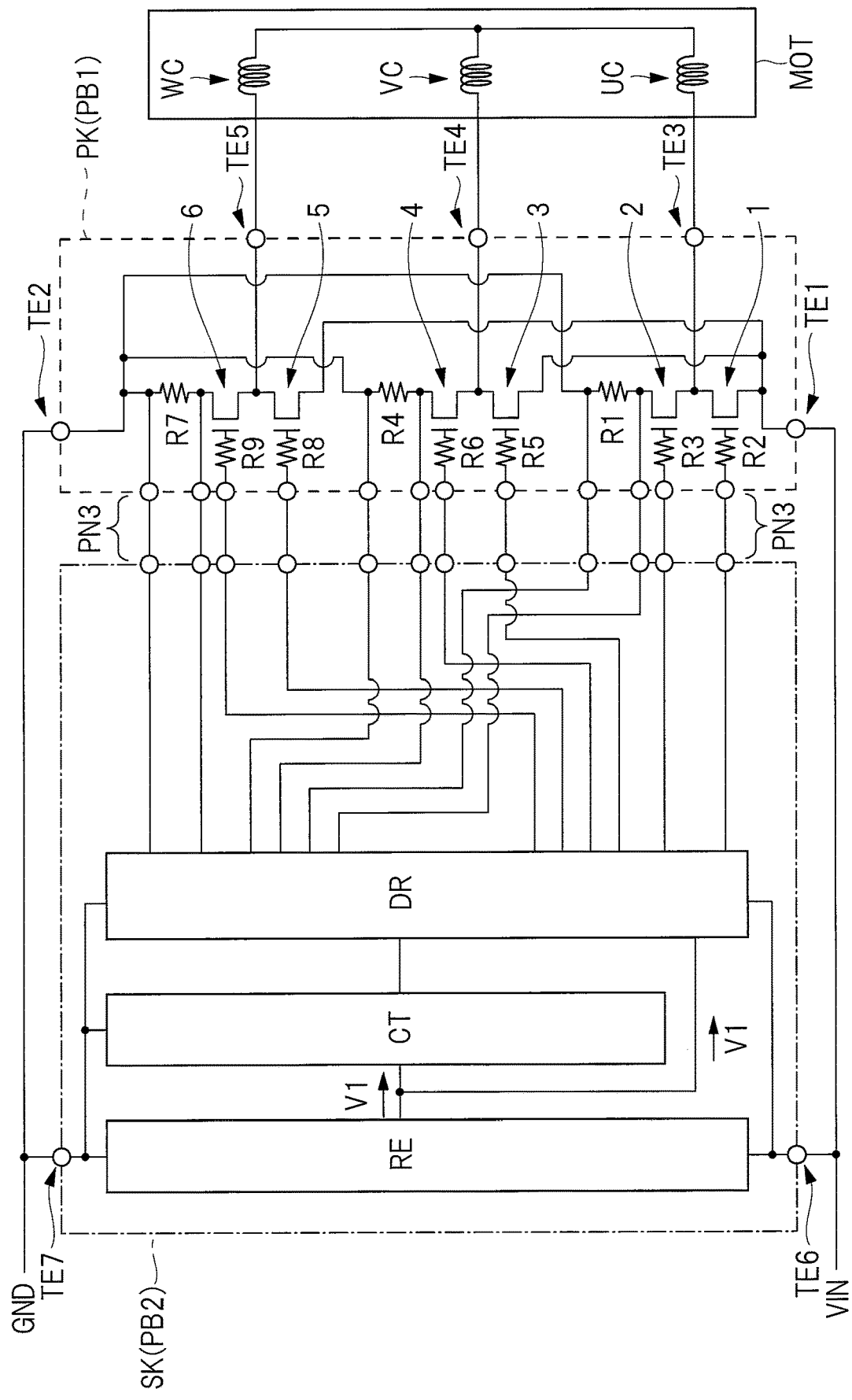
FIG. 1 is a circuit diagram showing a motor driving system using an electronic device according to an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above. Particularly, "circular shape" used in the present specification is not limited to "exact circular shape", and includes a so-called "substantially circular shape that is not exact circular".

Hereinafter, embodiments of the present invention will be described in detail with reference to the accompanying drawings. Note that components having the same function are denoted by the same reference characters throughout the drawings for describing the embodiments, and the repetitive description thereof will be omitted. Also, in the embodiment described below, the description about the same or similar part(s) will not be repeated as principle except a particularly necessary case(s).

Also, in some drawings used in the following embodiments, hatching is omitted even in a cross-sectional view so as to make the drawings easy to see. In addition, hatching is used even in a plan view so as to make the drawings easy to see.

Embodiment

<Regarding Circuit Configuration>

FIG. 1 is a circuit diagram showing a motor driving system using an electronic device according to the present embodiment.

The motor driving system as shown in FIG. 1 includes a power system circuit configuration unit PK and a control system circuit configuration unit SK. The power system circuit configuration unit PK is constituted by a power wiring substrate PB1 described later and electronic components mounted thereon. The control system circuit configuration unit SK is constituted by a control wiring substrate PB2 described later and electronic components mounted thereon.

Incidentally, in FIG. 1, a circuit configuration in an area surrounded by a dotted line corresponds to the power system circuit configuration unit PK. A circuit configuration in an area surrounded by a dash-single-dot line corresponds to the control system circuit configuration unit SK.

The control system circuit configuration unit SK includes a regulator (regulator circuit unit, voltage generation circuit unit) RE, a control circuit unit CT, and a driver circuit unit (pre-driver circuit unit, driving circuit unit) DR. The power system circuit configuration unit PK has power MOSFETs (power transistors) 1, 2, 3, 4, 5, and 6 and resistors R1, R2, R3, R4, R5, R6, R7, R8, and R9 to constitute an inverter circuit.

Incidentally, in the present application, when a term "MOSFET (Metal Oxide Semiconductor Field Effect Transistor)" is used, this includes not only a case where an oxide film is used as a gate insulating film but also a case where an insulating film other than the oxide film is used as the gate insulating film.

Direct current power supplied to the power system circuit configuration unit PK (inverter circuit) is converted into alternate current power by the power system circuit configuration unit PK (inverter circuit) and supplied to a motor MOT. The motor MOT is driven by the alternate current power supplied from the power system circuit configuration unit PK. The power system circuit configuration unit PK is controlled by the control system circuit configuration unit SK.

First, the power system circuit configuration unit PK will be concretely described.

In the power system circuit configuration unit PK, the power MOSFET 1 and the power MOSFET 2 are connected in series between a terminal TE1 to which a power supply potential (power supply voltage) VIN is supplied and a terminal TE2 to which a ground potential (ground voltage) GND is supplied. The ground potential GND can also be regarded as a reference potential (reference voltage). The power MOSFET 1 corresponds to a high side MOSFET, and the power MOSFET 2 corresponds to a low side MOSFET. A drain of the power MOSFET 1 is connected to the terminal TE1 (power supply potential VIN). A source of the power MOSFET 1 is connected to a drain of power MOSFET 2. A source of the power MOSFET 2 is connected to the terminal TE2 (the ground potential GND) via the resistor (shunt resistor) R1. A connection point between the power MOSFET 1 and the power MOSFET 2 is connected to a terminal TE3 connected to the motor MOT (more specifically, a U-phase coil UC of the motor MOT). A gate of the power MOSFET 1 is connected via the resistor R2 to the driver circuit unit DR of the control system circuit configuration unit SK. A gate of the power MOSFET 2 is connected via the resistor R3 to the driver circuit unit DR of the control system circuit configuration unit SK.

In addition, in the power system circuit configuration unit PK, the power MOSFET 3 and the power MOSFET 4 are connected in series between the terminal TE1 to which the power supply potential VIN is supplied and the terminal TE2 to which the ground potential GND is supplied. The power MOSFET 3 corresponds to a high side MOSFET, and the power MOSFET 4 corresponds to a low side MOSFET. A drain of the power MOSFET 3 is connected to the terminal TE1 (the power supply potential VIN). A source of the power MOSFET 3 is connected to the drain of the power MOSFET 4. A source of the power MOSFET 4 is connected to the terminal TE2 (the ground potential GND) via the resistor (shunt resistor) R4. A connection point between the power MOSFET 3 and the power MOSFET 4 is connected to the terminal TE3 connected to the motor MOT (more specifically, a V-phase coil VC of the motor MOT). A gate of the power MOSFET 3 is connected to the driver circuit unit DR of the control system circuit configuration unit SK via the resistor R5. A gate of the power MOSFET 4 is connected to the driver circuit unit DR of the control system circuit configuration unit SK via the resistor R6.

In addition, in the power system circuit configuration unit PK, the power MOSFET 5 and the power MOSFET 6 are connected in series between the terminal TE1 to which the power supply potential VIN is supplied and the terminal TE2 to which the ground potential GND is supplied. The power MOSFET 5 corresponds to a high side MOSFET. The power MOSFET 6 corresponds to a low side MOSFET. A drain of the power MOSFET 5 is connected to the terminal TE1 (the power supply potential VIN). A source of the power MOSFET 5 is connected to a drain of the power MOSFET 6. A source of the power MOSFET 6 is connected to the terminal TE2 (the ground potential GND) via the resistor (shunt resistor) R7. A connection point between the power MOSFET 5 and the power MOSFET 6 is connected to the terminal TE3 connected to the motor MOT (more particularly, a W-phase coil WC of the motor MOT). A gate of the power MOSFET 5 is connected to the driver circuit unit DR of the control system circuit configuration unit SK via the resistor R8. A gate of the power MOSFET 6 is connected to the driver circuit unit DR of the control system circuit configuration unit SK via the resistor R9.

Incidentally, the terminal TE1 corresponds to a hole HP1 of the power wiring substrate PB1 described later or a power supply connection pin PN1 described later and inserted through the hole HP1. The terminal TE2 corresponds to a hole HP2 of the power wiring substrate PB1 described later or a ground connection pin PN2 described later and inserted through the hole HP2. The terminal TE3 corresponds to a hole HM1 of the power wiring substrate PB1 described later or a connection pin BB1 described later and inserted through the hole HM1. The terminal TE4 corresponds to a hole HM2 of the power wiring substrate PB1 described later or a connection pin BB2 described later inserted through the hole HM2. The terminal TE5 corresponds to a hole HM3 of the power wiring substrate PB1 described later or a connection pin BB3 described later and inserted through the hole HM3.

The U-phase coil UC, the V-phase coil VC, and the W-phase coil WC of the motor MOT are connected to the terminals TE3, TE4, and TE5 of the power system circuit configuration unit PK, respectively. The motor MOT is driven by alternate current power supplied from the terminals TE3, TE4, and TE5 of the power system circuit configuration unit PK.

Incidentally, the MOSFET on the power supply potential VIN side (i.e., high potential side), which is one of a pair of MOSFETs connected in series between the power supply potential VIN and the ground potential GND, corresponds to a high side MOSFET, and the MOSFET on the ground potential GND side (i.e., low potential side) corresponds to a low side MOSFET. The high side MOSFET is a field effect transistor for a high side switch, and the low side MOSFET is a field effect transistor for a low side switch. Each of the power MOSFETs 1, 2, 3, 4, 5, and 6 can be regarded as a power transistor for switching.

Subsequently, the control system circuit configuration unit SK will be explained.

The control system circuit configuration unit SK includes a regulator RE, a control circuit unit CT, and a driver circuit unit DR. The regulator RE is a voltage generation circuit unit for converting an externally supplied power supply potential (power supply voltage) VIN into a voltage (power supply potential, power supply voltage) V1 and supplying the converted voltage V1 to the control circuit unit CT. The control circuit unit CT is a control circuit unit for controlling the driver circuit unit DR. The driver circuit unit DR is a driving circuit unit for driving the power MOSFETs 1, 2, 3, 4, 5, and 6 of the power system circuit configuration unit PK. Hereinafter, the control system circuit configuration unit SK will be explained in detail.

The power supply potential VIN and the ground potential GND are also supplied to the control system circuit configuration unit SK. That is, the power supply potential VIN is supplied to the terminal TE6. The ground potential GND is supplied to the terminal TE7. The terminal TE6 corresponds to a connection unit of a power supply cable CB1 on the control wiring substrate PB2 described later. The terminal TE7 corresponds to a connection unit of a ground cable CB2 on the control wiring substrate PB2 described later.

The regulator RE is connected to the terminal TE6 to which the power supply potential VIN is supplied, and the terminal TE7 to which the ground potential GND is supplied. The driver circuit unit DR is connected to the terminal TE6 to which the power supply potential VIN is supplied, and the terminal TE7 to which the ground potential GND is supplied. The control circuit unit CT is connected to the terminal TE7 to which the ground potential GND is supplied.

Therefore, the power supply potential VIN supplied to the terminal TE6 is supplied to the regulator RE and the driver circuit unit DR. The ground potential GND supplied to the terminal TE7 is supplied to the regulator RE, the control circuit unit CT, and the driver circuit unit DR.

The power supply potential VIN supplied to the terminal TE6 is inputted into the regulator RE and converted into a predetermined voltage (constant voltage) V1 by the regulator RE, and the voltage V1 generated by the regulator RE is inputted into the control circuit unit CT and the driver circuit unit DR. The voltage V1 is, for example, a constant voltage lower than the power supply potential (power supply voltage) VIN. The voltage V1 supplied from the regulator RE to the control circuit unit CT can be used as an operation voltage of the control circuit unit CT. That is, the control circuit unit CT can operate with the voltage V1 supplied from the regulator RE.

The driver circuit unit DR is a circuit that drives the power MOSFETs 1, 2, 3, 4, 5, and 6 of the power system circuit configuration unit PK, and is controlled by the control circuit unit CT. The driver circuit unit DR supplies a gate signal (gate voltage) to each gate of the power MOSFETs 1, 2, 3, 4, 5, and 6 of the power system circuit configuration unit PK. The control circuit unit CT controls the driver circuit unit DR, and each ON/OFF state of the power MOSFETs 1, 2, 3, 4, 5, and 6 is controlled by the gate signal supplied to each gate of the power MOSFETs 1, 2, 3, 4, 5, and 6 from the driver circuit unit DR. Therefore, the control system circuit configuration unit SK can control the power system circuit configuration unit PK.

The resistor R1 is interposed between the source of the power MOSFET 2 and the terminal TE2 (the ground potential GND). The resistor R4 is interposed between the source of the power MOSFET 4 and the terminal TE2 (the ground potential GND). The resistor R7 is interposed between the source of the power MOSFET 6 and the terminal TE2 (the ground potential GND). Both ends of each of the resistors R1, R4, and R7 are connected to a detection circuit in the driver circuit unit DR. The detection circuit in the driver circuit unit DR detects voltages applied to the resistors R1, R4, and R7, so that each of currents flowing through the U-phase coil, V-phase coil, and W-phase coil of the motor MOT can be detected.

For example, the driver circuit unit DR detects the current flowing through each of the resistors R1, R4, and R7, and the power MOSFETs 1, 2, 3, 4, 5, and 6 can be driven (controlled) by using the detection currents so that the power supplied from the power system circuit configuration unit PK to the motor MOT attains a desired waveform.

Thus, in the motor driving system as shown in FIG. 1, the control system circuit configuration unit SK controls the power system circuit configuration unit PK (the inverter circuit), so that the direct current power supplied from the terminals TE1 and TE2 to the power system circuit configuration unit PK is converted into alternate current power, and the converted alternate current power is supplied from the terminals TE3, TE4, and TE5 to the motor MOT. Therefore, the motor MOT can be controlled.

<Regarding Entire Configuration>

Figure 2:
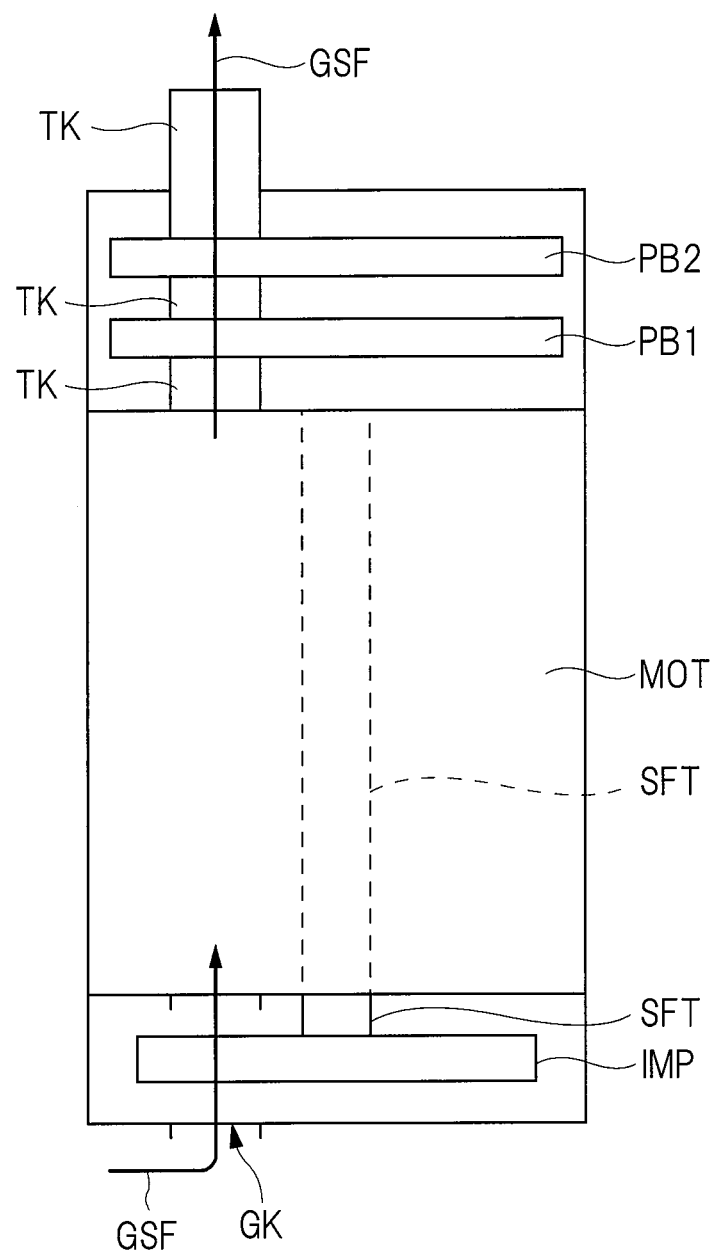
FIG. 2 is a schematic diagram showing the entire motor driving system using the electronic device according to the embodiment.
Figure 3:
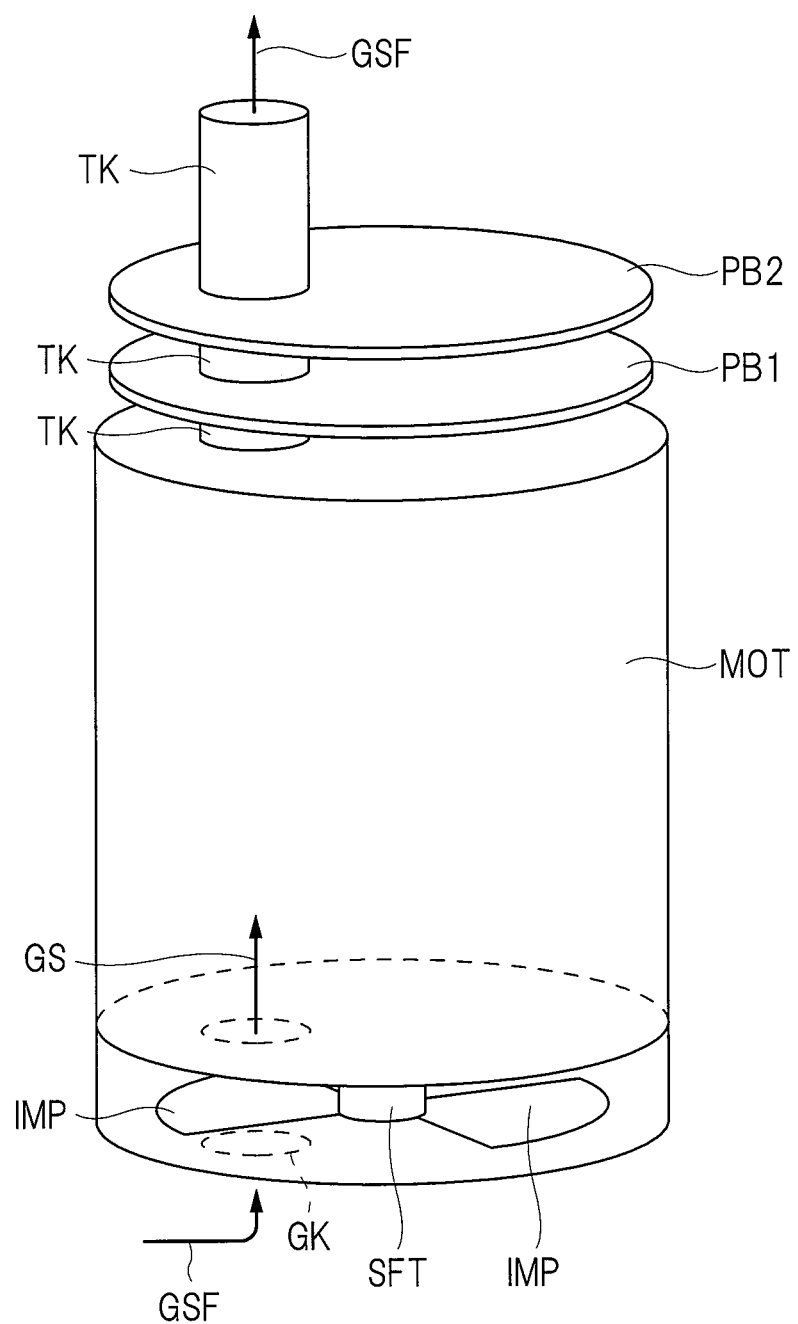
FIG. 3 is a schematic diagram showing the entire motor driving system using the electronic device according to the embodiment.

FIGS. 2 and 3 are schematic diagrams illustrating the entire motor driving system using the electronic device according to the present embodiment. A side view is shown in FIG. 2, and a perspective view is shown in FIG. 3. In FIG. 3, a member(s) covering a stacked body constituted by the power wiring substrate PB1 and the control wiring substrate PB2 is not shown and is omitted. Incidentally, both of the power wiring substrate PB1 and the control wiring substrate PB2 are wiring substrates. However, the power wiring substrate PB1 is a wiring substrate for forming the above power system circuit configuration unit PK. The control wiring substrate PB2 is a wiring substrate for forming the above control system circuit configuration unit SK.

In the motor driving system as shown in FIGS. 2 and 3, the power wiring substrate PB1 and the control wiring substrate PB2 are attached to the motor MOT. More specifically, the power wiring substrate PB1 and the control wiring substrate PB2 are attached to an upper portion (upper surface) of the motor MOT so as to be stacked in order from its bottom.

The motor MOT is, for example, a motor of fuel pump (corresponding to a fuel pump PM to be described later), and has an impeller (vane wheel) IMP rotating together with a shaft SFT. As described above, the power system circuit configuration unit PK is constituted by the power wiring substrate PB1 and the electronic components (not shown in FIGS. 2 and 3) mounted thereon. The control system circuit configuration unit SK is constituted by the control wiring substrate PB2 and the electronic component(s) (not shown in FIGS. 2 and 3) mounted thereon. The shaft SFT of the motor MOT rotates by the alternate current power supplied from the power system circuit configuration unit PK, so that the impeller IMP fixed to the shaft SFT of the motor MOT rotates.

The power wiring substrate PB1 and the control wiring substrate PB2 are attached so as to be stacked on the upper portion of the motor MOT, and so a plane size of each of the power wiring substrate PB1 and the control wiring substrate PB2 is preferably equal to or less than a plane size of the motor MOT. However, a plane shape of the motor MOT is a circular shape, and so if a plane shape of each of the power wiring substrate PB1 and the control wiring substrate PB2 is also a circular shape having the same plane size (diameter or area) according to the plane shape of the motor MOT, no waste of an implementing space occurs and the space can be effectively used, which is more preferable.

In addition, the upper surface of the motor MOT is provided with a discharge port (pipe, piping) TK for discharging fuel sucked up by the rotation of the impeller IMP. The discharge port TK is a tubular member and is configured so that the fuel can pass therethrough. Through holes are provided in each of the power wiring substrate PB1 and the control wiring substrate PB2 so that the discharge port TK penetrates. Therefore, the discharge port TK protrudes above the motor MOT from the upper surface of the motor MOT through each through hole of the power wiring substrate PB1 and the control wiring substrate PB2. The through hole (corresponding to the hole HT1 described later) through which the discharge port TK passes in the power wiring substrate PB1, and the through hole (corresponding to the hole HT2 described later) through which the discharge port TK passes in the control wiring substrate PB2 overlap in the plan view.

In FIGS. 2 and 3, a fuel flow GSF sucked up by the rotation of the impeller IMP is schematically indicated by arrows. As indicated by the arrows (GSF) in FIGS. 2 and 3, the fuel sucked up from a suction port GK by the rotation of the impeller IMP: flows through a space through which the fuel can pass in the motor MOT; flows from inside the motor MOT to the discharge port TK; and is sent outside the motor MOT from the discharge port TK. A fuel pipe(s) (not shown) etc. are connected to the discharge port TK, and the fuel sucked up by the rotation of the impeller IMP flows from the motor MOT to the later-explained engine ENG through the discharge port TK, the fuel pipe, and the like.

Figure 4:
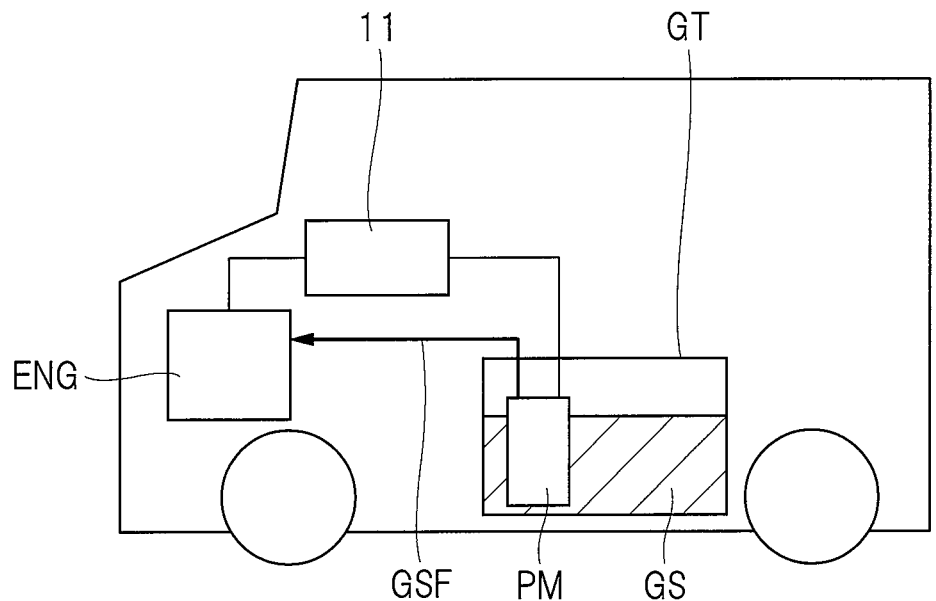
FIG. 4 is an explanatory diagram showing a control system of an automobile.
Figure 5:
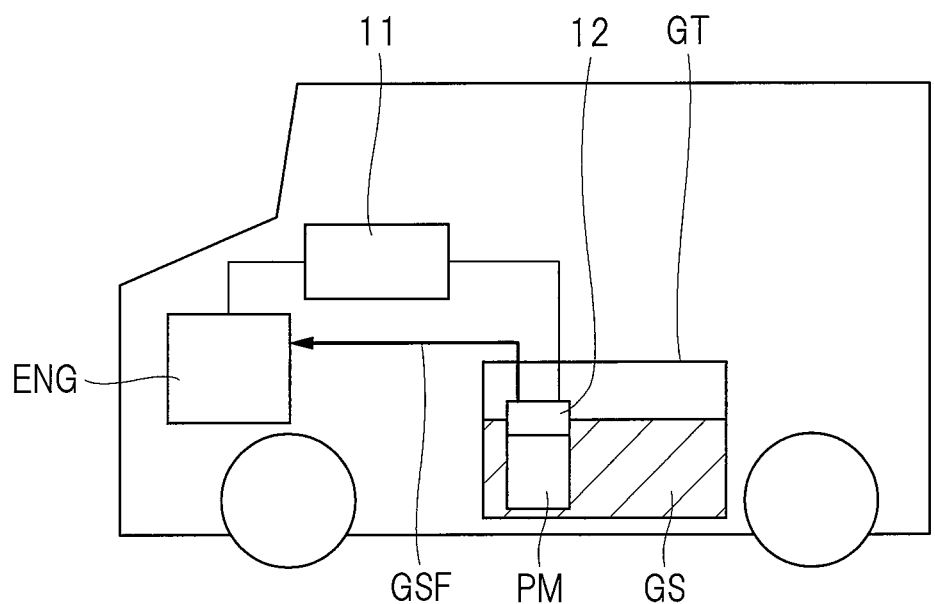
FIG. 5 is an explanatory diagram showing the control system of the automobile.

FIGS. 4 and 5 are explanatory diagrams showing a control system of an automobile. Incidentally, FIG. 5 corresponds to a case where the motor driving systems of FIGS. 1 to 3 are applied to a fuel pump PM. In order to make the drawing easier to see, the fuel GS stored in a fuel tank GT is hatched.

In the control system of the automobile shown in FIGS. 4 and 5, the fuel GS stored in fuel tank GT is sucked up by fuel pump PM and supplied to the engine ENG. In FIGS. 4 and 5, the flow GSF of the fuel GS sent from the fuel pump PM to the engine ENG through the fuel pipe(s) and the like is schematically shown by arrows. The engine ENG is controlled by an electronic control unit (ECU) 11 for engine control.

In a case of FIG. 4, an engine control ECU 11 also directly controls the fuel pump PM. That is, the engine control ECU 11 supplies motor driving power to the fuel pump PM, and thereby drives a motor of the fuel pump PM. Then, the engine control ECU 11 controls the motor of the fuel pump PM by controlling the power of the motor driving to be supplied to the fuel pump PM, and thereby the engine control ECU 11 controls an amount of the fuel GS supplied to the engine ENG from the fuel tank GT by the fuel pump PM.

In a case of FIG. 5, an ECU 12 for fuel pump control attached to the fuel pump PM controls the fuel pump PM. That is, the fuel pump control ECU 12 supplies the motor driving power to the fuel pump PM, and thereby drives the motor of the fuel pump PM. Then, the fuel pump control ECU 12 controls the motor of the fuel pump PM by controlling the power for motor driving supplied to the fuel pump PM, and thereby the fuel pump control ECU 12 controls the amount of the fuel GS supplied to the engine ENG from the fuel tank GT by the fuel pump PM. A command signal (control signal) from the engine control ECU 11 to the fuel pump control ECU 12 and/or a feedback signal from the fuel pump control ECU 12 to the engine control ECU 11 are transmitted between the engine control ECU 11 and the fuel pump control ECU 12 as the need arises.

That is, in the case of FIG. 4, the engine control ECU 11 also serves as one corresponding to the fuel pump control ECU 12, and one corresponding to the fuel pump control ECU 12 is not attached to the fuel pump PM. On the other hand, in the case of FIG. 5, the fuel pump control ECU 12 is separated from the engine control ECU 11 and is attached to the fuel pump PM.

In the case of FIG. 4, the engine control ECU 11 also serves as one corresponding to the fuel pump control ECU 12, and the motor driving power is supplied to the fuel pump PM from the engine control ECU 11 located relatively far from the fuel pump PM. For this reason, power loss increases. In addition, there occur an increase in weight due to arrangement of wirings in the automobile, deterioration in fuel consumption following it, and an increase in a space required for the arrangement.

In contrast, in the case of FIG. 5, the fuel pump control ECU 12 is attached to the fuel pump PM, and the fuel pump control ECU 12 is close to the fuel pump PM. The motor driving power is supplied to the fuel pump PM from the engine control ECU 12 attached to the fuel pump PM, so that the power loss can be suppressed. In addition, the increase in the weight due to the wiring arrangement in the automobile can be reduced, and the space required therefor can also be reduced.

It should be noted that the fuel pump control ECU 12 and the fuel pump PM in the case of FIG. 5 correspond to the motor driving system shown in FIGS. 1 to 3. That is, the motor MOT as shown in FIGS. 1 to 3 corresponds to the motor of the fuel pump PM. A circuit configuration of the fuel pump control ECU 12 corresponds to a circuit configuration (the power system circuit configuration unit PK and the control system circuit configuration unit SK) other than the motor MOT in the circuit configuration as shown in FIG. 1. Therefore, the fuel pump control ECU 12 is constituted by the power wiring substrate PB1 shown in FIGS. 2 and 3 and the electronic component(s) mounted thereon (not shown in FIGS. 2 and 3), and the control wiring substrate PB2 and the electronic component(s) mounted thereon (not shown in FIGS. 2 and 3).

<Regarding Configuration of Electronic Device>

Figure 6:
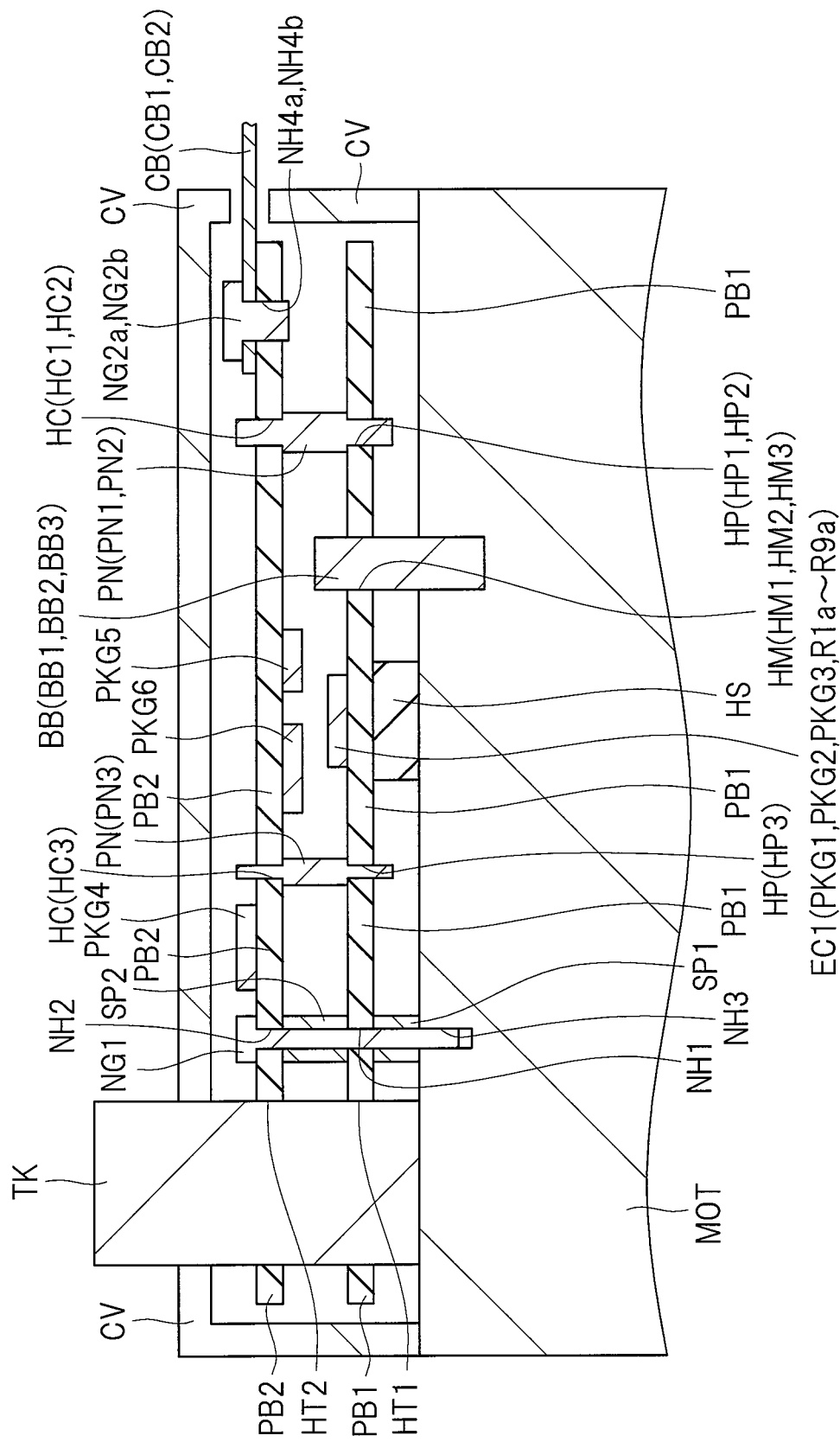
FIG. 6 is an explanatory diagram showing the electronic device according to the embodiment, the electronic device being attached to a motor.
Figure 7:
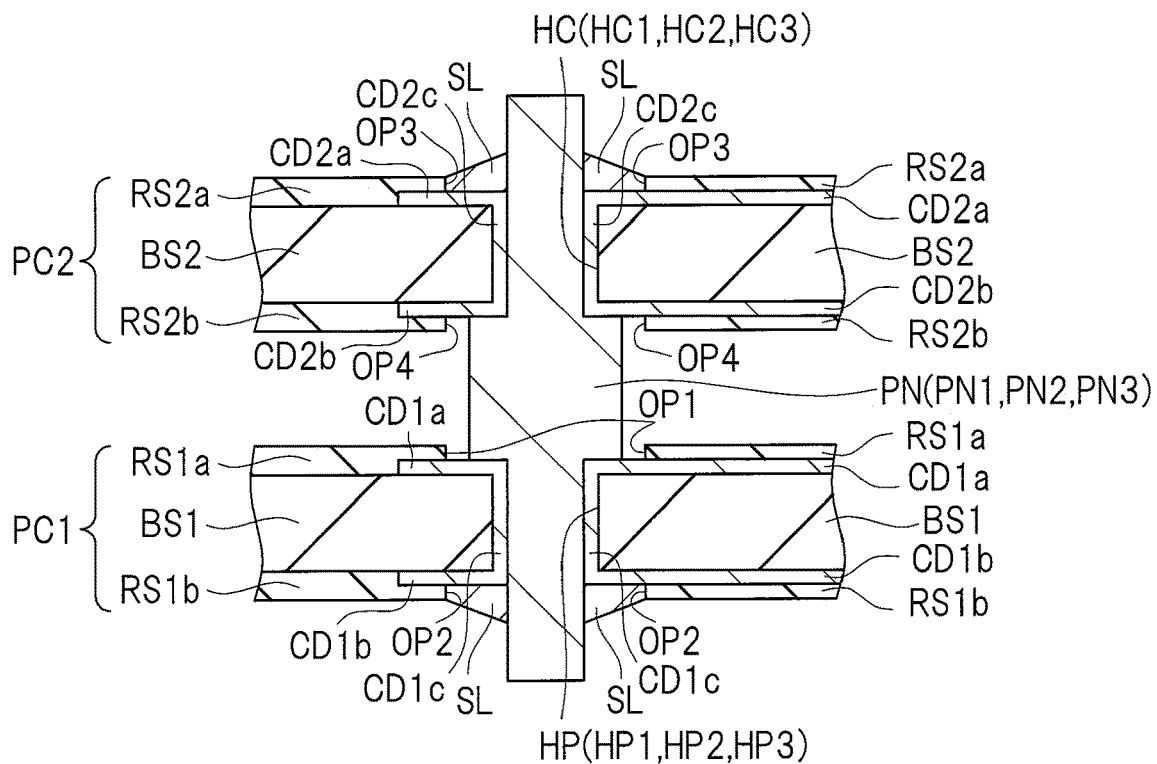
FIG. 7 is a partially enlarged cross-sectional view enlargedly showing a portion of FIG. 6.
Figure 8:
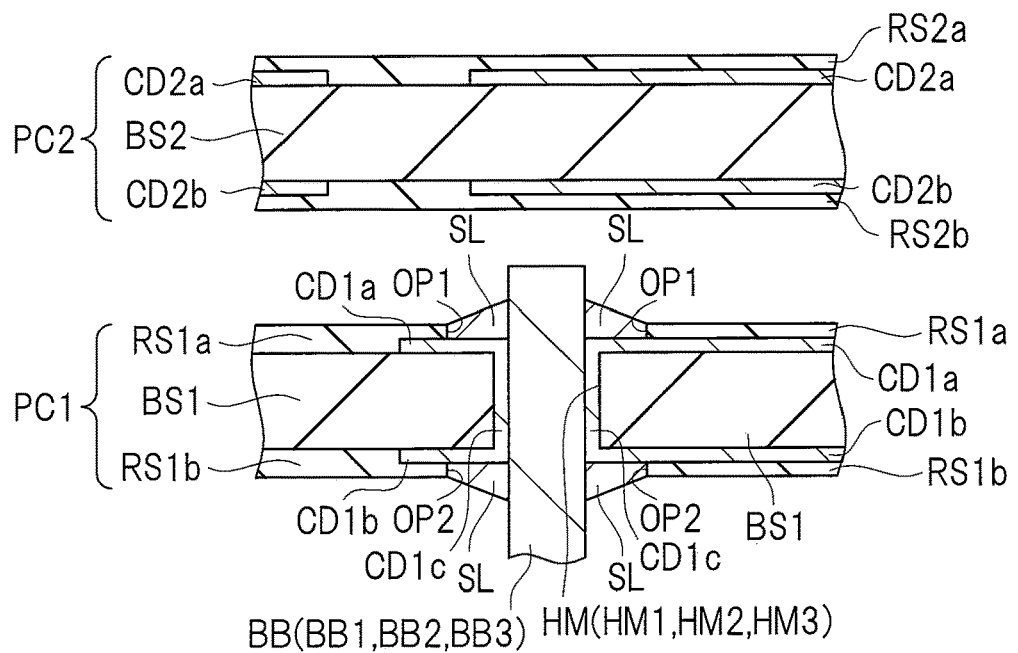
FIG. 8 is a partially enlarged cross-sectional view enlargedly showing a portion of FIG. 6.

FIG. 6 is an explanatory diagram showing the electronic device according to the present embodiment, the electronic device being attached to the motor MOT. FIG. 6 corresponds to a cross-sectional view, but an internal cross-sectional structure of the motor MOT is not shown in FIG. 6. FIGS. 7 and 8 are partially enlarged cross-sectional views enlargedly showing portions of FIG. 6. Among them, FIG. 7 shows a structure for connecting the power wiring substrate PB1 the control wiring substrate PB2, and connection pins PN (PN1, PN2, and PN3), and FIG. 8 shows a structure for connecting the power wiring substrate PB1 and connection pins BB (BB1, BB2, BB3).

Although the explanation has been given with reference to FIGS. 2 and 3, the power wiring substrate PB1 and the control wiring substrate PB2 are attached to the upper surface (upper portion) of the motor MOT so as to be stacked in order from the bottom as shown also in FIG. 6. As shown in FIG. 6, the power wiring substrate PB1 and the control wiring substrate PB2 are attached and fixed to the motor MOT by, for example, a screw (a fixing screw, a fixing member) NG1, and predetermined gaps are interposed between the motor MOT and the power wiring substrate PB1 and between the power wiring substrate PB1 and the control wiring substrate PB2.

More specifically, as shown in FIG. 6, the hole (through hole) NH2 through which the screw NG1 is inserted is formed in the control wiring substrate PB2, and the hole (through hole) NH1 through which the screw NG1 is inserted is also formed in the power wiring substrate PB1. A screw hole NH3 for fastening with the screw NG1 is formed in the upper portion of the motor MOT. Incidentally, the hole NH2 in the control wiring substrate PB2, the hole NH1 in the power wiring substrate PB1, and the screw hole NH3 in the motor MOT overlap each other in a plan view. The screw NG1 is inserted through the hole NH2 of the control wiring substrate PB2, a spacer SP2 disposed between the control wiring substrate PB2 and the power wiring substrate PB1, the hole NH1 of the power wiring substrate PB1, and a spacer SP1 disposed between the power wiring substrate PB1 and the upper surface of the motor MOT, and is screwed into the screw hole NH3 of the motor MOT. A predetermined distance is ensured by the spacer SP1 between the motor MOT and the power wiring substrate PB1, a predetermined distance is ensured by the spacer SP2 between the power wiring substrate PB1 and the control wiring substrate PB2, and the control wiring substrate PB2 and the power wiring substrate PB1 are attached and fixed to the upper surface (upper portion) of the motor MOT by the screw NG1. Incidentally, FIG. 6 shows only one screw NG1 as an example, but three screws NG1 as described later are used to fix the control wiring substrate PB2 and the power wiring substrate PB1 to the motor MOT.

Incidentally, as shown in FIG. 6, a protective cover member (case, casing body) CV can be provided so as to cover the power wiring substrate PB1 and the control wiring substrate PB2 attached to the upper portion of the motor MOT. This cover member CV is fixed to motor MOT. The cover member CV may be a member different from the motor MOT or may be a member integrated with the motor MOT.

In addition, (a wiring of) the power wiring substrate PB1 and (a wiring of) the control wiring substrate PB2 are electrically connected by the plurality of connection pins PN. The connection pin PN is a connection member for electrically connecting the power wiring substrate PB1 and the control wiring substrate PB2. The connection pin PN has a shape of a pin. The connection pins PN electrically connecting (the wiring of) the power wiring substrate PB1 and (the wiring of) the control wiring substrate PB2 include a power supply connection pin PN1, a ground connection pin PN2, and a signal pin PN3. FIG. 6 shows two connection pins PN as an example, and one of the two connection pins PN is the signal pin PN3, and the other of the two connection pins PN is the power supply connection pin PN1 or the ground connection pin PN2.

Here, a structure for electrically connecting (the wiring of) the power wiring substrate PB1 and (the wiring of) the control wiring substrate PB2 via the connection pins PN will be explained with reference to FIG. 7.

A plurality of holes (through holes) HC through which the connection pins PN are inserted are formed in the control wiring substrate PB2, and a plurality of holes (through holes) HP through which the connection pins PN are inserted are formed in the power wiring substrate PB1, but FIG. 7 shows a pair of holes HC, HP and one connection pin PN inserted therethrough. Incidentally, as shown also in FIG. 6, a diameter of the signal pin PN3 is really smaller than a diameter of the power supply connection pin PN1 and a diameter of the ground connection pin PN2.

The hole HC in the control wiring substrate PB2 and the hole HP in the power wiring substrate PB1 overlap each other in the plan view. As shown in FIG. 7, one end portion side of each connection pin PN is inserted through the hole HC of the control wiring substrate PB2, and the other end portion side of each connection pin PN is inserted through the hole HP of the power wiring substrate PB1. The connection pin PN is made of a conductive body and, more preferably, the connection pin PN is made of a metal material.

In each connection pin PN, a portion located in the hole HC of the control wiring substrate PB2 has a diameter slightly smaller than the diameter of the hole HC, and a portion located in the hole HP of the power wiring substrate PB1 has a diameter slightly smaller than the diameter of hole HP. On the other hand, in each connection pin PN, a portion which is located outside the holes HC and HP and which is located between the power wiring substrate PB1 and the control wiring substrate PB2 may have a diameter larger than the diameters of the holes HP and HC. Therefore, it is possible to position height positions of the power wiring substrate PB1 and the control wiring substrate PB2 with respect to the connection pin PN.

The control wiring substrate PB2 and the power wiring substrate PB1 are, for example, resin substrates. The control wiring substrate PB2 includes: an insulating base material layer BS2; a wiring pattern (conductive film CD2a) formed on an upper surface of the base material layer BS2; a wiring pattern (conductive film CD2b) formed on a lower surface of the base material layer BS2; a resist layer RS2a formed on the upper surface of the base material layer BS2 so as to cover the wiring pattern; and a resist layer RS2b formed on the lower surface of the base material layer BS2 so as to cover the wiring pattern. The power wiring substrate PB1 includes: an insulating base material layer BS1; a wiring pattern (conductive film CD1a) formed on an upper surface of the base material layer BS1; a wiring pattern (conductive film CD1b) formed on a lower surface of the base material layer BS1; a resist layer RS1a formed on the upper surface of the base material layer BS1 so as to cover the wiring pattern; and a resist layer RS1b formed on the lower surface of the base material layer BS1 so as to cover the wiring pattern. The base material layers BS1 and BS2 are each made of an insulating material (insulating layer), for example, a glass epoxy resin and the like. The wiring pattern on the upper surface of the control wiring substrate PB2 is formed by the conductive film CD2a. The wiring pattern on the lower surface of the control wiring substrate PB2 is formed by the conductive film CD2b. The wiring pattern on the upper surface of the power wiring substrate PB1 is formed by the conductive film CD1a. The wiring pattern on the lower surface of the power wiring substrate PB1 is formed by the conductive film CD1b. Each of the resist layers RS1a, RS1b, RS2a, and RS2b is made of an insulating material (insulating layer), for example, a solder resist layer. Each of the resist layers RS1a, RS1b, RS2a, and RS2b can be regarded as a protective film.

In the control wiring substrate PB2, a conductive film CD2c is formed on a side surface (inner wall) of the hole HC. In the power wiring substrate PB1, a conductive film CD1c is formed on a side surface (inner wall) of hole HP. The conductive film CD2c on the side surface of the hole HC in the control wiring substrate PB2 is electrically connected to the connection pin PN inserted through the hole HC. The conductive film CD1c on the side surface of the hole HP in the power wiring substrate PB1 is electrically connected to the connection pin PN inserted through the hole HC. For example, a conductive bonding material such as solder SL is interposed between the conductive film CD2c on the side surface of the hole HC in the control wiring substrate PB2 and the connection pin PN, so that the conductive film CD2c and the connection pin PN are electrically connected via the conductive bonding material. A conductive bonding material such as solder SL is interposed between the conductive film CD1c on the side surface of the hole HP in the power wiring substrate PB1 and the connection pin PN, and thereby the conductive film CD1c and the connection pin PN are electrically connected via the conductive bonding material. Alternatively, the conductive film CD2c on the side surface of the hole HC in the control wiring substrate PB2 and the connection pin PN are in contact with each other, and thereby the conductive film CD2c and the connection pin PN may be electrically connected. The conductive film CD1c on the side surface of the hole HP in the power wiring substrate PB1 and the connection pin PN are in contact with each other, and thereby the conductive film CD1c and the connection pin PN may be electrically connected.

Therefore, the conductive film CD2c on the side surface of the hole HC in the control wiring substrate PB2 and the conductive film CD1c on the side surface of the hole HP in the power wiring substrate PB1 are electrically connected via the connection pin PN inserted through the holes HP and HC. Incidentally, a conductive bonding material such as solder SL may be used to fix the connection pin PN to the control wiring substrate PB2 and the power wiring substrate PB1.

On the upper surface of the power wiring substrate PB1, the conductive film CD1c on the side surface of the hole HP in the power wiring substrate PB1 is electrically connected to the conductive film CD1a formed around the hole HP. On the lower surface of the power wiring substrate PB1, the above conductive film CD1c is electrically connected to the conductive film CD1b formed around the hole HP. On the upper surface side of the control wiring substrate PB2, the conductive film CD2c on the side surface of the hole HC in the control wiring substrate PB2 is electrically connected to the conductive film CD2a formed around the hole HC. On the lower surface of the control wiring substrate PB2, the above conductive film CD2c is electrically connected to the conductive film CD2b formed around the hole HC. Therefore, in FIG. 7, the conductive films CD1a, CD1b, and CD1c of the power wiring substrate PB1 and the conductive films CD2a, CD2b, and CD2c of the control wiring substrate PB2 can be electrically connected via the connection pin PN.

That is, in order that the wiring pattern (corresponding to the conductive film CD2a or the conductive film CD2b) formed on the upper surface or the lower surface of the control wiring substrate PB2 is electrically connected to the connection pin PN, a portion of the wiring pattern is provided around the hole HC, the conductive film CD2c electrically connected to the wiring pattern is formed on the side surface of the hole HC, and the connection pin PN is inserted through the hole HC. As the need arises, the connection pin PN is bonded to the control wiring substrate PB2 with a conductive bonding material such as solder SL. Therefore, the wiring pattern formed on the upper surface or the lower surface of the control wiring substrate PB2 can be electrically connected to the connection pin PN.

In addition, in order that the wiring pattern (corresponding to the conductive film CD1a or the conductive film CD1b) formed on the upper surface or the lower surface of the power wiring substrate PB1 is electrically connected to the connection pin PN, a portion of the wiring pattern is provided around the hole HP, the conductive film CD1c electrically connected to the wiring pattern is formed on the side surface of the hole HP, and the connection pin PN is inserted through the hole HP. As the need arises, the connection pin PN is bonded to the power wiring substrate PB1 with a conductive bonding material such as solder SL. Therefore, the wiring pattern formed on the upper surface or the lower surface of the power wiring substrate PB1 can be electrically connected to the connection pin PN.

In addition, in the control wiring substrate PB2, the resist layers RS2a and RS2b may have such opening portions OP3 and OP4 as to encompass the hole HC in the plan view. Here, the opening portion OP3 is an opening portion of the resist layer RS2a on the upper surface side of the control wiring substrate PB2, and the opening portion OP2 is an opening portion of the resist layer RS2b on the lower surface side of the control wiring substrate PB2. In this case, one or both of the conductive films CD2a and CD2b exposed from the opening portions OP3 and OP4 of the resist layers RS2a and RS2b around the hole HC of the control wiring substrate PB2 can be electrically connected to the connection pin PN via a conductive bonding material such as solder SL. In the power wiring substrate PB1, the resist layers RS1a and RS1b may have such opening portions OP1 and OP2 as to encompass the hole HP in the plan view. Here, the opening portion OP1 is an opening portion of the resist layer RS1a on the upper surface side of the power wiring substrate PB1, and the opening portion OP2 is an opening portion of the resist layer RS1b on the lower surface side of the power wiring substrate PB1. In this case, one or both of the conductive films CD1a and CD1b exposed from the opening portions OP1 and OP2 of the resist layers RS1a, RS1b around the hole HP of the power wiring substrate PB1 can be electrically connected to the connection pin PN via a conductive bonding material such as solder SL.

Therefore, the wiring pattern (the conductive film CD2a or the conductive film CD2b) formed on the upper surface or the lower surface of the control wiring substrate PB2, and the wiring pattern (the conductive film CD1a or the conductive film CD1b) formed on the upper surface or the lower surface of the power wiring substrate PB1 can be electrically connected via the connection pin PN.

Subsequently, a method of supplying the power supply potential VIN and the ground potential GND to the control wiring substrate PB2 and the power wiring substrate PB1 will be explained with reference to FIG. 6.

The power supply potential VIN and the ground potential GND are supplied to both of the power wiring substrate PB1 and the control wiring substrate PB2. In a case of FIG. 6, the power supply potential VIN and the ground potential GND are supplied from a battery (not shown) or the like to the control wiring substrate PB2 via the cable CB, and the power supply potential VIN and the ground potential GND supplied to the control wiring substrate PB2 are supplied via the power supply connection pin PN1 and the ground connection pin PN2 to the power wiring substrate PB1, respectively. The power supply connection pin PN1 is the connection pin PN used to supply the power supply potential VIN from the control wiring substrate PB2 to the power wiring substrate PB1. The ground connection pin PN2 is the connection pin PN used to supply the ground potential GND from the control wiring substrate PB2 to the power wiring substrate PB1.

Incidentally, in FIG. 6, only one cable CB is shown for the sake of simplicity, but there are really two cables CB, one of which is the cable CB for supplying the power supply potential VIN, and the other of which is the cable CB for supplying the ground potential GND. The cable CB for supplying the power supply potential VIN and the cable CB for supplying the ground potential GND are not electrically connected, and are members separate from each other. In the following explanation, the cable CB for supplying the power supply potential VIN will be referred to as a power supply cable CB1, and the cable CB for supplying the ground potential GND will be referred to as a ground cable CB2. In FIG. 6, the power supply connection pin PN1 and the ground connection pin PN2 are represented by a single connection pin PN for the sake of simplicity, but a single power supply connection pin PN1 and a single ground connection pin PN2 exist really, and the power supply connection pin PN1 and the ground connection pin PN2 are not electrically connected, and are different members.

If more specific explanation is made, as shown in FIG. 6, the power supply cable CB1 is fixed to the control wiring substrate PB2 with a screw (a fixing screw, a fixing member) NG2a and the like, and thereby the power supply cable CB1 is electrically connected to the power supply wirings (corresponding to power supply wirings WV1 and WV2 described later) of the control wiring substrate PB2. Accordingly, the power supply potential VIN is supplied from the power supply cable CB1 to the power supply wirings (corresponding to the power supply wirings WV1 and WV2 described later) of the control wiring substrate PB2. The ground cable CB2 is fixed to the control wiring substrate PB2 with a screw (a fixing screw, a fixing member) NG2b and the like, and thereby the ground cable CB2 is electrically connected to ground wirings (corresponding to ground wirings WG1 and WG2 described later) of the control wiring substrate PB2. Accordingly, the ground potential GND is supplied from the ground cable CB2 to the ground wirings (corresponding to the ground wirings WG1 and WG2 described later) of the control wiring substrate PB2. A screw NG2a fixing the power supply cable CB1 is inserted and screwed into a hole (screw hole) NH4a provided in the control wiring substrate PB2, and a screw NG2b for fixing the ground cable CB2 is inserted and screwed into a hole (screw hole) NH4b provided in the control wiring substrate PB2. Nuts (screw threading members, not shown here) and the like can be screwed with portions of the screws NG2a and NG2b protruding from the lower surface of the control wiring substrate PB2. In this case, a screw thread may not be formed on each side surface of the holes NH4a and NH4b.

The power supply wirings (corresponding to the power supply wirings WV1 and WV2 explained later) of the control wiring substrate PB2 are electrically connected to the power supply wiring (corresponding to the power supply wiring WV3 explained later) of the power wiring substrate PB1 via the power supply connection pin PN1. More specifically, the control wiring substrate PB2 includes a hole (through hole) HC1 through which the power supply connection pin PN1 is inserted, and the power wiring substrate PB1 includes a hole (through hole) HP1 through which the power supply connection pin PN1 is inserted. The power supply wirings (corresponding to the power supply wirings WV1 and WV2 explained later) of the control wiring substrate PB2 and the power supply wiring (corresponding to the power supply wiring WV3 explained later) of the power wiring substrate PB1 are electrically connected by the power supply connection pin PN1 through which the hole HC1 of the control wiring substrate PB2 and the hole HP1 of the power wiring substrate PB1 are inserted. When this is applied to FIG. 7 explained above, the connection pin PN of FIG. 7 corresponds to the power supply connection pin PN1, and the hole HC of FIG. 7 corresponds to the hole HC1, and the hole HP of FIG. 7 corresponds to the hole HP1. The conductive films CD2a and CD2b of FIG. 7 correspond to the power supply wirings (corresponding to the power supply wirings WV1 and WV2 explained later) of the control wiring substrate PB2, and the conductive films CD1a and CD1b of FIG. 7 correspond to the power supply wiring (corresponding to the power supply wiring WV3 explained later) of the power wiring substrate PB1.

In addition, the ground wirings (corresponding to ground wirings WG1 and WG2 explained later) of the control wiring substrate PB2 are electrically connected to the ground wiring of the power wiring substrate PB1 via the ground connection pin PN2. That is, the control wiring substrate PB2 has a hole (through hole) HC2 through which the ground connection pin PN2 is inserted, and the power wiring substrate PB1 has a hole (through hole) HP2 through which the ground connection pin PN2 is inserted. The ground wirings (the ground wirings WG1 and WG2 explained later) of the control wiring substrate PB2 and the ground wiring of the power wiring substrate PB1 are electrically connected by the ground connection pin PN2 inserted through the hole HC2 of the control wiring substrate PB2 and the hole HP2 of the power wiring substrate PB1. When this is applied to FIG. 7, the connection pin PN of FIG. 7 corresponds to the ground connection pin PN2, and the hole HC of FIG. 7 corresponds to the hole HC2, and the hole HP of FIG. 7 corresponds to the hole HP2. The conductive films CD2a and CD2b of FIG. 7 correspond to the ground wirings (the ground wirings WG1 and WG2 explained later) of the control wiring substrate PB2, and the conductive films CD1a and CD1b of FIG. 7 correspond to the ground wiring of the power wiring substrate PB1.

Therefore, the power supply potential VIN supplied to the power supply wirings (corresponding to the power supply wirings WV1 and WV2 explained later) of the control wiring substrate PB2 via the power supply cable CB1 is supplied to the power supply wiring (corresponding to the power supply wiring WV3 explained later) of the power wiring substrate PB1 via the power supply connection pin PN1. On the other hand, the ground potential GND supplied to the ground wirings (the ground wirings WG1 and WG2 explained later) of the control wiring substrate PB2 via the ground cable CB2 is supplied to the ground wiring of the power wiring substrate PB1 via the ground connection pin PN2.

Subsequently, a connection between (the signal wiring of) the power wiring substrate PB1 and (the signal wiring of) the control wiring substrate PB2 via signal pins PN3 will be explained.

(The signal wiring of) the power wiring substrate PB1 and (the signal wiring of) the control wiring substrate PB2 are electrically connected via a plurality of signal pins PN3. Incidentally, the signal pin PN3 is a connection pin used for electrically connecting the control system circuit configuration unit SK (more particularly, driver circuit unit DR) and the power system circuit configuration unit PK (see FIG. 1 explained above). The signal wirings (the signal wirings WS1 and WS2 explained later) of the control wiring substrate PB2 and the signal wiring (the signal wiring WS3 explained later) of the power wiring substrate PB1 are wirings used for electrically connecting the control system circuit configuration unit SK (more particularly, driver circuit unit DR) and the power system circuit configuration unit PK. The signal wirings (the signal wirings WS1 and WS2 explained later) of the control wiring substrate PB2 also include wirings for connecting the control circuit unit CT and the driver circuit unit DR in the control system circuit configuration unit SK. Therefore, signals and the like can be transmitted between the control system circuit configuration unit SK (more particularly, driver circuit unit DR) and the power system circuit configuration unit PK via the signal wiring of the control wiring substrate PB2, the signal pins PN3, and the signal wiring of the power wiring substrate PB1.

More specifically, the control wiring substrate PB2 includes the hole (through hole) HC3 through which the signal pin PN3 is inserted, and the power wiring substrate PB1 includes the hole (through hole) HP3 through which the signal pin PN3 is inserted. The signal wirings of the control wiring substrate PB2 (corresponding to the signal wirings WS1 and WS2 explained later) and the signal wiring of the power wiring substrate PB1 (corresponding to the signal wiring WS3 explained later) are electrically connected via the signal pins PN3 inserted through the hole HC3 of the control wiring substrate PB2 and the hole HP3 of the power wiring substrate PB1. When this is applied to FIG. 7, the connection pin PN of FIG. 7 corresponds to the signal pin PN3, and the hole HC of FIG. 7 corresponds to the hole HC3, and the hole HP of FIG. 7 corresponds to the hole HP3. The conductive films CD2a and CD2b of FIG. 7 correspond to the signal wirings of the control wiring substrate PB2 (the signal wirings WS1 and WS2 explained later). The conductive films CD1a and CD1b of FIG. 7 correspond to the signal wiring of the power wiring substrate PB1 (the signal wiring WS3 explained later).

The plurality of signal pins PN3 are provided. More specifically, the signal pins PN3 include: two signal pins PN3 respectively connected to both ends of the resistor R1; two signal pins PN3 respectively connected to both ends of the resistor R4; two signal pins PN3 respectively connected to both ends of the resistor R7. Further, the signal pins PN3 also include a signal pin PN3 electrically connected to the gate of the power MOSFET 1 via the resistor R2; a signal pin PN3 electrically connected to the gate of the power MOSFET 2 via the resistor R3; and a signal pin PN3 electrically connected to the gate of the power MOSFET 3 via the resistor R5. Further, the signal pins PN3 also include: a signal pin PN3 electrically connected to the gate of the power MOSFET 4 via the resistor R6; a signal pin PN3 electrically connected to the gate of the power MOSFET 5 via the resistor R8; and a signal pin PN3 electrically connected to the gate of the power MOSFET 6 via the resistor R9. Further, the signal pins PN3 may include six signal pins PN3 respectively connected to the sources of the power MOSFETs 1, 2, 3, 4, 5, and 6. On the control wiring substrate PB2 side, any of the signal pins PN3 is connected to the driver circuit unit DR (i.e., a semiconductor device PKG6 explained later). The driver circuit unit DR is constituted by the semiconductor device PKG6 explained later.

Therefore, each gate of the power MOSFETs 1, 2, 3, 4, 5, and 6 is electrically connected to the signal pin PN3 via the signal wirings and resistor device(s) (the resistor device(s) corresponding to any of the resistors R2, R3, R5, R6, R8, and R9) of the power wiring substrate PB1, and is further electrically connected to the semiconductor device PKG6 via the signal pin PN3 and the signal wiring(s) of the control wiring substrate PB2. Both ends of each of the resistors R1, R4, and R7 are electrically connected to the signal pins PN3 via the signal wirings of the power wiring substrate PB1, and are further electrically connected to the semiconductor device PKG6 explained later via the signal pins PN3 and the signal wirings of the control wiring substrate PB2. The source of each of the power MOSFETs 1, 2, 3, 4, 5, and 6 is electrically connected to the signal pin PN3 via the signal wiring of the power wiring substrate PB1, and is further electrically connected to the semiconductor device PKG6 explained later via the signal pin PN3 and the signal wiring of the control wiring substrate PB2. Therefore, the later-explained semiconductor device PKG6 mounted on the control wiring substrate PB2 is electrically connected to the electronic components (corresponding to semiconductor devices PKG1, PKG2, and PKG3, and chip resistors R1a to R9a explained later) mounted on the power wiring substrate PB1 via the signal wirings of the control wiring substrate PB2, the signal pins PN3, and the signal wirings of the power wiring substrate PB1.

Subsequently, a connection between the power wiring substrate PB1 and the motor MOT via connection pins BB (BB1, BB2, and BB3) will be explained with reference to FIG. 6.

(The wirings of) the power wiring substrate PB1 and the motor MOT are electrically connected via the connection pins BB (BB1, BB2, and BB3). The connection pins (bus bars) BB electrically connecting (the wirings of) the power wiring substrate PB1 and the motor MOT include the connection pin BB1, the connection pin BB2, and the connection pin BB3. But, FIGS. 6 and 8 show only one connection pin BB as a representative. The connection pin BB1, the connection pin BB2, and the connection pin BB3 are not electrically connected and are different members. Holes (through holes) HM1, HM2, and HM3 through which the connection pins BB1, BB2, and BB3 are respectively inserted are formed in the power wiring substrate PB1. But, FIGS. 6 and 8 show, as a representative, only one hole HM representing the holes HM1, HM2, and HM3, and one connection pin BB inserted therethrough. In FIGS. 6 and 8, when the hole HM is the hole HM1, the connection pin BB corresponds to the connection pin BB1; when the hole HM is the hole HM2, the connection pin BB corresponds to the connection pin BB2; and when the hole HM is the hole HM3, the connection pin BB corresponds to the connection pin BB3.

Incidentally, the above-mentioned connection pins PN are configured to electrically connect (the wirings of) the power wiring substrate PB1 and (the wirings of) the control wiring substrate PB2, but the connection pins BB are different from the connection pins PN in that the connection pins BB are not configured to electrically connect the power wiring substrate PB1 and the control wiring substrate PB2 but the connection pins BB are configured to electrically connect (the wirings of) the power wiring substrate PB1 and (the coils of) the motor MOT. Like the connection pin PN, the connection pin BB is also made of a conductive body, more preferably, a metal material.

When more specific explanation is made, the power wiring substrate PB1 has the hole (through hole) HM1 through which the connection pin BB1 is inserted, the hole (through hole) HM2 through which the connection pin BB2 is inserted, and the hole (through hole) HM3 through which the connection pin BB3 is inserted. One end portion side of the connection pin BB1 is inserted through the hole HM1 of the power wiring substrate PB1, and the other end portion side of the connection pin BB1 is inserted in and fixed to the hole of the upper portion of the motor MOT. One end portion side of the connection pin BB2 is inserted through the hole HM2 of the power wiring substrate PB1, and the other end portion side of the connection pin BB2 is inserted in and fixed to the hole of the upper portion of the motor MOT. One end portion side of the connection pin BB3 is inserted through the hole HM3 of the power wiring substrate PB1, and the other end portion side of the connection pin BB3 is inserted in and fixed to the hole of the upper portion of the motor MOT. The connection pin BB1 is electrically connected to the U-phase coil in the motor MOT via an internal wiring (not shown) and the like of the motor MOT; the connection pin BB2 is electrically connected to the V-phase coil in the motor MOT via an internal wiring (not shown) and the like of the motor MOT; and the connection pin BB3 is electrically connected to the W-phase coil in the motor MOT via an internal wiring (not shown) and the like of the motor MOT.

Here, a structure for electrically connecting the power wiring substrate PB1 and the motor MOT via the connection pins BB1, BB2, and BB3 will be described with reference to FIG. 8.

As shown in FIG. 8, in the power wiring substrate PB1, the conductive film CD1c on the side surface (inner wall) of the hole HM is electrically connected to the connection pin BB inserted through the hole HM. For example, the conductive film CD1c on the side surface of the hole HM of the power wiring substrate PB1 and the connection pin BB inserted through the hole HM interpose a conductive bonding material such as solder SL therebetween, and are electrically connected via the bonding material. Alternatively, they may be electrically connected to each other since the conductive film CD1c on the side surface of the hole HM of the power wiring substrate PB1 and the connection pin BB inserted through the hole HM are in contact with each other. Incidentally, the connection pin BB can be also fixed to the power wiring substrate PB1 by using the conductive bonding material such as solder SL.

The conductive film CD1c on the side surface of the hole HM of the power wiring substrate PB1 is electrically connected to the conductive film CD1a formed around the hole HM on the upper surface of the power wiring substrate PB1, and is electrically connected to the conductive film CD1b formed around the hole HM on the lower surface of the power wiring substrate PB1. Therefore, in FIG. 8, the conductive films CD1a, CD1b, and CD1c of the power wiring substrate PB1 can be electrically connected to the connection pin BB.

As described above, the wiring pattern (the conductive film CD1a or the conductive film CD1b) formed on the upper surface or the lower surface of the power wiring substrate PB1 can be electrically connected to the connection pin BB.

In addition, on the power wiring substrate PB1, the resist layers RS1a and RS1b may include such opening portions OP1 and OP2 as to encompass the hole HM in the plan view. In this case, one or both of the conductive films CD1a and CD1b exposed from the opening portions OP1 and OP2 of the resist layers RS1a and RS1b around the hole HM of the power wiring substrate PB1 can be electrically connected to the connection pin BB via a conductive bonding material such as solder SL.

Therefore, a low side drain terminal (die pad DP2) of the later-explained semiconductor device PKG1 mounted on the power wiring substrate PB1 can be electrically connected to the connection pin BB1 via the wiring (output wiring) of the power wiring substrate PB1, and can be electrically connected to the U-phase coil in the motor MOT via the connection pin BB1 and an internal wiring (not shown) of the motor MOT. A low side drain terminal (die pad DP2) of the later-explained semiconductor device PKG2 mounted on the power wiring substrate PB1 can be electrically connected to the connection pin BB2 via a wiring (output wiring) of the power wiring substrate PB1, and can be electrically connected to the V-phase coil in the motor MOT via the connection pin BB2 and an internal wiring (not shown) of the motor MOT. A low side drain terminal (die pad DP2) of the later-explained semiconductor device PKG3 mounted on the power wiring substrate PB1 can be electrically connected to the connection pin BB3 via a wiring (output wiring) of the power wiring substrate PB1, and can be electrically connected to the W-phase coil in the motor MOT via the connection pin BB3 and an internal wiring (not shown) of the motor MOT.

In addition, as shown in FIG. 6, the discharge port TK protruding from the motor MOT penetrates through the hole (through hole) HT1 of the power wiring substrate PB1 and the hole (through hole) HT2 of the control wiring substrate PB2. The fuel (not shown) sucked up by the motor MOT is supplied to the engine ENG (not shown in FIG. 6) through the discharge port TK and a fuel pipe (not shown in FIG. 6) connected thereto.

<Regarding Implementation Structure on Power Wiring Substrate>

Figure 9:
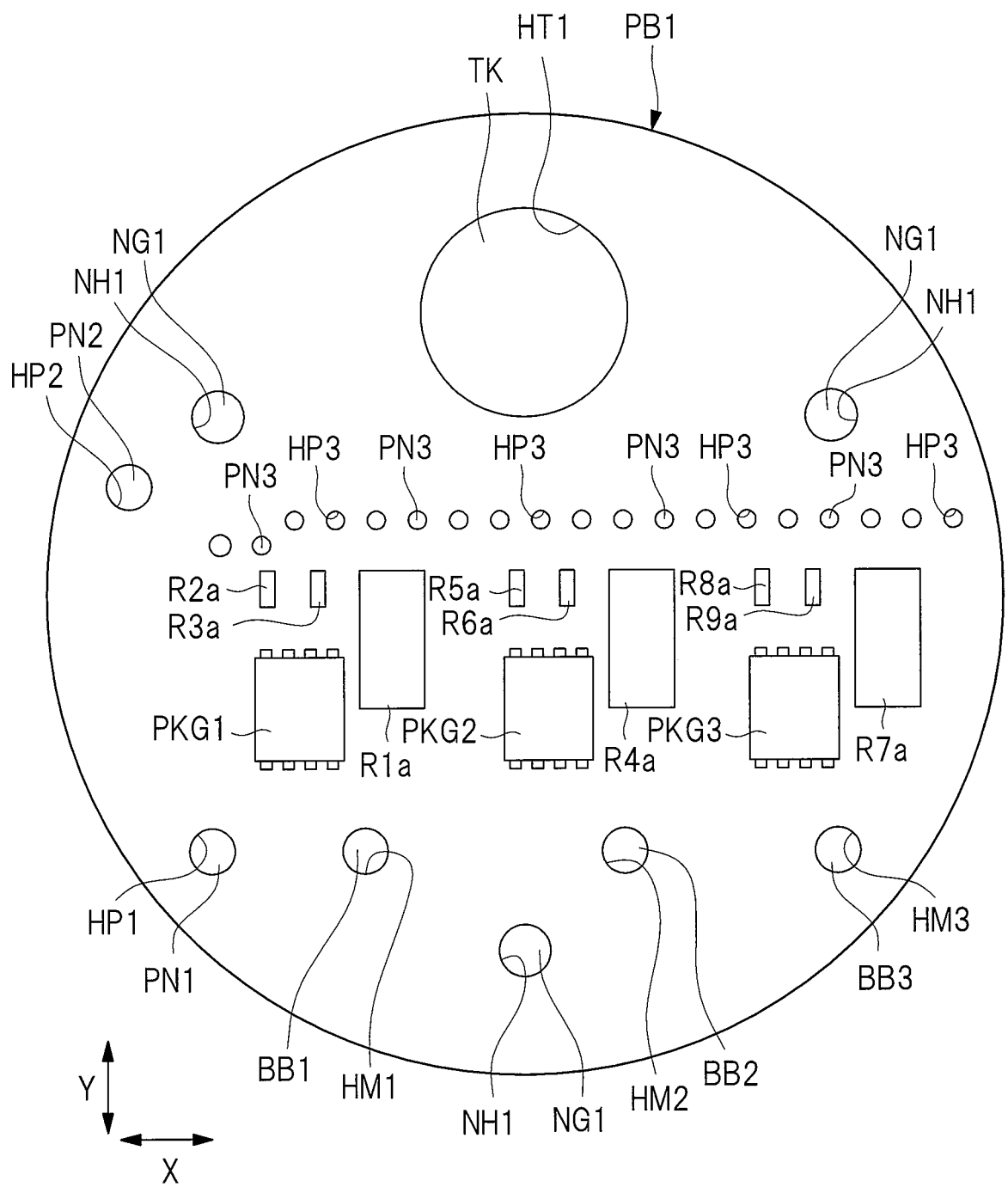
FIG. 9 is a top view of a power wring substrate.

FIG. 9 is a top view of the power wiring substrate PB1, and FIG. 9 also shows a plurality of multiple electronic components mounted on the power wiring substrate PB1.

Multiple electronic components for forming the power system circuit configuration unit PK are mounted on the power wiring substrate PB1. More specifically, as shown in FIG. 9, the semiconductor devices (semiconductor package) PKG1, PKG2, and PKG3 and the chip resistors R1a, R2a, R3a, R4a, R5a, R6a, R7a, R8a, and R9a are mounted on the upper surface of the power wiring substrate PB1. Incidentally, in FIG. 6, the semiconductor devices PKG1, PKG2, and PKG3 and the chip resistors R1a, R2a, R3a, R4a, R5a, R6a, R7a, R8a, and R9a mounted on the power wiring substrate PB1 are represented and shown as an electronic component EC1.

The semiconductor device PKG1 is a semiconductor device constituting the power MOSFET 1 and the power MOSFET 2. The semiconductor device PKG2 is a semiconductor device constituting the power MOSFET 3 and the power MOSFET 4. The semiconductor device PKG3 is a semiconductor device constituting the power MOSFET 5 and the power MOSFET 6. The chip resistor R1a is a resistor device constituting the resistor R1. The chip resistor R2a is a resistor device constituting the resistor R2. The chip resistor R3a is a resistor device constituting the resistor R3. The chip resistor R4a is a resistor device constituting the resistor R4. The chip resistor R5a is a resistor device constituting the resistor R5. The chip resistor R6a is a resistor device constituting the resistor R6. The chip resistor R7a is a resistor device constituting the resistor R7. The chip resistor R8a is a resistor device constituting the resistor R8. The chip resistor R9a is a resistor device constituting the resistor R9. The semiconductor devices PKG1 to PKG3 and the chip resistors R1a to R9a are mounted on the power wiring substrate PB1 are electrically connected to the wirings of the power wiring substrate PB1. The semiconductor devices PKG1, PKG2, and PKG3 mounted on the power wiring substrate PB1 are electrically connected, as the need arises, to the power supply connection pin PN1, the ground connection pin PN2, the connection pin BB1, the connection pin BB2, the connection pin BB3, or the signal pin PN3 via the wiring of the power wiring substrate PB1.

The semiconductor devices PKG1, PKG2, and PKG3 among the plurality of electronic components mounted on the power wiring substrate PB1 generate a large amount of heat during their operations. Therefore, a heat radiation member such as a heat radiation sheet HS (see FIG. 6) may be interposed (arranged) between the lower surface of the power wiring substrate PB1 and the upper surface of the motor MOT at positions overlapping the semiconductor devices PKG1, PKG2, and PKG3 in the plan view, i.e., at positions immediately under the semiconductor devices PKG1, PKG2, and PKG3. Accordingly, the heat generated by the semiconductor devices PKG1, PKG2, and PKG3 can be efficiently conducted (radiated) to the motor MOT via the power wiring substrate PB1 and heat radiation sheet HS. This improves heat radiation characteristics of the semiconductor devices PKG1, PKG2, and PKG3, and thereby makes it possible to further stabilize and improve performance of the electronic device.

<Regarding Implementation Structure on Control Wiring Substrate>

Figure 10:
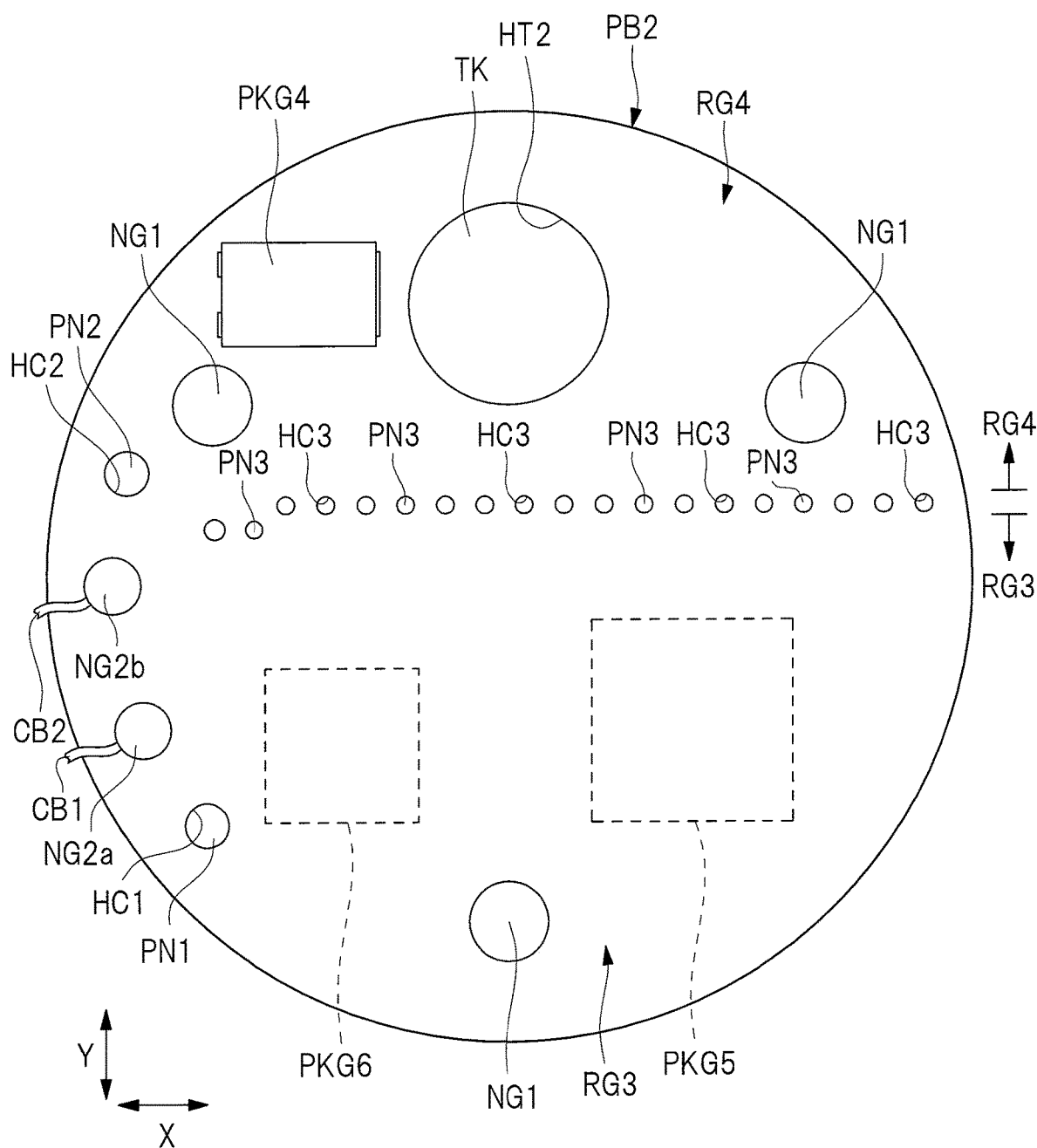
FIG. 10 is a top view of a control wiring substrate.
Figure 11:
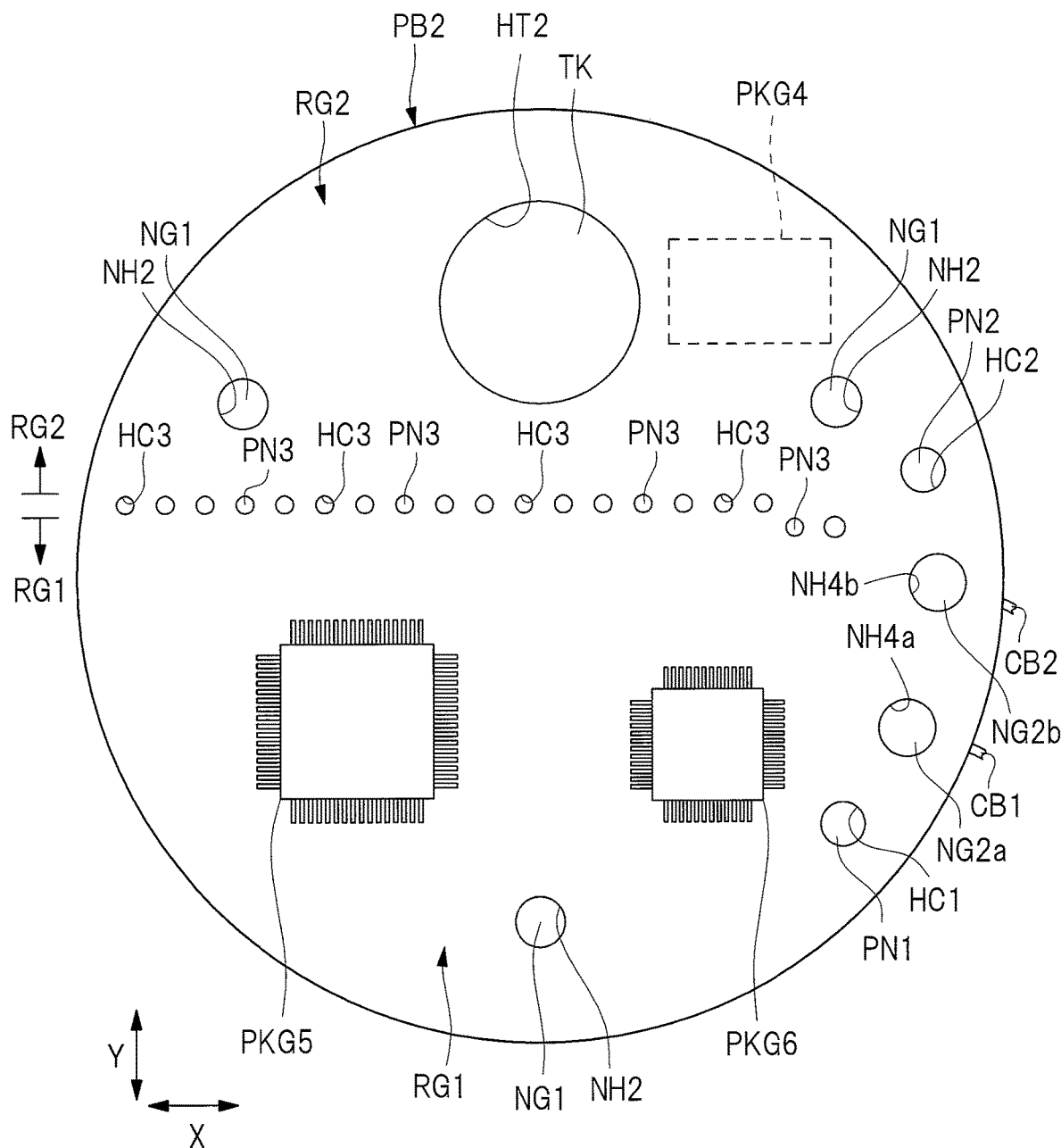
FIG. 11 is a bottom view of the control wiring substrate.

FIG. 10 is a top view of the control wiring substrate PB2. FIG. 11 is a bottom view of the control wiring substrate PB2. FIGS. 10 and 11 also illustrate a plurality of electronic components mounted on the control wiring substrate PB2.

A plurality of electronic components for forming the control system circuit configuration unit SK are mounted on the control wiring substrate PB2. More specifically, as shown in FIGS. 6 and 10, the semiconductor device (semiconductor package) PKG4 constituting the regulator RE can be mounted on the upper surface of the control wiring substrate PB2. As shown in FIGS. 6 and 11, the semiconductor device (semiconductor package) PKG5 constituting the control circuit unit CT and the semiconductor device (semiconductor package) PKG6 constituting the driver circuit unit DR are mounted on the lower surface of the control wiring substrate PB2.

Incidentally, in FIG. 10 (top view) for the sake of easy understanding, the positons (plane positons) of the semiconductor devices PKG5 and PKG6 mounted on the lower surface side of the control wiring substrate PB2 are transparently indicated by dotted lines. In FIG. 11 (bottom view), the positon (plane positon) of the semiconductor device PKG4 mounted on the upper surface side of the control wiring substrate PB2 is transparently indicated by dotted lines.

The semiconductor devices PKG4, PKG5, and PKG6 mounted on the control wiring substrate PB2 are electrically connected to the wirings of the control wiring substrate PB2, and are connected with each other, as the need arises, by the wirings of the control wiring substrate PB2. The semiconductor devices PKG4 and PKG5, PKG6 mounted on the control wiring substrate PB2 are electrically connected, as the need arises, to the power supply cable CB1, the ground cable CB2, the power supply connection pin PN1, the ground connection pin PN2, or the signal pin PN3 via the wirings of the control wiring substrate PB2.

In addition, a single or plurality of passive components (for example, chip components such as chip resistors) may be further mounted on the upper surface or the lower surface of the control wiring substrate PB2. But, in FIGS. 10 and 11, passive components mounted on the upper surface or the lower surface of the control wiring substrate PB2 are not shown and are omitted.

<Regarding Configuration of Semiconductor Device>

First, configurations of the semiconductor devices PKG1, PKG2, and PKG3 mounted on the power wiring substrate PB1 will be explained.

The configuration of the semiconductor device PKG1, the configuration of the semiconductor device PKG2, and the configuration of the semiconductor device PKG3 are basically the same as each other. Therefore, the configuration of the semiconductor device PKG1 will be explained, as a representative, with reference to FIGS. 12 to 18.

Figure 12:
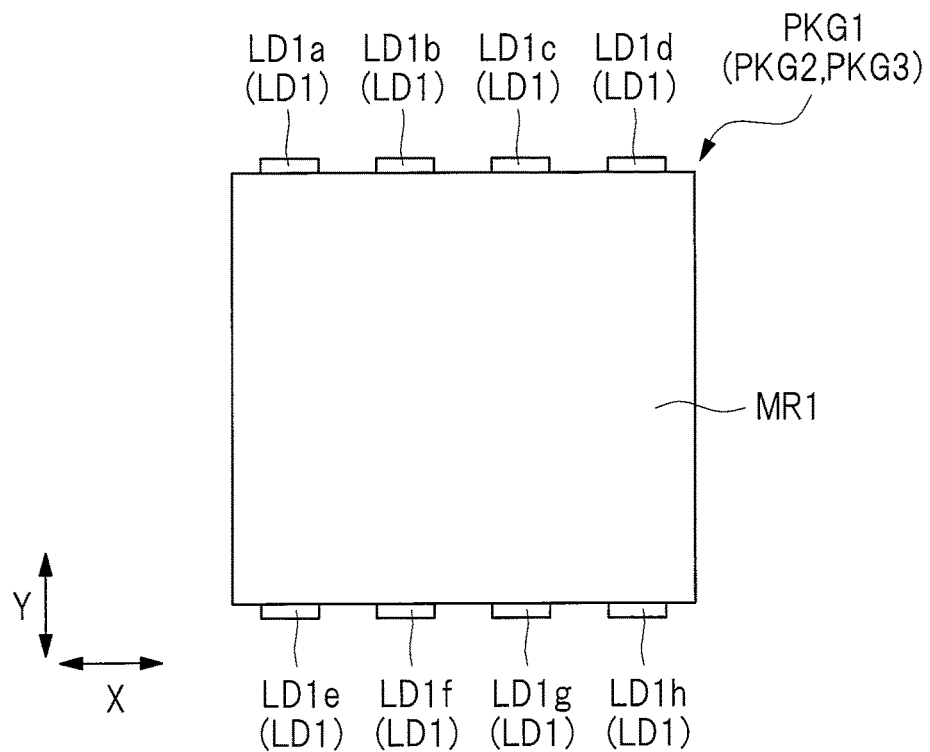
FIG. 12 is a top view of a semiconductor device.
Figure 13:
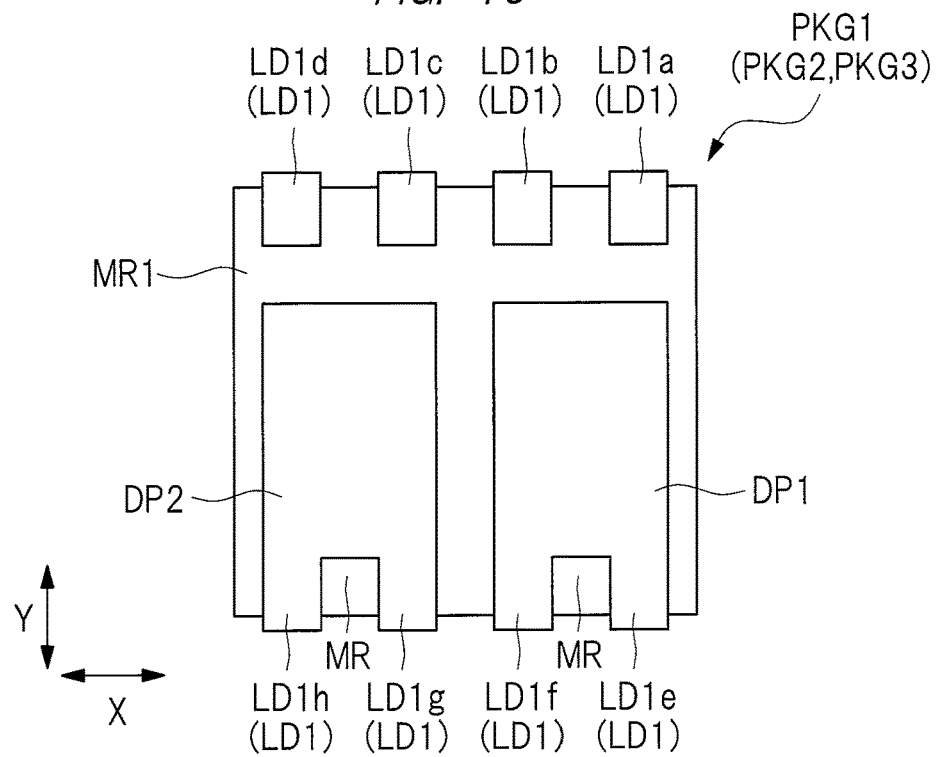
FIG. 13 is a bottom view of the semiconductor device of FIG. 12.
Figure 14:
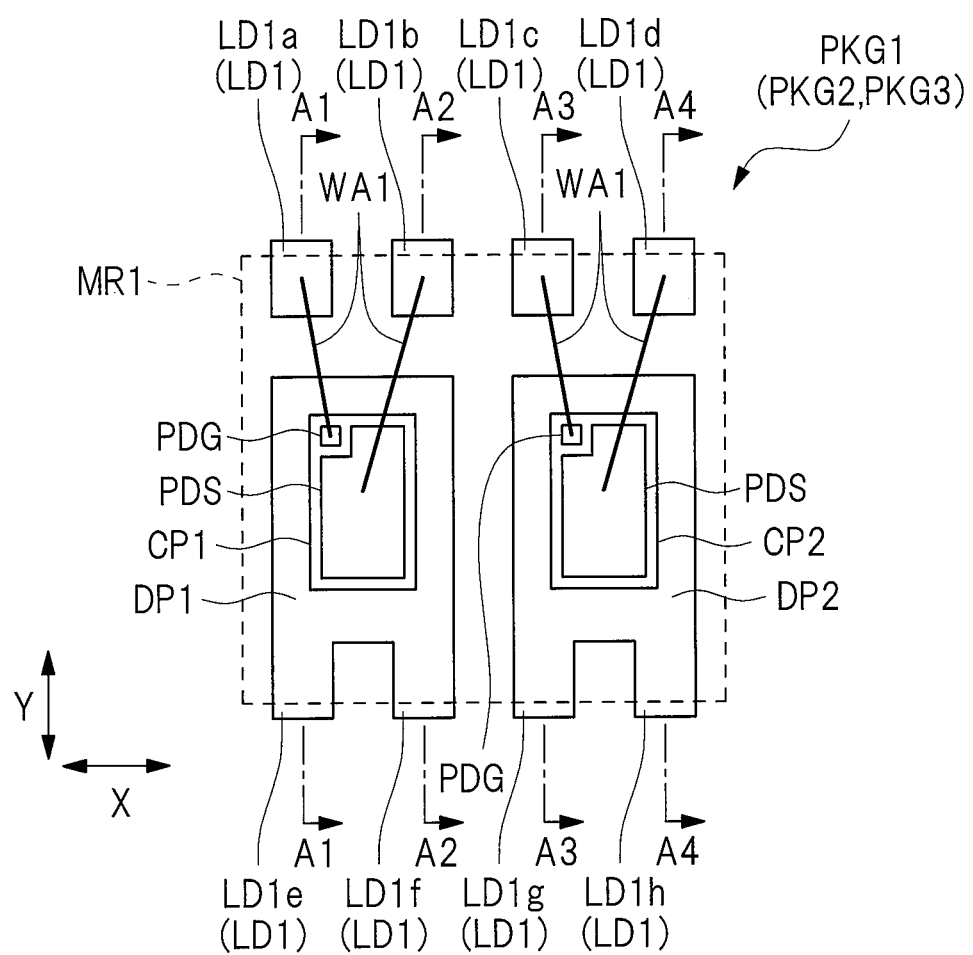
FIG. 14 is a perspective plan view of the semiconductor device of FIG. 12.
Figure 15:
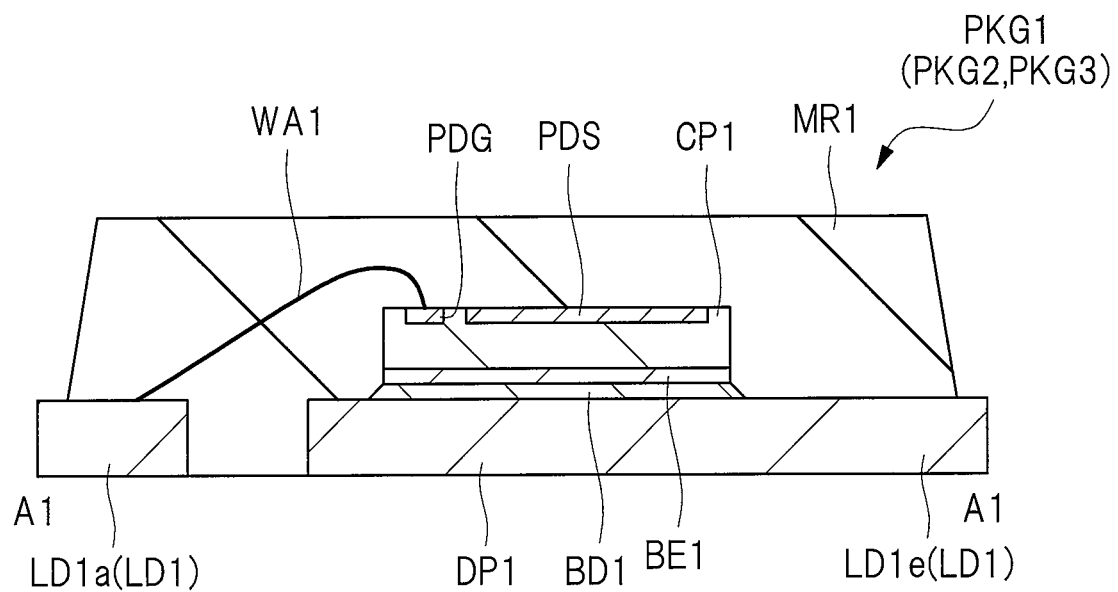
FIG. 15 is a cross-sectional view of the semiconductor device of FIG. 12.
Figure 16:
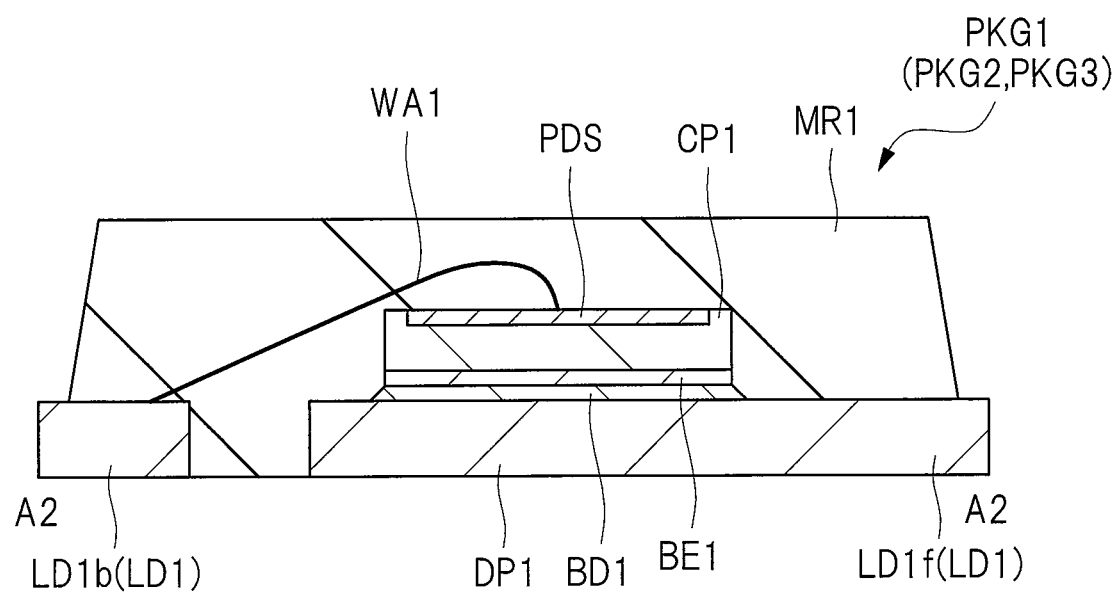
FIG. 16 is a cross-sectional view of the semiconductor device of FIG. 12.
Figure 17:
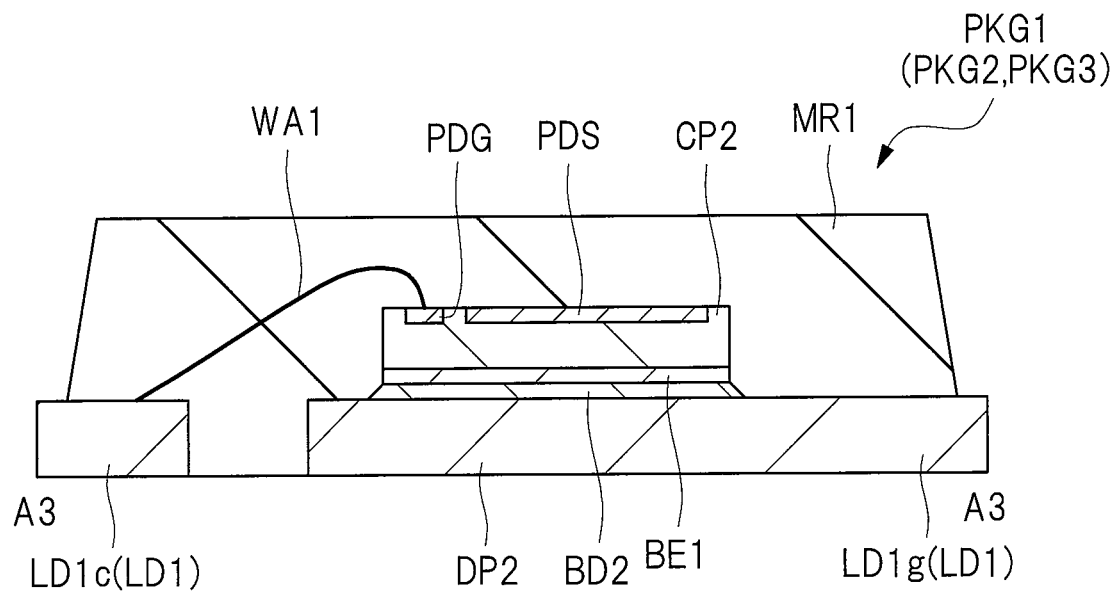
FIG. 17 is a cross-sectional view of the semiconductor device of FIG. 12.
Figure 18:
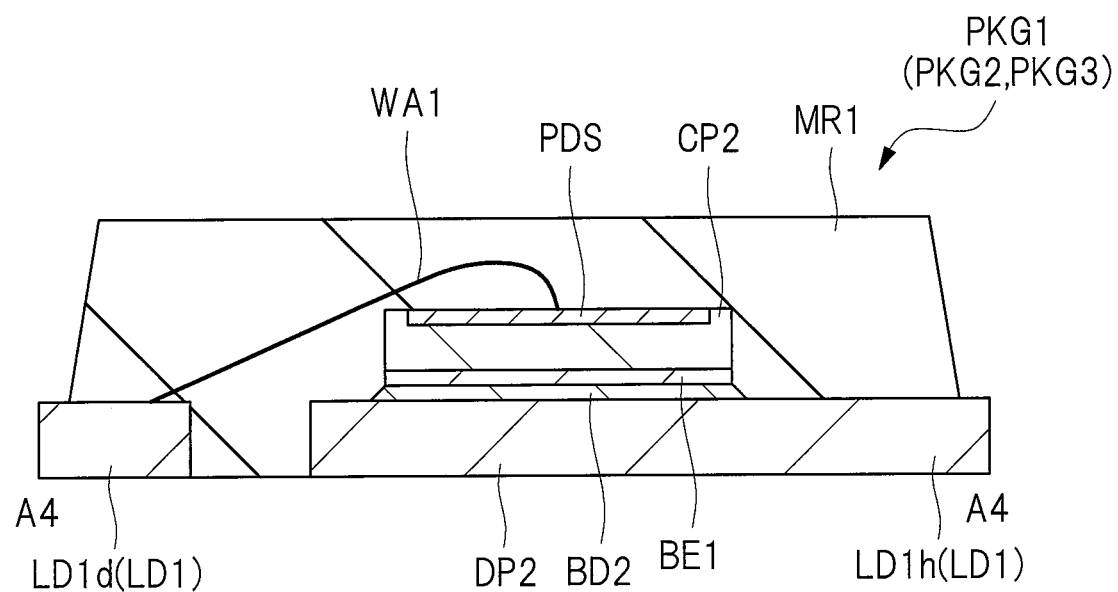
FIG. 18 is a cross-sectional view of the semiconductor device of FIG. 12.

FIG. 12 is a top view of the semiconductor device PKG1. FIG. 13 is a bottom view of the semiconductor device PKG1. FIG. 14 is a plan perspective view of the semiconductor device PKG1, and illustrates a plan perspective view on the upper surface side of the semiconductor device PKG1 when seen through a sealing portion MR1. FIG. 14 illustrates an external peripheral position of the sealing portion MR1 with a dotted line. FIGS. 15 to 18 are cross-sectional views of the semiconductor device PKG1. FIG. 15 substantially corresponds to a cross-sectional view taken along line A1-A1 of FIG. 14. FIG. 16 substantially corresponds to a cross-sectional view taken along line A2-A2 of FIG. 14. FIG. 17 substantially corresponds to a cross-sectional view taken along line A3-A3 of FIG. 14. FIG. 18 substantially corresponds to a cross-sectional view taken along line A4-A4 of FIG. 14.

As shown in FIGS. 12 to 18, the semiconductor device PKG1 includes: die pads (chip mounting portions) DP1 and DP2; semiconductor chips CP1 and CP2 mounted on the upper surfaces of the die pads DP1 and DP2; a plurality of bonding wires (hereinafter simply referred to as wires) WA1; a plurality of leads LD1; and a sealing portion (sealing resin portion, sealing body) MR1 for sealing them.

Each of the die pads DP1 and DP2, the leads LD1, the later-described die pads DP4, DP5, and DP6, and leads LD4, LD5, and LD6 is composed of a conductive body, more preferably, made of a metal material such as copper (Cu) or a copper alloy. The sealing portion MR1 and the later-described sealing portions MR4, MR5, and MR6 are each composed of a resin material such as a thermosetting resin material, and may also contain a filler and the like.

The die pad DP1 and the die pad DP2 are arranged alongside in the plan view. The semiconductor chip CP1 is mounted on the die pad DP1. The semiconductor chip CP2 is mounted on the die pad DP2.

In the semiconductor chip CP1, a power MOSFET is formed. More specifically, many unit transistor cells are formed on a semiconductor substrate constituting the semiconductor chip CP1, and since these many unit transistor cells are connected in parallel, the power MOSFET is formed. The unit transistor cell is constituted by, for example, a trench gate-type field effect transistor. A source pad (source bonding pad) PDS connected to a source of the power MOSFET, and a gate pad (gate bonding pad) PDG connected to a gate of the power MOSFET are formed on a front surface side of the semiconductor chip CP1. On the entire back surface of the semiconductor chip CP1, aback surface electrode (back surface drain electrode) BE1 connected to a drain of the power MOSFET is formed.

Since a configuration of the semiconductor chip CP2 is the same as the configuration of the semiconductor chip CP1, a repetitive description thereof will be omitted here.

The semiconductor chip CP1 is a high side semiconductor chip with a high side MOSFET (any one of the power MOSFETs 1, 3, 5). The semiconductor chip CP2 is a low side semiconductor chip with a low side MOSFET (any one of the power MOSFETs 2, 4, 6).

The back surface electrode BE1 of the semiconductor chip CP1 is bonded to an upper surface of the die pad DP1 via a conductive bonding material BD1, and thereby is electrically connected to the die pad DP1. The back surface electrode BE1 of the semiconductor chip CP2 is bonded to an upper surface of the die pad DP2 via a conductive bonding material BD2, and thereby is electrically connected to the die pad DP2.

The plurality of leads LD1 that the semiconductor device PKG1 has includes: gate leads LD1$a$ and LD1$c$; source leads LD1$b$ and LD1$d$; and drain leads LD1$e$, LD1$f$, LD1$g$, and LD1$h$.

The gate lead LD1$a$ is electrically connected to a gate pad PDG of the semiconductor chip CP1 via the wire WA1. The source lead LD1$b$ is electrically connected to a source pad PDS of the semiconductor chip CP1 via the wire WA1. The gate lead LD1$c$ is electrically connected to a gate pad PDG of the semiconductor chip CP2 via the wire WA1. The source lead LD1$d$ is electrically connected to a source pad PDS of the semiconductor chip CP2 via the wire WA1.

The drain lead LD1$e$ and the drain lead LD1$f$ are formed integrally with the die pad DP1 opposite a side on which the gate lead LD1$a$ and the source lead LD1$b$ are placed. The drain lead LD1$g$ and the drain lead LD1$h$ are formed integrally with the die pad DP2 opposite aside on which the gate lead LD1$c$ and the source lead LD1$d$ are placed.

Each lower surface of the die pads DP1 and DP2, the gate leads LD1$a$ and LD1$c$, the source leads LD1$b$ and LD1$d$, and the drain leads LD1$e$, LD1$f$, LD1$g$, and LD1$h$ is exposed from a lower surface of the sealing portion MR1, and serves as an external connection terminal of the semiconductor device PKG1.

Since the configuration of the semiconductor device PKG2 and the configuration of the semiconductor device PKG3 are each similar to the configuration of the semiconductor device PKG1, a repetitive description thereof will be omitted here. Incidentally, in a case of the semiconductor device PKG1, the semiconductor chip CP1 out of the two semiconductor chips CP1 and CP2 incorporated in the semiconductor device PKG1 constitutes the power MOSFET 1, and the semiconductor chip CP2 constitutes the power MOSFET 2. In a case of the semiconductor device PKG2, the semiconductor chip CP1 out of the two semiconductor chips CP1 and CP2 incorporated in the semiconductor device PKG2 constitutes the power MOSFET 3, and the semiconductor chip CP2 constitutes the power MOSFET 4. In a case of the semiconductor device PKG3, the semiconductor chip CP1 out of the two semiconductor chips CP1 and CP2 incorporated in the semiconductor device PKG3 constitutes the power MOSFET 5, and the semiconductor chip CP2 constitutes the power MOSFET 6.

Therefore, in the semiconductor device PKG1, the gate lead LD1$a$ is a gate terminal connected to the gate of the power MOSFET 1; the source lead LD1$b$ is a source terminal connected to the source of the power MOSFET 1; and the die pad DP1 and the drain leads LD1$e$ and LD1$f$ are drain terminals connected to the drain of the power MOSFET 1. In the semiconductor device PKG1, the gate lead LD1$c$ is a gate terminal connected to the gate of the power MOSFET 2; the source lead LD1$d$ is a source terminal connected to the source of the power MOSFET 2; and the die pad DP2 and the drain leads LD1$g$ and LD1$h$ are drain terminals connected to the drain of the power MOSFET 2.

In the semiconductor device PKG2, the gate lead LD1$a$ is a gate terminal connected to the gate of the power MOSFET 3; the source lead LD1$b$ is a source terminal connected to the source of the power MOSFET 3; and the die pad DP1 and drain leads LD1$e$ and LD1$f$ are drain terminals connected to the drain of the power MOSFET 3. In the semiconductor device PKG2, the gate lead LD1$c$ is a gate terminal connected to the gate of the power MOSFET 4; the source lead LD1$d$ is a source terminal connected to the source of the power MOSFET 4; and the die pad DP2 and the drain leads LD1$g$ and LD1$h$ are drain terminals connected to the drain of the power MOSFET 4.

In the semiconductor device PKG3, the gate lead LD1$a$ is a gate terminal connected to the gate of the power MOSFET 5; the source lead LD1$b$ is a source terminal connected to the source of the power MOSFET 5; and the die pad DP1 and drain leads LD1$e$ and LD1$f$ are drain terminals connected to the drain of the power MOSFET 5. In the semiconductor device PKG3, the gate lead LD1$c$ is a gate terminal connected to the gate of the power MOSFET 6; the source lead LD1$d$ is a source terminal connected to the source of the power MOSFET 6; and the die pad DP2 and the drain leads LD1$g$ and LD1$h$ are drain terminals connected to the drain of the power MOSFET 6.

Subsequently, a configuration of the semiconductor device PKG4 mounted on the control wiring substrate PB2 will be described with reference to FIGS. 19 to 23.

Figure 19:
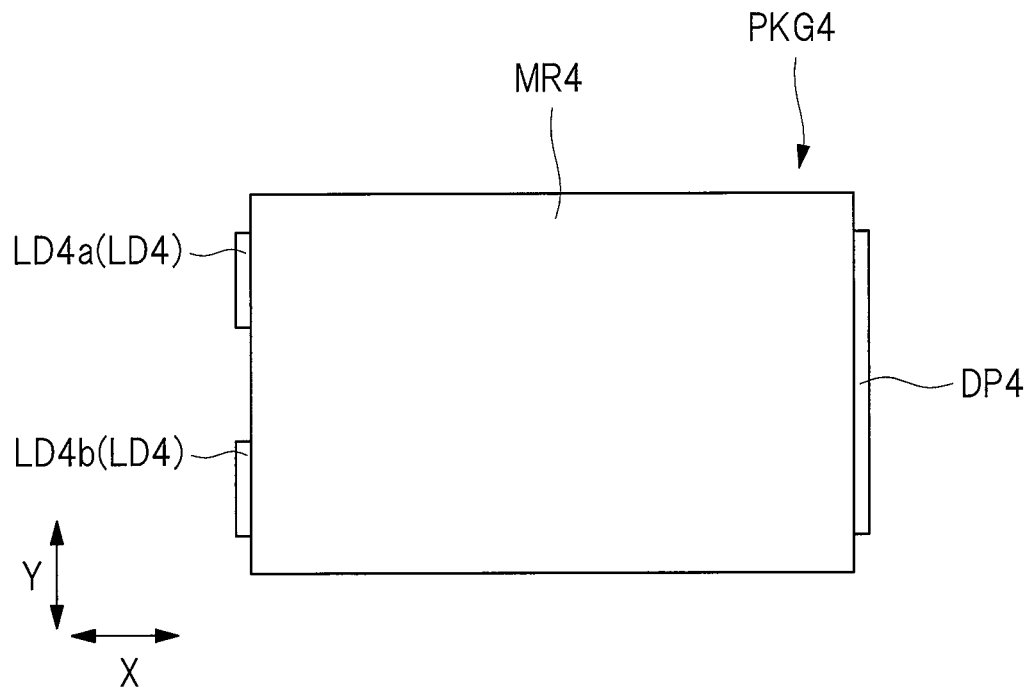
FIG. 19 is a top view of a semiconductor device.
Figure 20:
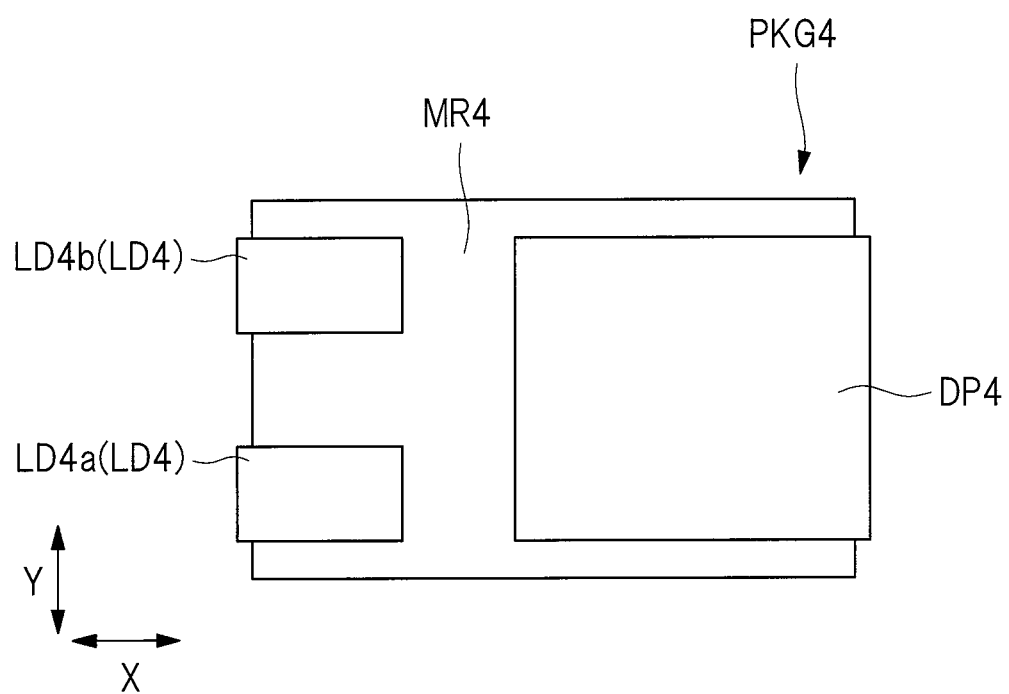
FIG. 20 is a bottom view of the semiconductor device of FIG. 19.
Figure 21:
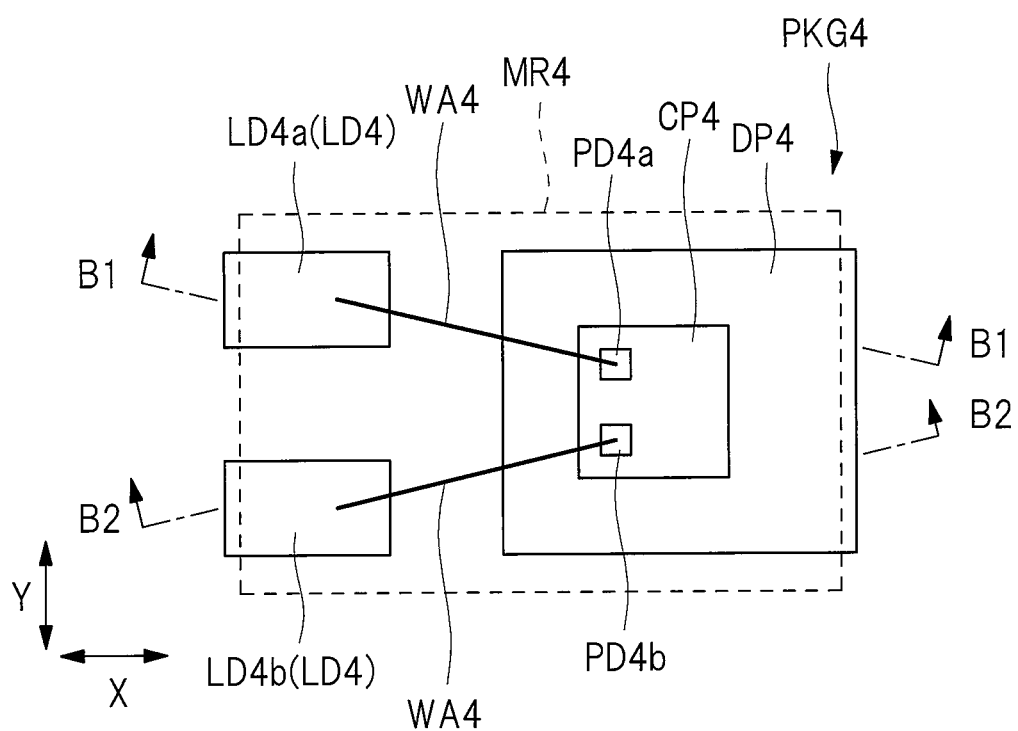
FIG. 21 is a perspective plan view of the semiconductor device of FIG. 19.
Figure 22:
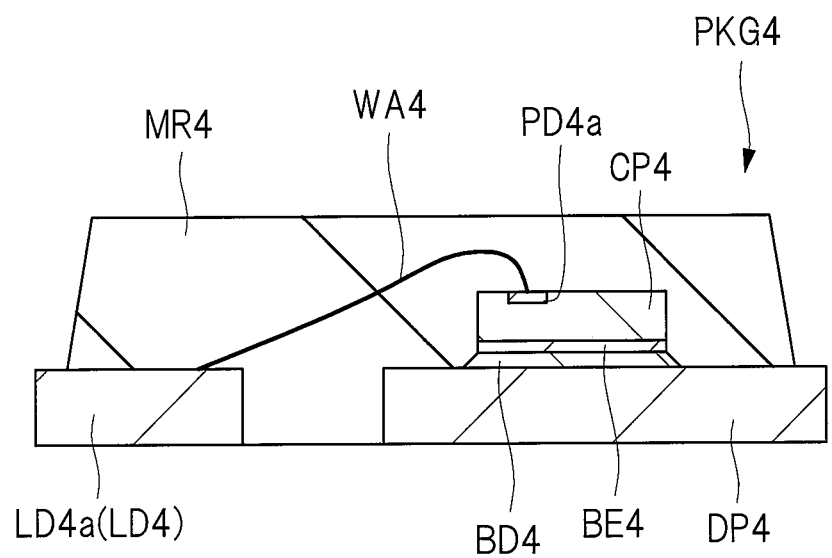
FIG. 22 is a cross-sectional view of the semiconductor device of FIG. 19.
Figure 23:
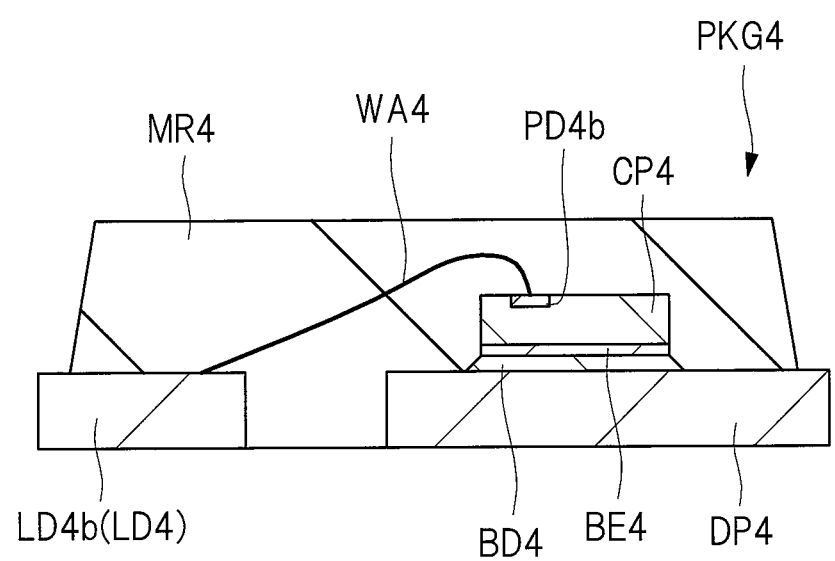
FIG. 23 is a cross-sectional view of the semiconductor device of FIG. 19.

FIG. 19 is a top view of the semiconductor device PKG4, and FIG. 20 is a bottom view of the semiconductor device PKG4. FIG. 21 is a plan perspective view of the semiconductor device PKG4, and illustrates a plan perspective view of an upper surface side of the semiconductor device PKG4 when seen through the sealing portion MR4. FIG. 21 illustrates an external peripheral position of the sealing portion MR4 by a dotted line. FIGS. 22 and 23 are cross-sectional views of the semiconductor device PKG4. FIG. 22 substantially corresponds to a cross-sectional view taken along line B1-B1 of FIG. 21. FIG. 23 substantially corresponds to a cross-sectional view taken along line B2-B2 of FIG. 21.

As shown in FIGS. 19 to 23, the semiconductor device PKG4 has: a die pad (chip mounting portion) DP4; a semiconductor chip CP4 mounted on an upper surface of the die pad DP4; a plurality of wires (bonding wires) WA4; a plurality of leads LD4; and a sealing portion (sealing resin portion, sealing body) MR4 sealing them.

The semiconductor chip CP4 is a semiconductor chip that constitutes the regulator RE, and a circuit(s) constituting the regulator RE is formed in the semiconductor chip CP4. A pad (bonding pad) PD4$a$ into which the power supply potential VIN is inputted, and a pad (bonding pad) PD4$b$ from which the voltage V1 is outputted are formed on a front surface side of the semiconductor chip CP4. A back surface electrode BE4 to which the ground potential GND is supplied is formed on the entire back surface of the semiconductor chip CP4.

The back surface electrode BE4 of the semiconductor chip CP4 is bonded to the upper surface of the die pad DP4 via a conductive bonding material BD4, and thereby is electrically connected to the die pad DP4.

The plurality of leads LD4 that the semiconductor device PKG4 has include a lead LD4$a$ and a lead LD4$b$. The lead LD4$a$ is electrically connected to the pad PD4$a$ of the semiconductor chip CP4 via the wire WA4. The lead LD4$b$ is electrically connected to the pad PD4$b$ of the semiconductor chip CP4 via the wire WA4.

Each lower surface of the die pad DP4, the lead LD4$a$, and the lead LD4$b$ is exposed from a lower surface of the sealing portion MR4, and serves as an external connection terminal of the semiconductor device PKG4.

Subsequently, a configuration of the semiconductor device PKG5 mounted on the control wiring substrate PB2 will be explained with reference to FIGS. 24 to 26.

Figure 24:
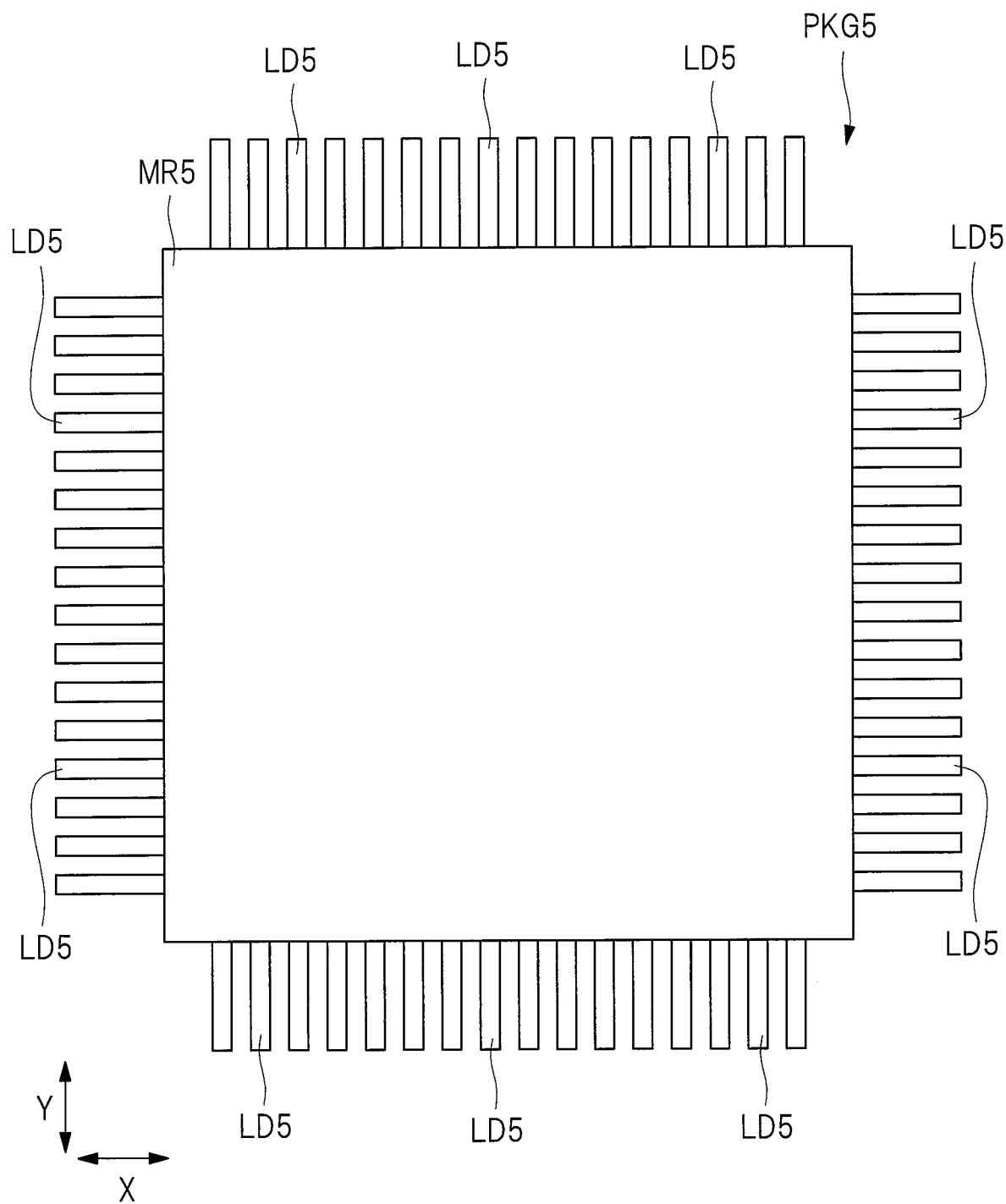
FIG. 24 is a top view of a semiconductor device.
Figure 25:
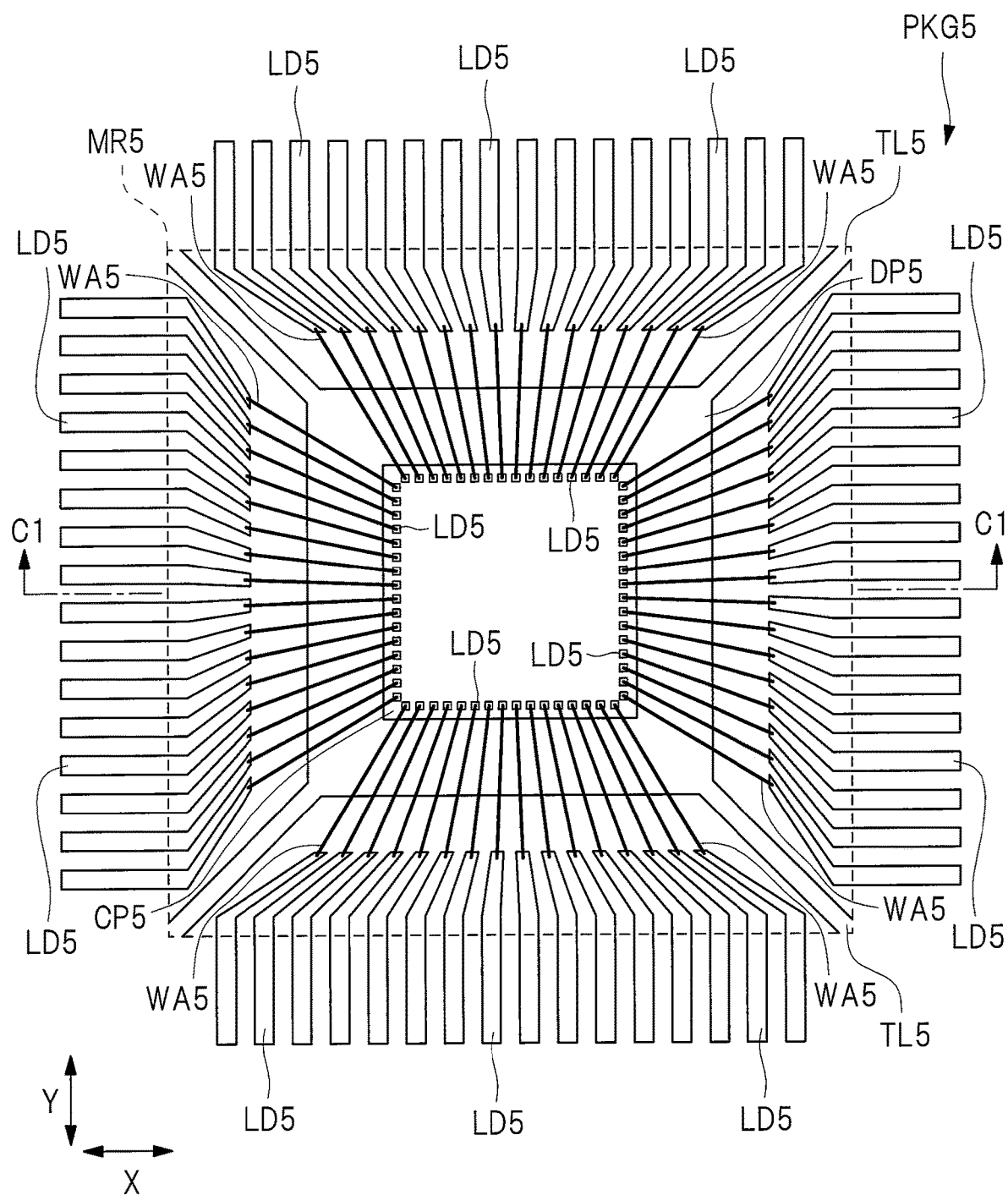
FIG. 25 is a perspective plan view of the semiconductor device of FIG. 24.

FIG. 24 is a top view of the semiconductor device PKG5, and FIG. 25 is a plan perspective view of the semiconductor device PKG5. FIG. 25 illustrates a plan perspective view on an upper surface side of the semiconductor device PKG5 when seen through the sealing portion MR5, and illustrates an external peripheral position of a sealing portion MR5 with a dotted line. FIG. 26 is a cross-sectional view of the semiconductor device PKG5, and substantially corresponds to a cross-sectional view taken along line C1-C1 of FIG. 25.

Figure 26:
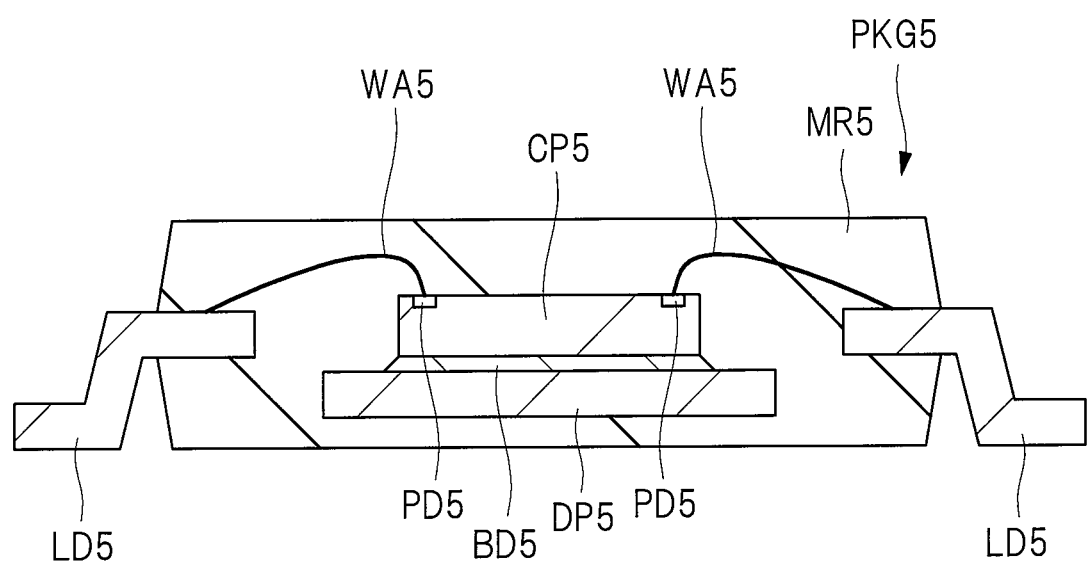
FIG. 26 is a cross-sectional view of the semiconductor device of FIG. 24.

As shown in FIGS. 24 to 26, the semiconductor device PKG5 includes: a die pad (chip mounting portion) DP5; a semiconductor chip CP5 mounted on an upper surface of the die pad DP5; a plurality of wires (bonding wires) WA5; a plurality of leads LD5; and a sealing portion (sealing resin portion, sealing body) MR5 sealing them.

The semiconductor chip CP5 is a semiconductor chip constituting the control circuit unit CT, and a circuit(s) constituting the control circuit unit CT is formed in the semiconductor chip CP5. A plurality of pads (bonding pads) PD5 are formed on the front surface side of the semiconductor chip CP5. On the front surface of the semiconductor chip CP5, the plurality of pads PD5 are arranged along the external periphery of the semiconductor chip CP5, i.e., along four sides of a front surface of the semiconductor chip CP5. The back surface of the semiconductor chip CP5 is bonded to the upper surface of the die pad DP5 via a bonding material BD5.

In the semiconductor device PKG5, the plurality of leads LD5 are arranged around the semiconductor chip CP5 and, therefore, are arranged around the die pads DP5. A plane shape of the die pad DP5 is, for example, a rectangle shape. A part of each of the plurality of leads LD5 is sealed in the sealing portion MR5, and the other part thereof protrudes from the side surface of the sealing portion MR5 outside the sealing portion MR5. Hereinafter, a portion of the lead located within the sealing portion will be referred to as an inner lead portion, and a portion of the lead located outside the sealing portion will be referred to as an outer lead portion.

It should be noted that the semiconductor device PKG5 and semiconductor device PKG6 according to the present embodiment have a structure in which the portion (outer lead portion) of each lead protrudes from the side surface of the sealing portion, and the following explanation is given based on this structure. But, the present embodiment is not limited to this structure. For example, one of or both of the semiconductor device PKG5 and the semiconductor device PKG6 can also adopt a configuration (QFN-type configuration) etc. in which each lead hardly protrudes from the side surface of the sealing portion and apart of each lead is exposed from the lower surface of the sealing portion.

A plane shape of the sealing portion MR5 is substantially a rectangular shape, and the outer lead portions of the plurality of leads LD5 protrude from the four side surfaces of the sealing portion MR5 constituting four sides of the rectangle. The outer lead portion of each lead LD5 is folded and processed so that the lower surface close to an end of the outer lead portion is located substantially on the same plane as the lower surface of the sealing portion MR5. The outer lead portion of the lead LD5 functions as an external connection terminal portion (external terminal) of the semiconductor device PKG5. Suspension leads TL5 are integrally formed respectively at four corners of the rectangle which constitutes the plane shape of the die pad DP5.

The inner lead portions of the plurality of leads LD5 that the semiconductor device PKG5 has, and the plurality of pads PD5 of the semiconductor chip CP5 are electrically connected via the plurality of wires WA5, respectively. Each wire WA5 is sealed in the sealing portion MR5, and is not exposed from the sealing portion MR5.

Subsequently, a configuration of the semiconductor device PKG6 mounted on the control wiring substrate PB2 will be described with reference to FIGS. 27 to 29.

Figure 27:
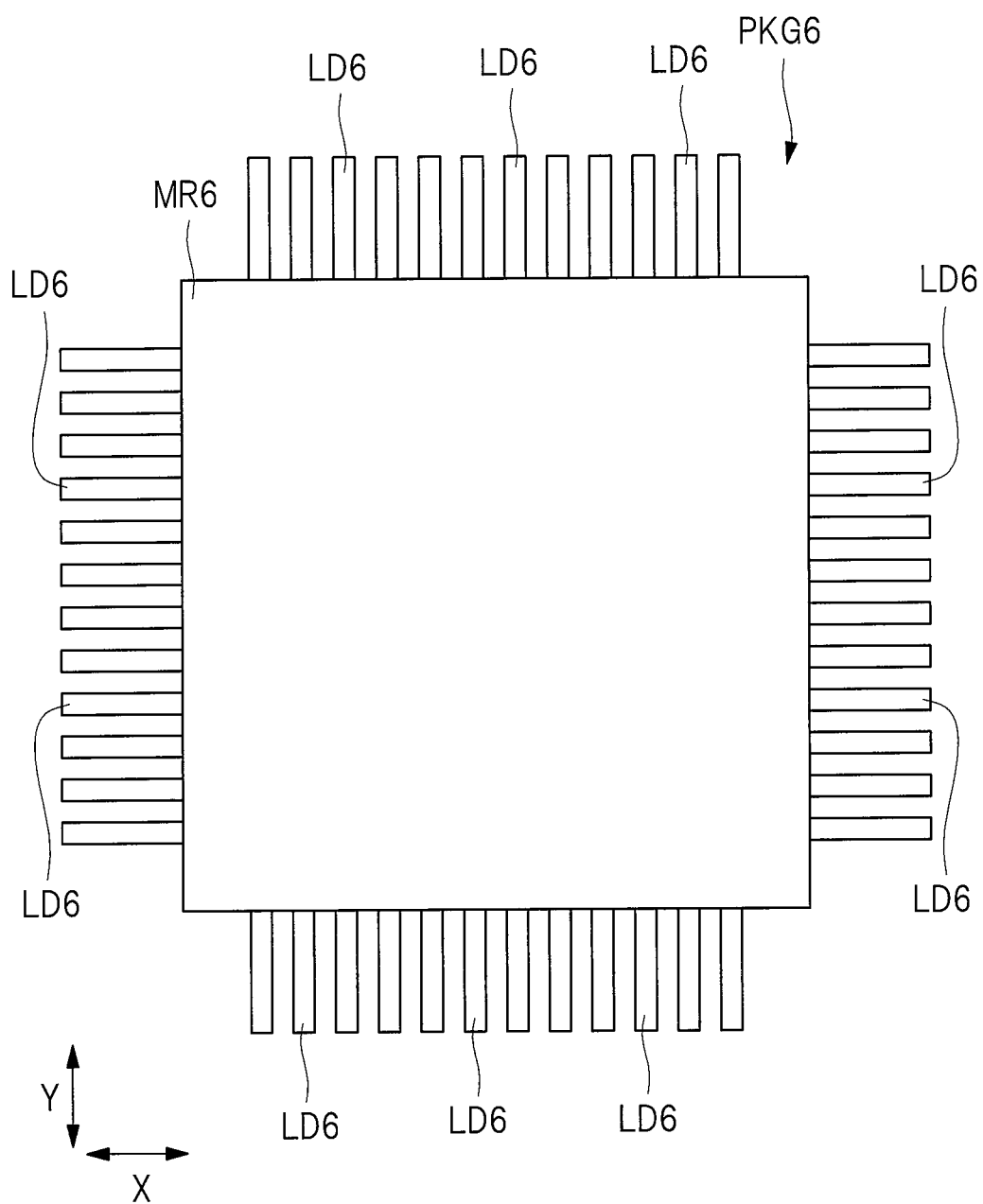
FIG. 27 is a top view of a semiconductor device.
Figure 28:
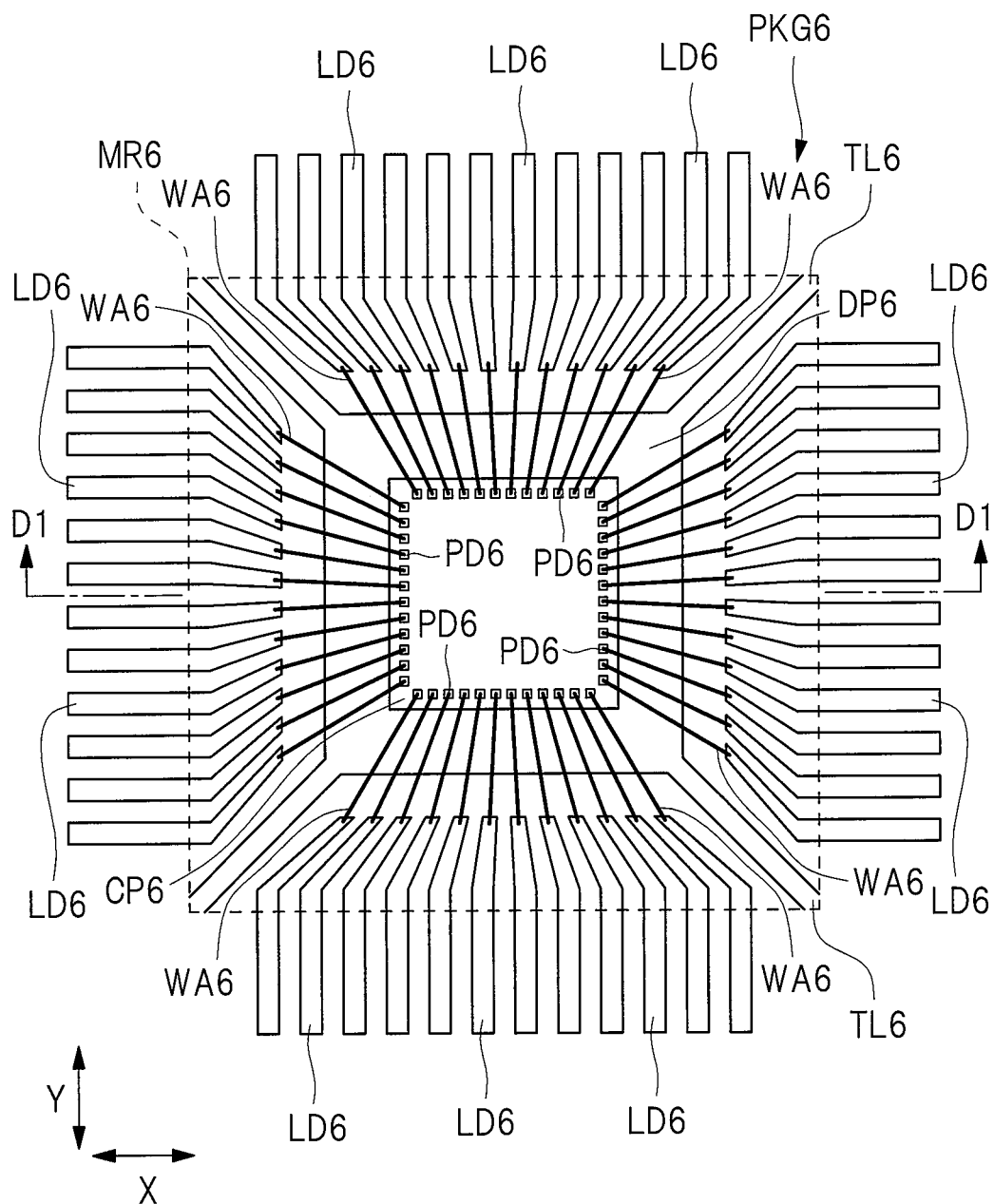
FIG. 28 is a perspective plan view of the device of FIG. 27.

FIG. 27 is a top view of the semiconductor device PKG6, and FIG. 28 is a plan perspective view of the semiconductor device PKG6. FIG. 28 illustrates a plan perspective view on the upper surface side of the semiconductor device PKG6 when seen through the sealing portion MR6, and illustrates an external peripheral position of the sealing portion MR6 with a dotted line. FIG. 29 is a cross-sectional view of the semiconductor device PKG6, and substantially corresponds to a cross-sectional view taken along line D1-D1 of FIG. 28.

Figure 29:
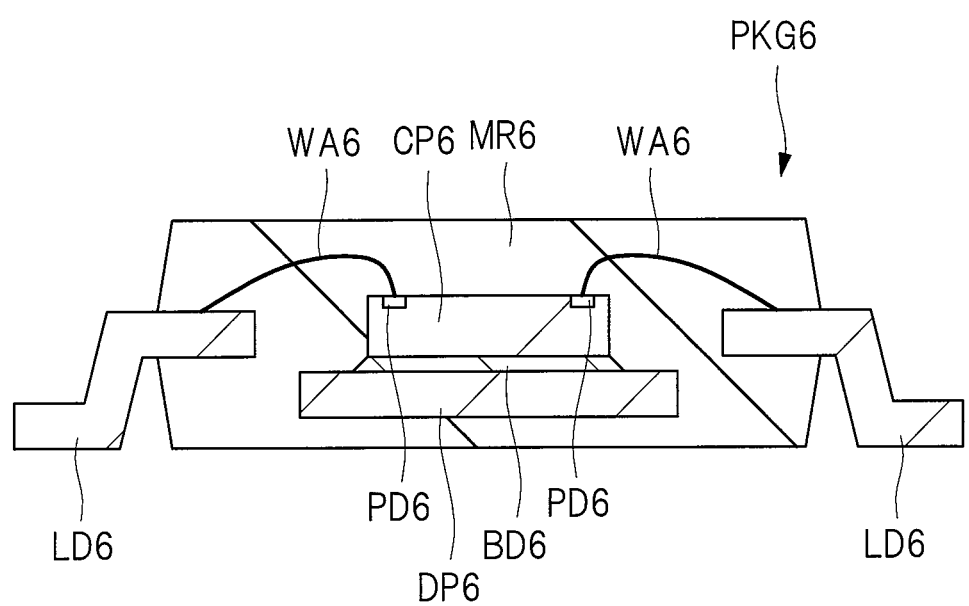
FIG. 29 is a cross-sectional view of the semiconductor device of FIG. 27.

As shown in FIGS. 27 to 29, the semiconductor device PKG6 includes: a die pad (chip mounting portion) DP6; a semiconductor chip CP6 mounted on an upper surface of the die pad DP6; a plurality of wires (bonding wires) WA6; a plurality of leads LD6; and a sealing portion (sealing body portion, sealing body) MR6 for sealing them.

The semiconductor chip CP6 is a semiconductor chip that constitutes the driver circuit unit DR. In the semiconductor chip CP6, a circuit(s) configuring the driver circuit unit DR is formed. On a front surface side of the semiconductor chip CP6, a plurality of pads (bonding pads) PD6 are formed. On the front surface of the semiconductor chip CP6, the plurality of pads PD6 are arranged along an external periphery of the semiconductor chip CP6, i.e., along four sides of the surface of the semiconductor chip CP6. A back surface of the semiconductor chip CP6 is bonded to an upper surface of the die pad DP6 via a bonding material BD6.

In the semiconductor device PKG6, the plurality of leads LD6 are arranged around the semiconductor chip CP6, and therefore are arranged around the die pads DP6. A plane shape of the die pad DP6 is, for example, a rectangle shape. A portion of each of the plurality of leads LD6 is sealed in the sealing portion MR6, and the other part thereof protrudes from a side surface of the sealing portion MR6 outside the sealing portion MR6.

A plane shape of the sealing portion MR6 is substantially a rectangular shape, and outer lead portions of the leads LD6 protrude from the four side surfaces of the sealing portion MR6 constituting the four sides of the rectangle. The outer lead portion of each lead LD6 is folded and processed so that the lower surface close to an end of the outer lead portion is located substantially on the same plane as the lower surface of the sealing portion MR6. The outer lead portion of the lead LD6 functions as an external connection terminal portion (external terminal) of the semiconductor device PKG6. Suspension leads TL6 are integrally formed at four corners of the rectangle which constitutes the plane shape of the die pad DP6.

The inner lead portions of the plurality of leads LD6 that the semiconductor device PKG6 has, and the plurality of pads PD6 of the semiconductor chip CP6 are electrically connected via the plurality of wires WA6, respectively. Each wire WA6 is sealed in the sealing portion MR6, and is not exposed from the sealing portion MR6.

<Regarding Wiring Pattern of Control Wiring Substrate>

Figure 30:
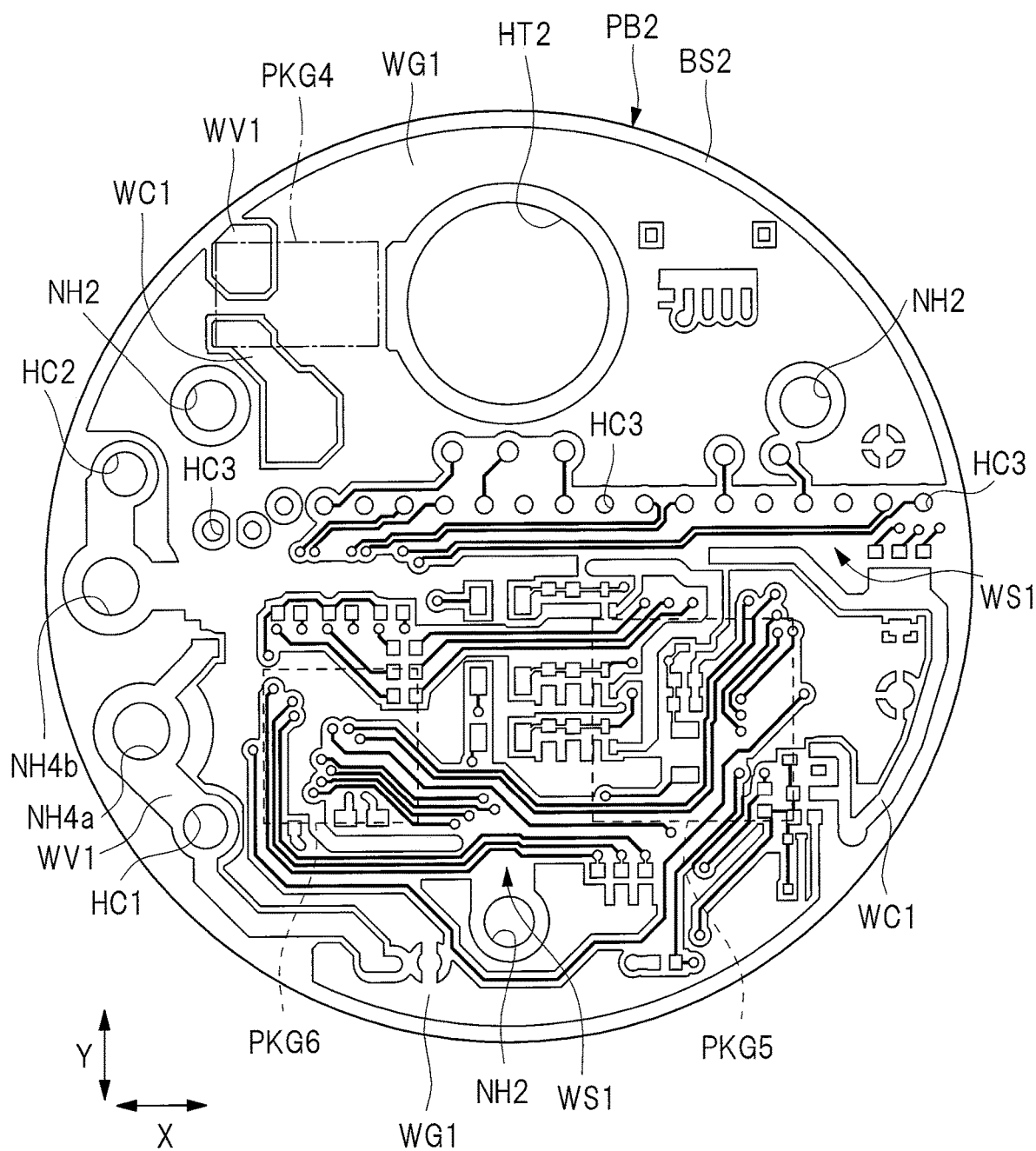
FIG. 30 is a plan perspective view from an upper surface side of a control wiring substrate.
Figure 32:
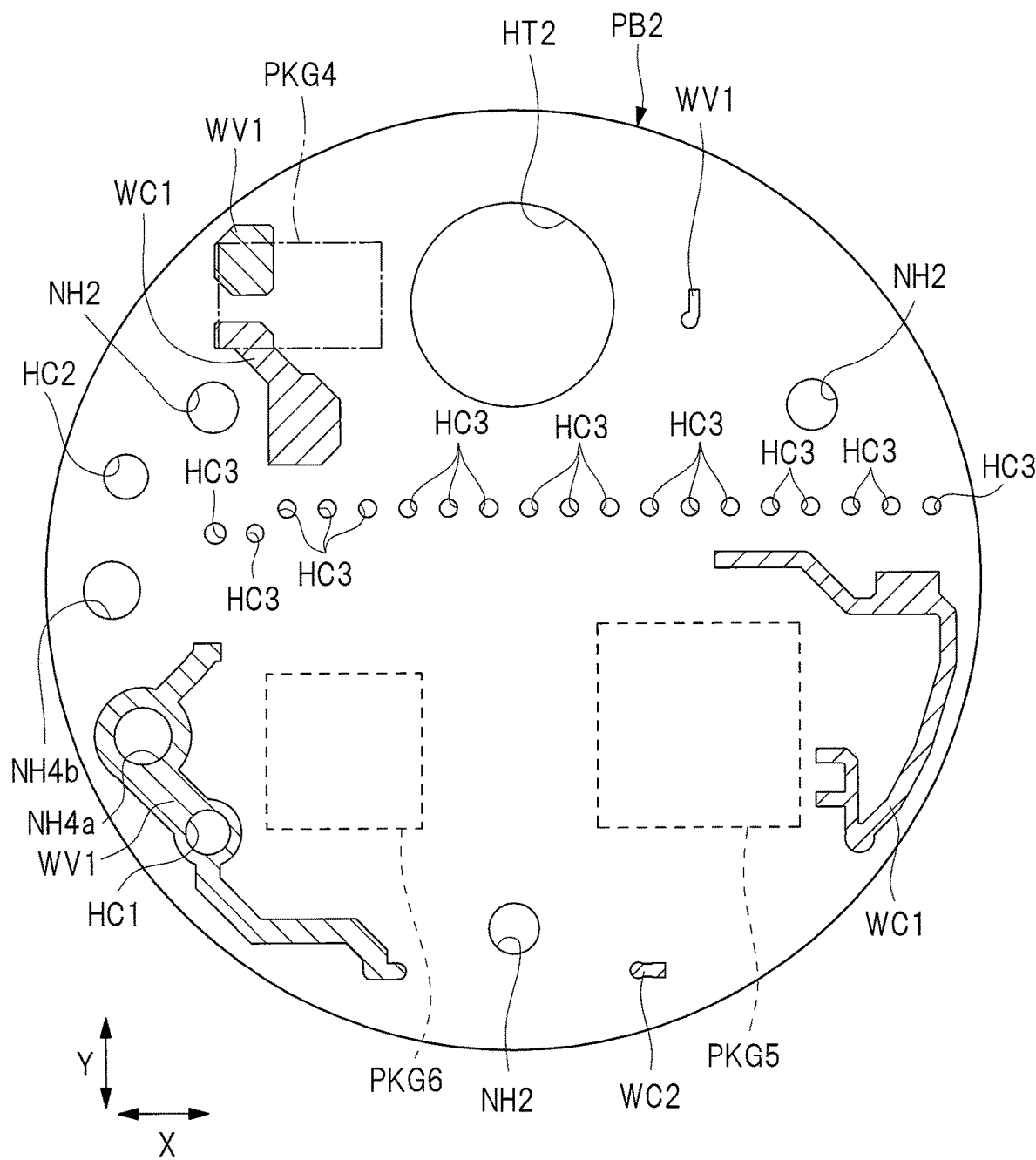
FIG. 32 is a plan perspective view from the upper surface side of the control wiring substrate.
Figure 33:
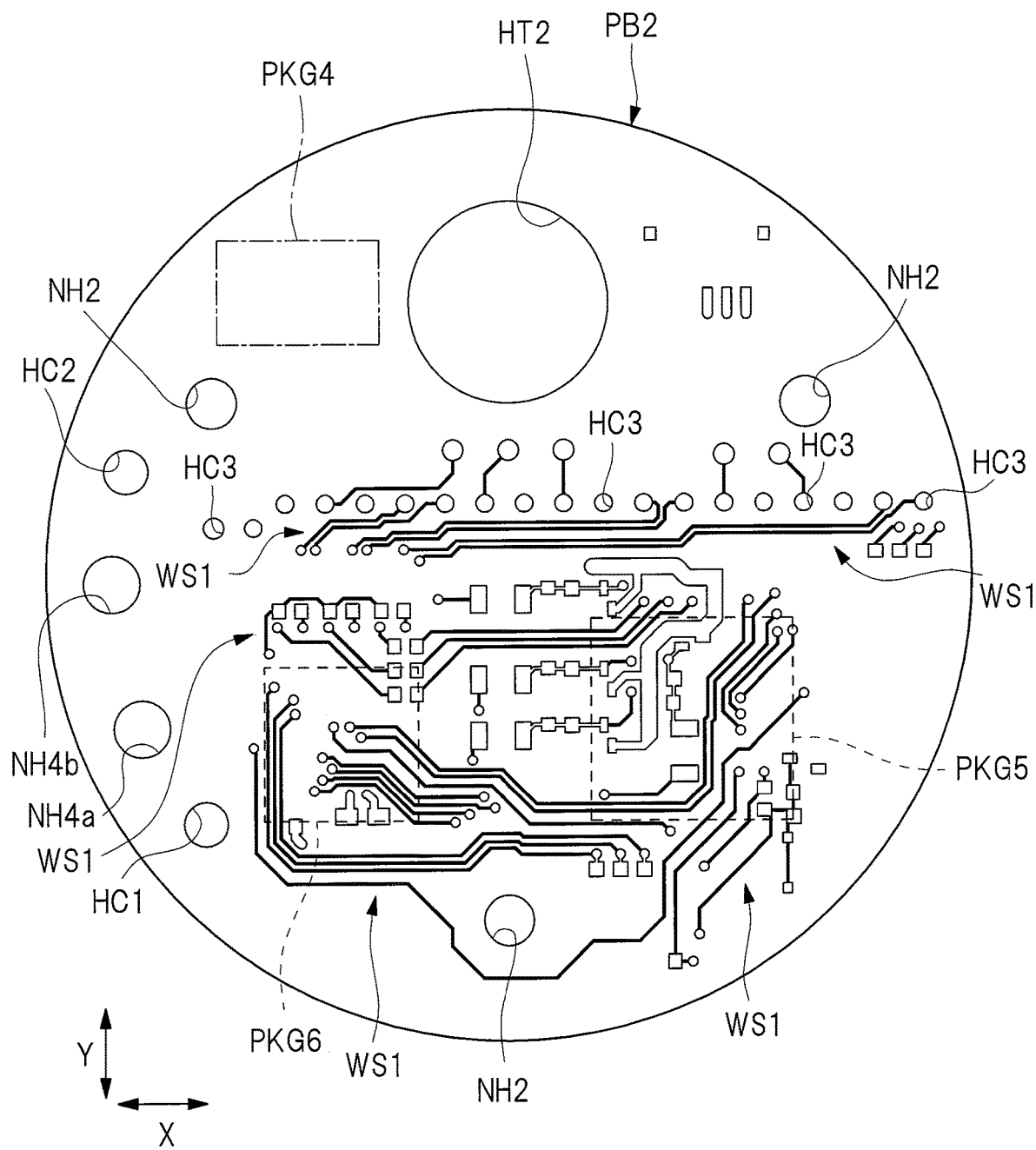
FIG. 33 is a plan perspective view from the upper surface side of the control wiring substrate.
Figure 34:
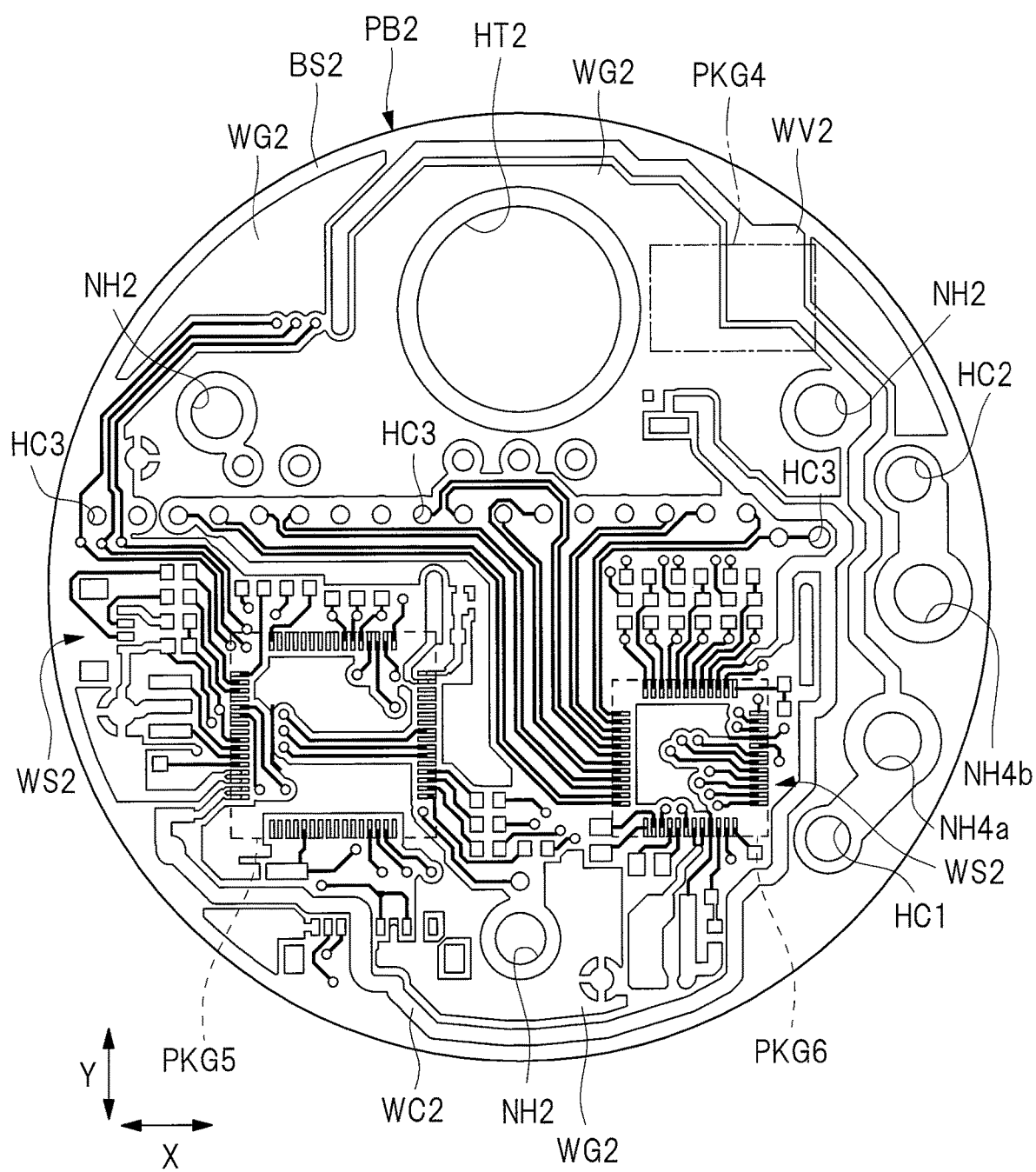
FIG. 34 is a plan perspective view from a lower surface side of the control wiring substrate.

FIGS. 30 to 37 are plan views illustrating the control wiring substrate PB2. Among them, FIG. 30 illustrates a plan perspective view of an upper surface side of the control wiring substrate PB2, and FIG. 34 illustrates a plan perspective view of a lower surface of the control wiring substrate PB2. That is, FIG. 30 corresponds to a view which removes, from the control wiring substrate PB2 of FIG. 10, the semiconductor device PKG4, the screws NG1, NG2a, and NG2b, the cables CB1 and CB2, the power supply connection pins PN1, the ground connection pins PN2, and the signal pins PN3 respectively mounted on the upper surface of the control wiring substrate PB2, and that sees through the resist layer RS2a on the upper surface side of the control wiring substrate PB2. In addition, FIG. 34 corresponds to a view which removes, from the control wiring substrate PB2 of FIG. 11, the semiconductor devices PKG5 and PKG6, the screws NG1, NG2a, and NG2b, the cables CB1 and CB2, the power supply connection pin PN1, the ground connection pin PN2, and the signal pin PN3 respectively mounted on the lower surface of the control wiring substrate PB2, and that sees through the resist layer RS2b on the lower surface side of the control wiring substrate PB2. Therefore, FIG. 30 illustrates the wiring pattern (the wiring pattern on the upper surface of the base material layer BS2, i.e., the wiring pattern formed by the conductive film CD2a) on the upper surface side of the control wiring substrate PB2, and FIG. 34 illustrates the wiring pattern (the wiring pattern on the lower surface of the base material layer BS2, i.e., the wiring pattern formed by the conductive film CD2b) on the lower surface side of the control wiring substrate PB2.

Figure 31:
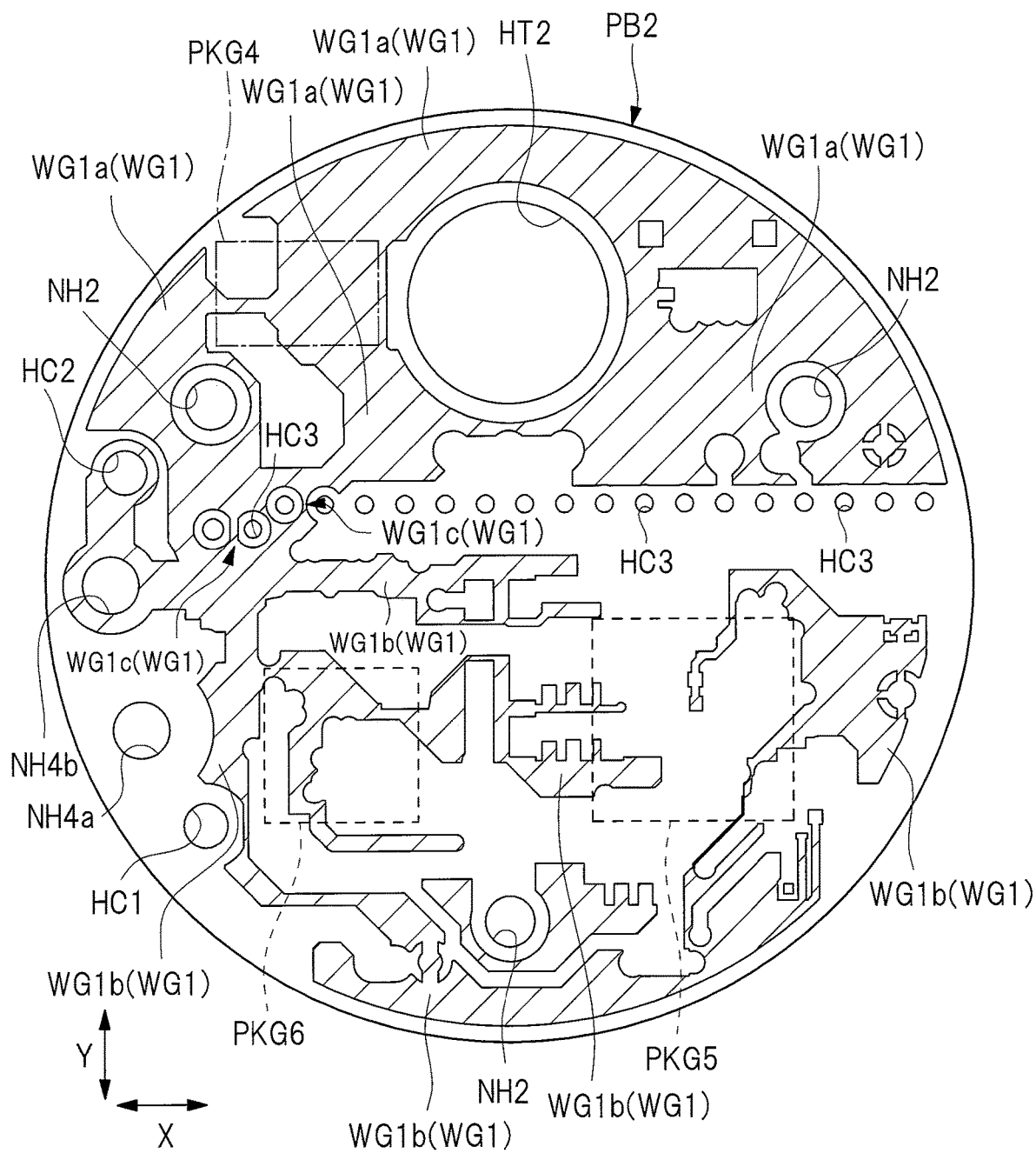
FIG. 31 is a plan perspective view from an upper surface side of the control wiring substrate.
Figure 35:
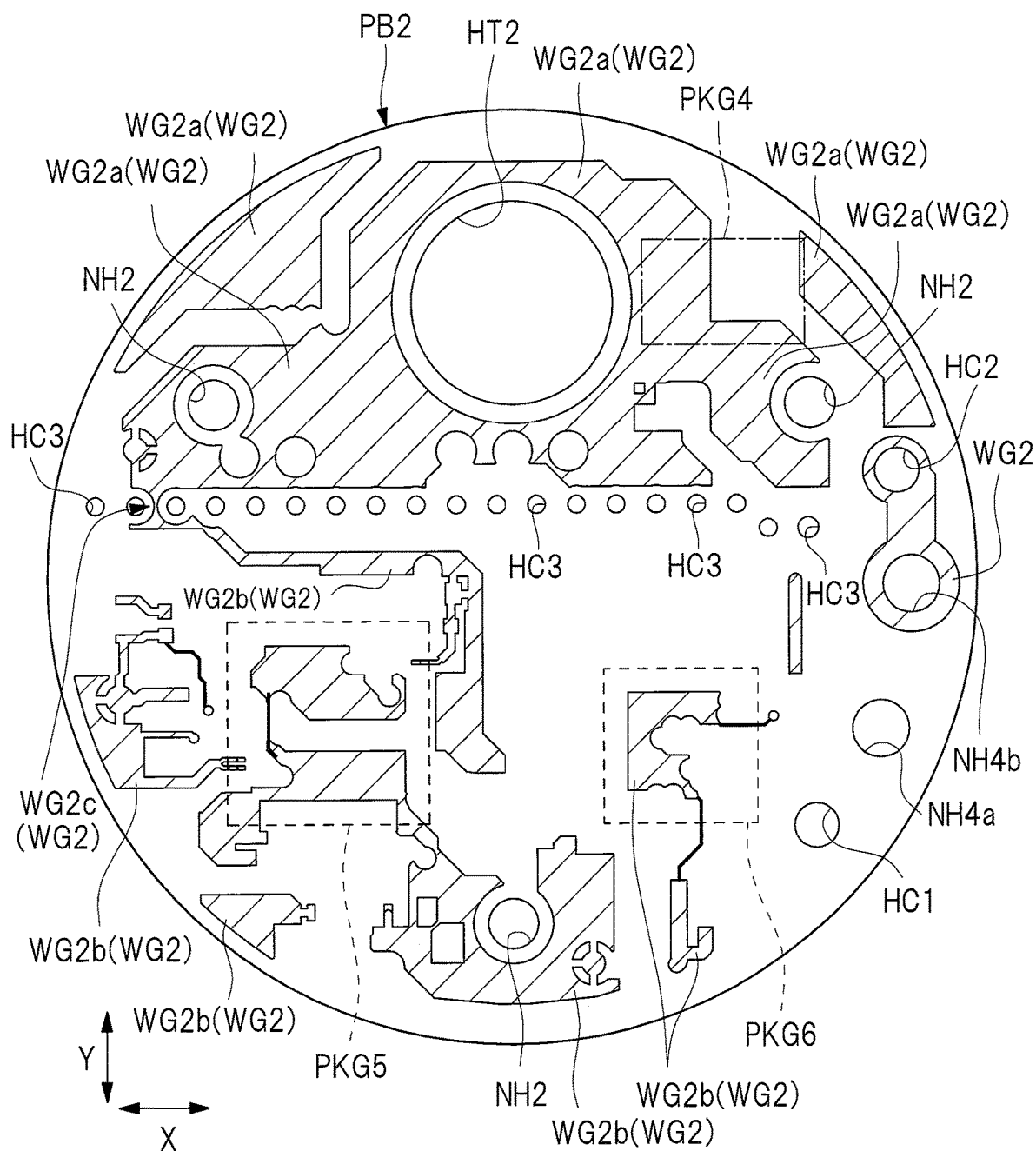
FIG. 35 is a plan perspective view from the lower surface of the control wiring substrate.
Figure 36:
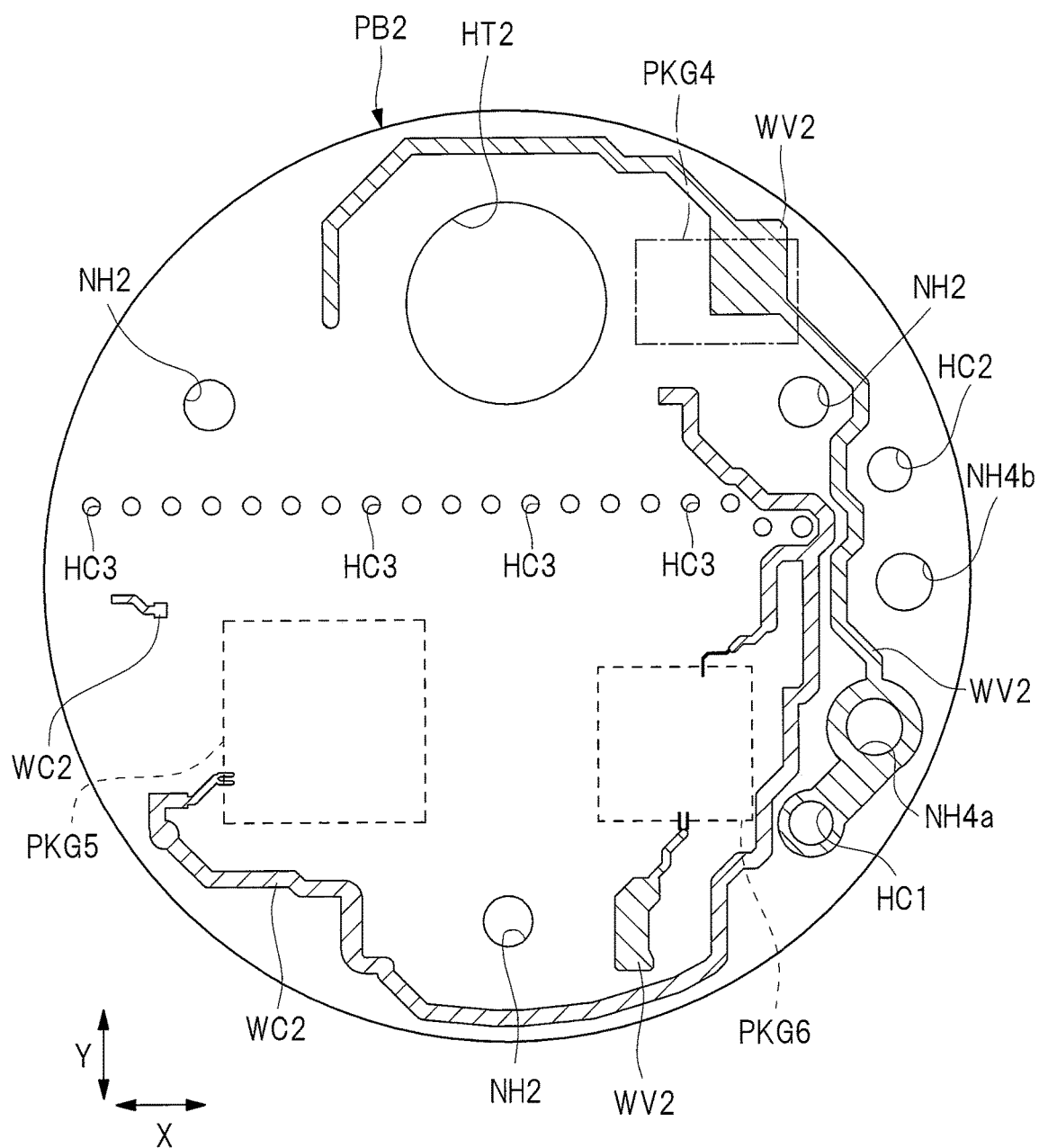
FIG. 36 is a plan perspective view from the lower surface of the control wring substrate.
Figure 37:
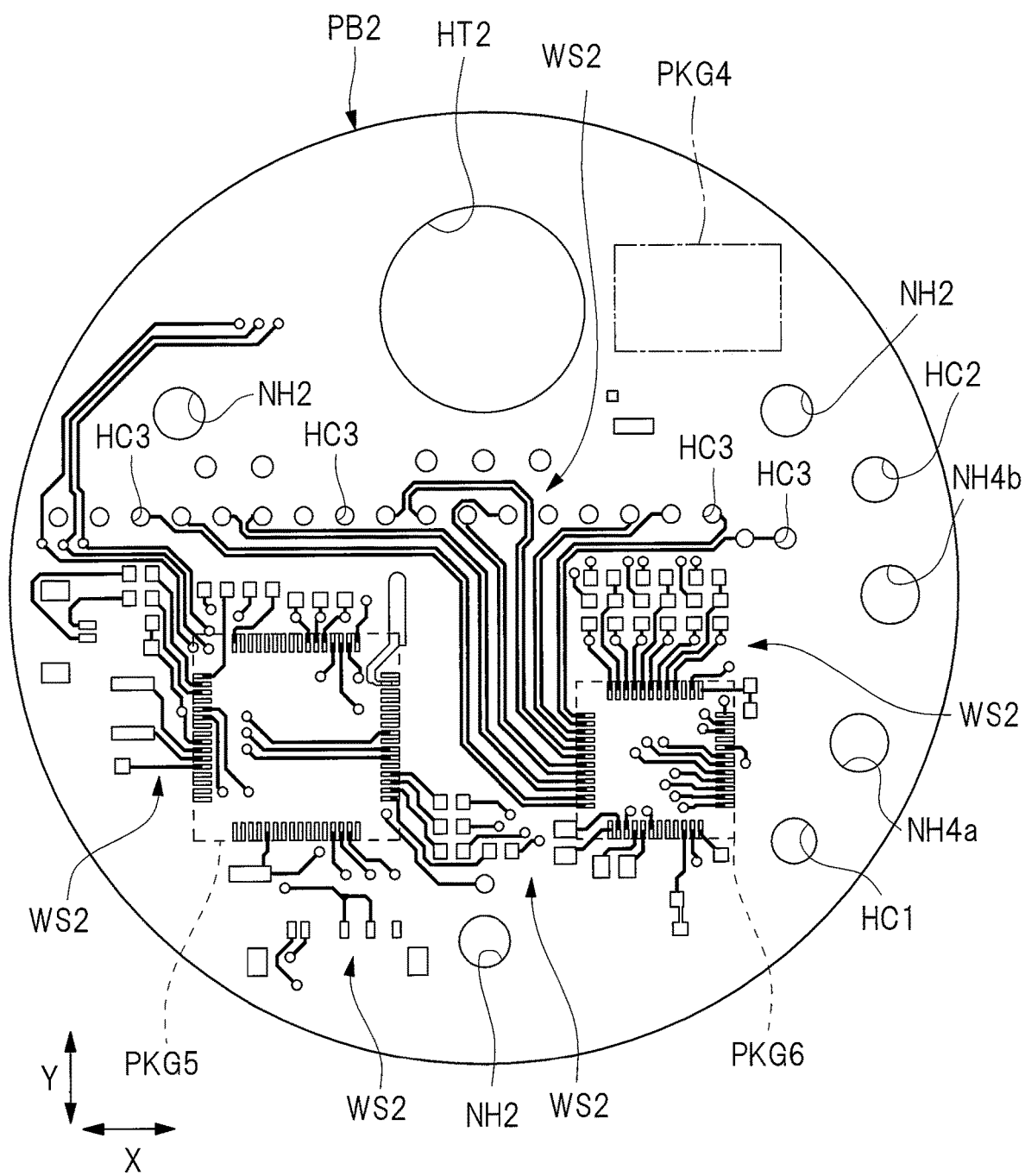
FIG. 37 is a plan perspective view from the lower surface of the control wiring substrate.

In addition, FIGS. 31 to 33 are shown in order to easily understand the wiring pattern shown in FIG. 30. FIGS. 35 to 37 are shown in order to easily understand the wiring pattern shown in FIG. 34. That is, FIG. 31 shows the ground wiring WG1 in the wiring pattern on the upper surface side of the control wiring substrate PB2 as shown in FIG. 30, and does not show and omits other wirings (WC1, WS1, and WV1). FIG. 32 illustrates the power supply wiring WV1 and the power supply wiring WC1 in the wiring pattern on the upper surface side of the control wiring substrate PB2 shown in FIG. 30, and does not show and omits other wirings (WG1 and WS1). FIG. 33 shows the signal wiring WS1 in the wiring pattern on the upper surface side of the control wiring substrate PB2 shown in FIG. 30, and does not show and omits other wirings (WC1, WG1, and WV1). FIG. 35 shows the ground wiring WG2 in the wiring pattern on the lower surface side of the control wiring substrate PB2 shown in FIG. 34, and does not show and omits other wirings (WC2, WS2, and WV2). FIG. 36 shows the power supply wiring WV2 and the power supply wiring WC2 in the wiring pattern on the upper surface side of the control wiring substrate PB2 shown in FIG. 34, and does not show and omits other wirings (WG2 and WS2). FIG. 37 shows the signal wiring WS2 in the wiring pattern on the upper surface side of the control wiring substrate PB2 as shown in FIG. 34, and does not show and omits other wirings (WC2, WG2, and WV2). In order to make the drawings easy to see, although the drawings are plan views, the ground wiring WG1 in FIG. 31 is hatched, and the power supply wiring WV1 and the power supply wiring WC1 in FIG. 32 are hatched, the ground wiring WG2 in FIG. 35 is hatched, and the power supply wiring WV2 and the power supply wiring WC2 in FIG. 36 are hatched.

Which part in the wiring pattern on the upper surface side of the control wiring substrate PB2 as shown in FIG. 30 corresponds to each of the ground wiring WG1, the power supply wiring WV1, the power supply wiring WC1, and the signal wiring WS1 can be understood by comparing FIG. 30 with FIGS. 31 to 33. Which part in the wiring pattern on the lower surface of the control wiring substrate PB2 as shown in FIG. 34 corresponds to each of the ground wiring WG2, the power supply wiring WV2, the power supply wiring WC2, and the signal wiring WS2 can be understood by comparing FIG. 34 with FIGS. 35 to 37. In FIGS. 30 to 37, the plane position where the semiconductor device PKG4 is mounted is transparently indicated by a dash-single-dot line, and the plane positions where the semiconductor device PKG5 and the semiconductor device PKG6 are mounted are indicated by a dotted line. However, as described above, the semiconductor device PKG4 is mounted on the upper surface side of the control wiring substrate PB2, and the semiconductor devices PKG5 and PKG6 are mounted on the lower surface side of the control wiring substrate PB2.

Incidentally, in each of the power wiring substrate PB1 and the control wiring substrate PB2, a principal surface on a side closer to the motor MOT corresponds to the lower surface, and the principal surface located opposite the lower surface corresponds to the upper surface. Therefore, in the power wiring substrate PB1, the principal surface on a side facing the motor MOT corresponds to the lower surface of the power wiring substrate PB1, and the principal surface on a side facing the control wiring substrate PB2 corresponds to the upper surface of the power wiring substrate PB1. In the control wiring substrate PB2, the principal surface on a side facing the power wiring substrate PB1 corresponds to the lower surface of the control wiring substrate PB2.

As shown in the FIGS. 10, 11 and FIGS. 30 to 37, the plane shape of the control wiring substrate PB2 is a circular shape. The wiring pattern is formed on each of the upper surface and the lower surface of the control wiring substrate PB2. The semiconductor device PKG4 is mounted at the upper surface side of the control wiring substrate PB2, and the semiconductor device PKG5 and the semiconductor device PKG6 are mounted at positions (plane positions) different from each other on the lower surface of the control wiring substrate PB2.

More specifically, the power supply wiring (conductive body pattern, power supply pattern) WV1, the ground wiring (conductive body pattern, ground pattern) WG1, the power supply wiring (conductive body pattern, power supply pattern) WC1, and the signal wiring (conductive body pattern, wiring pattern) WS1 are formed on the upper surface side of the control wiring substrate PB2. The power supply wiring (conductive body pattern, power supply pattern) WV2, the ground wiring (conductive body pattern, ground pattern) WG2, the power supply wiring (conductive body pattern, power supply pattern) WC2, and the signal wiring (conductive body pattern, wiring pattern) WS2 are formed on the lower surface of the control wiring substrate PB2. The wirings (WV1, WG1, WC1, and WS1) on the upper surface side of the control wiring substrate PB2 are formed by a conductive film (corresponding to the conductive film CD2a) formed on the upper surface of the base material layer BS2 constituting the control wiring substrate PB2. The wirings (WV2, WG2, WC2, and WS2) on the lower surface side of the control wiring substrate PB2 are formed by a conductive film (corresponding to the conductive film CD2b) formed on the lower surface of the base material layer BS2 constituting the control wiring substrate PB2.

The power supply wiring WV1 and the power supply wiring WV2 are wirings to which the power supply potential VIN is supplied. The power supply wiring WV1 and the power supply wiring WV2 are electrically connected to the power supply cable CB1, so that the power supply potential VIN is supplied from the power supply cable CB1 to the power supply wiring WV1 and the power supply wiring WV2.

The power supply wiring WV1 formed on the upper surface side of the control wiring substrate PB2, and the power supply wiring WV2 formed on the lower surface side of the control wiring substrate PB2 are electrically connected, as the need arises, through via portions (VH) provided at positions overlapping both of the power supply wirings WV1 and WV2 in the control wiring substrate PB2 in the plan view.

Incidentally, each via portion (VH) of the control wiring substrate PB2 is constituted by: a hole penetrating through the base material layer BS2 of the control wiring substrate PB2; and a conductive body portion embedded in the hole, and is shown in FIGS. 38 to 43 etc. explained below. The via portion (VH) of the control wiring substrate PB2 functions as a conductor portion (embedded conductor portion, via wiring) for electrically connecting the wirings on the upper surface side of the control wiring substrate PB2 and the wiring(s) on the lower surface side of the control wiring substrate PB2.

The ground wiring WG1 and the ground wiring WG2 are wirings to which the ground potential GND is supplied. The ground wiring WG1 and the ground wiring WG2 are electrically connected to the ground cable CB2 so that the ground potential GND is supplied from the ground cable CB2 to the ground wiring WG1 and the ground wiring WG2.

The ground wiring WG1 formed on the upper surface side of the control wiring substrate PB2, and the ground wiring WG2 formed on the lower surface side of the control wiring substrate PB2 are electrically connected, as the need arises, through via portions (VH) provided at positions overlapping both of the ground wirings WG1 and WG2 in the control wiring substrate PB2 in the plan view.

The power supply wiring WC1 and the power supply wiring WC2 are wirings to which the voltage V1 generated by the regulator RE (i.e., the semiconductor device PKG4 or the semiconductor chip CP4) is supplied. The power supply wirings WC1 and WC2 are electrically connected to the lead LD4b of semiconductor device PKG4 mounted on the upper surface of the control wiring substrate PB2. Therefore, the voltage V1 generated by the regulator circuit (RE) formed in the semiconductor chip CP4 is outputted from the lead LD4b of the semiconductor device PKG4 to the power supply wirings WC1 and WC2 of the control wiring substrate PB2.

The power supply wiring WC1 formed on the upper surface side of the control wiring substrate PB2, and the power supply wiring WC2 formed on the lower surface side of the control wiring substrate PB2 are electrically connected, as the need arises, through via portions (VH) provided at positions overlapping both of the power supply wirings WC1 and WC2 in the control wiring substrate PB2 in the plan view.

The signal wiring WS1 and the signal wiring WS2 mainly include: a wiring for electrically connecting the semiconductor device PKG5 and the semiconductor device PKG6; and a wiring for electrically connecting the semiconductor device PKG6 and the plurality of signal pins PN3.

The signal wiring WS1 formed on the upper surface side of the control wiring substrate PB2, and the signal wiring WS2 formed on the lower surface side of the control wiring substrate PB2 are electrically connected, as the need arises, through via portions (VH) provided at positions overlapping both of the signal wirings WS1 and WS2 in the control wiring substrate PB2 in the plan view.

Subsequently, structures for implementing the semiconductor devices PKG4, PKG5, and PKG6 onto the control wiring substrate PB2 will be described with reference to FIGS. 10, 11, and FIGS. 30 to 43.

Figure 38:
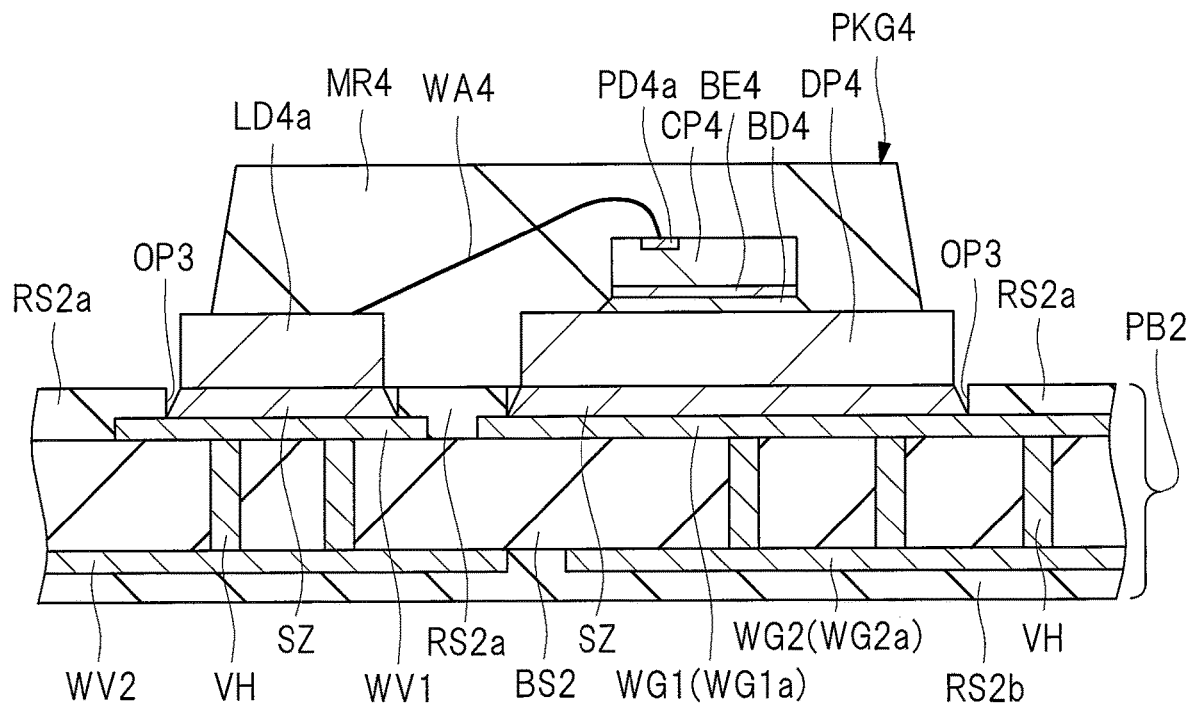
FIG. 38 is a cross-sectional view of a structure in which the semiconductor device of FIG. 19 is mounted on an upper surface of the control wiring substrate.
Figure 39:
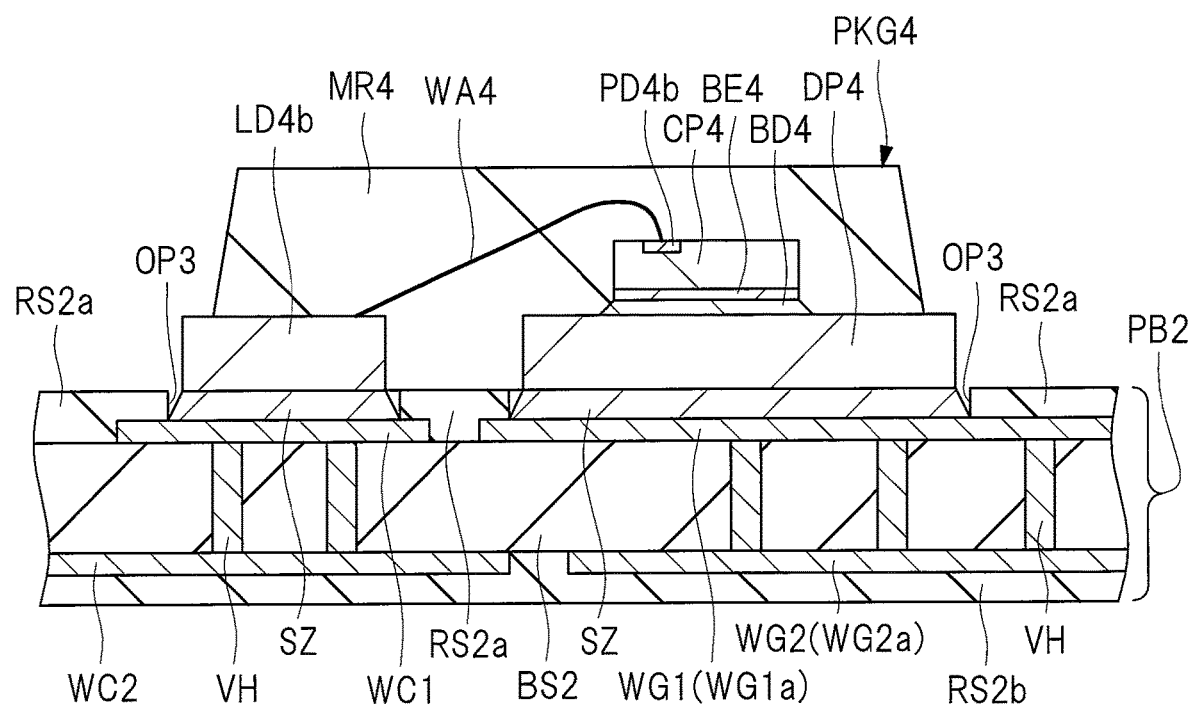
FIG. 39 is a cross-sectional view of the structure in which the semiconductor device of FIG. 19 is mounted on the upper surface of the control wiring substrate.
Figure 40:
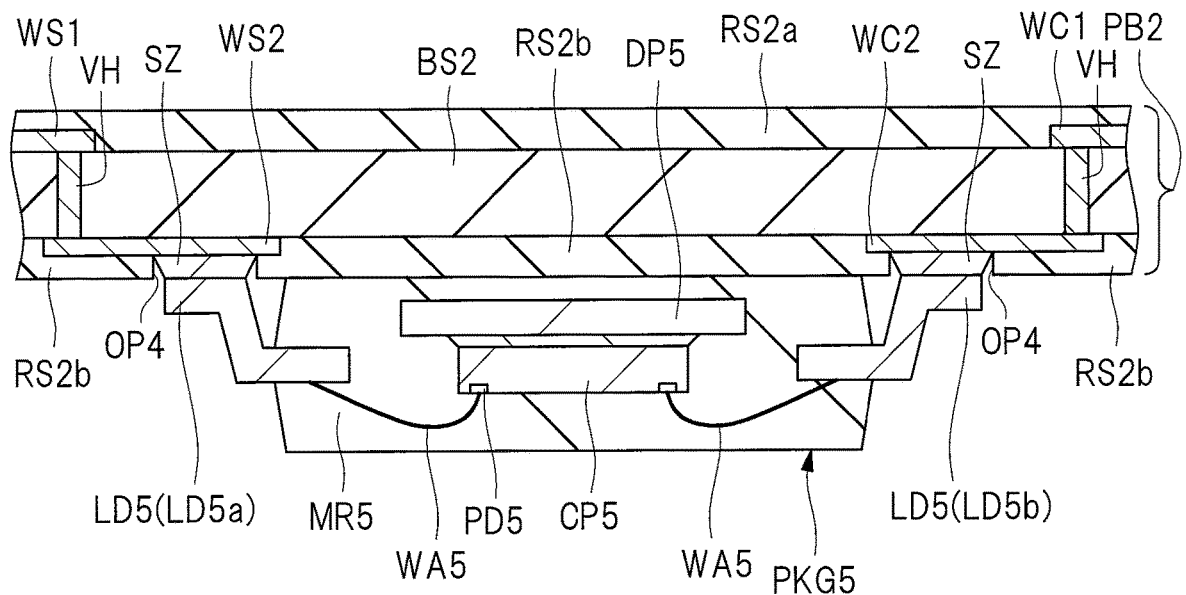
FIG. 40 is a cross-sectional view of a structure in which the semiconductor device of FIG. 24 is mounted on the lower surface of the control wiring substrate.
Figure 41:
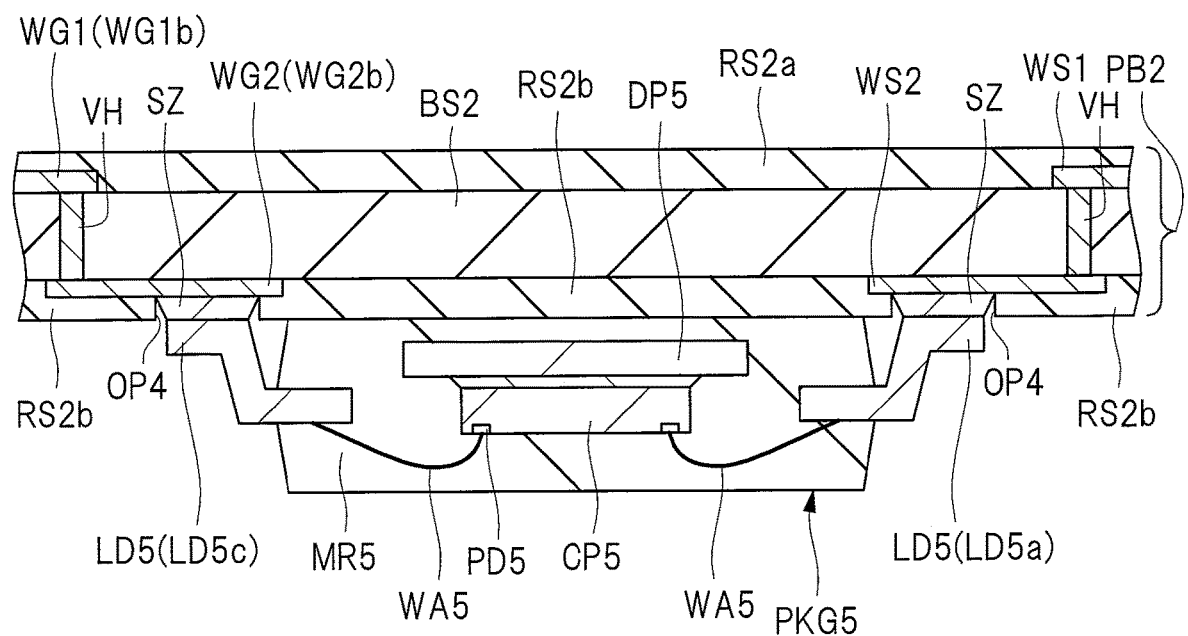
FIG. 41 is a cross sectional view of the structure in which the semiconductor device of FIG. 24 is mounted on the lower surface of the control wiring substrate.
Figure 42:
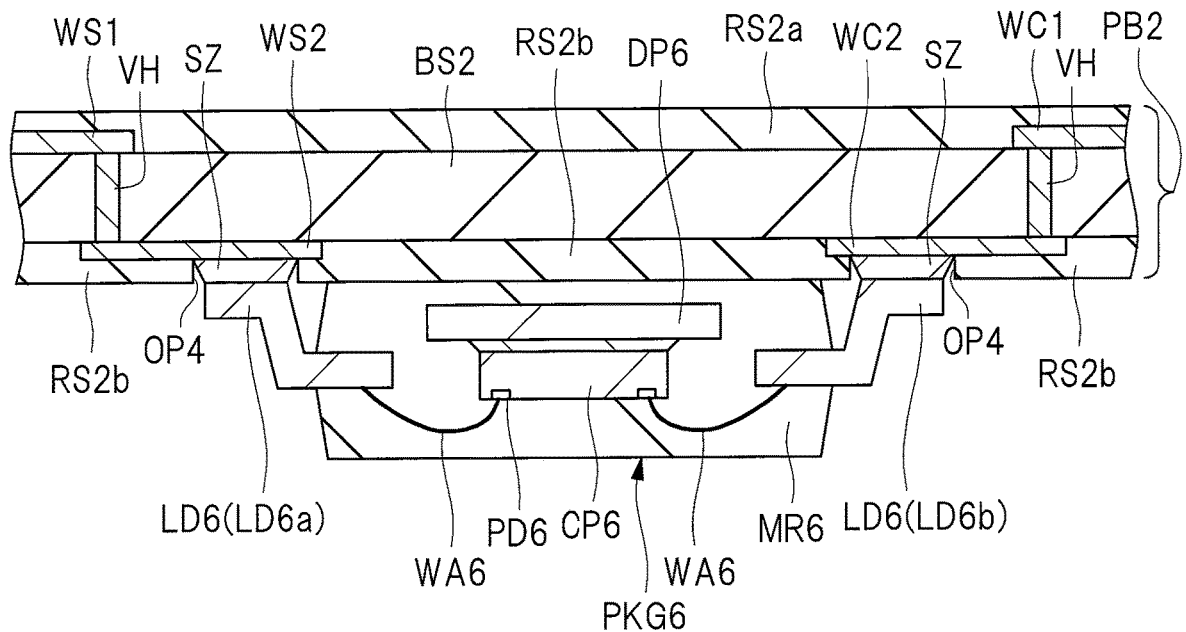
FIG. 42 is a cross-sectional view of a structure in which the semiconductor device of FIG. 27 is mounted on the lower surface of the control wiring substrate.
Figure 43:
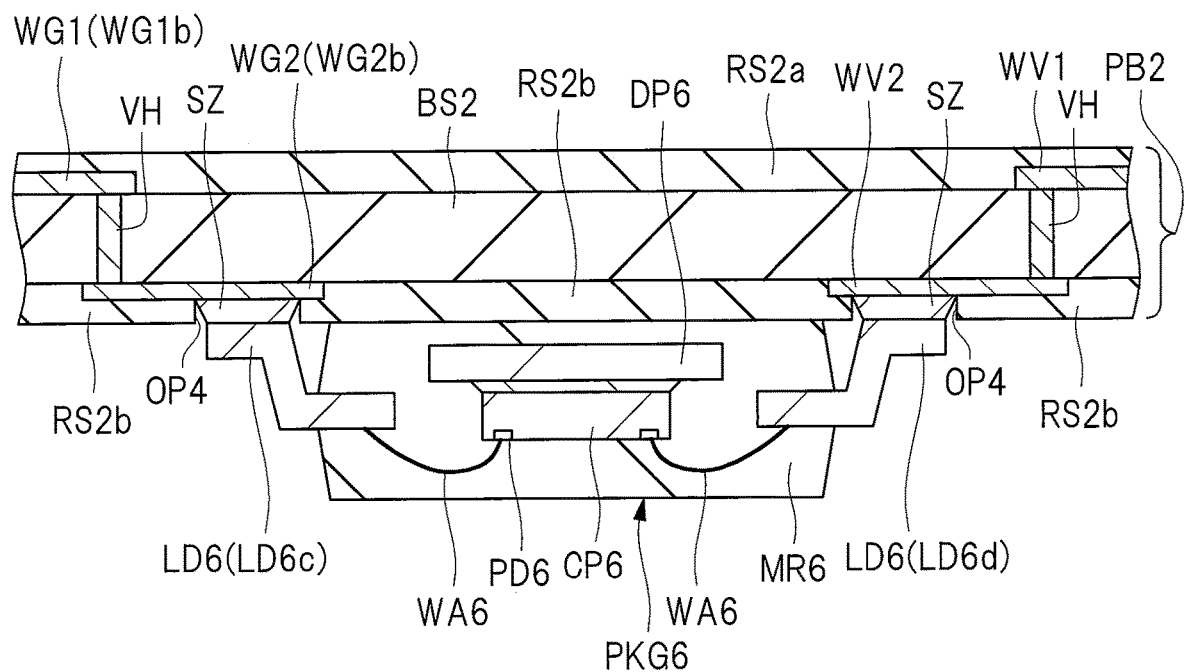
FIG. 43 is a cross-sectional view of the structure in which the semiconductor device of FIG. 27 is mounted on the lower surface of the control wiring substrate.

FIGS. 38 and 39 are cross-sectional views of a structure in which the semiconductor device PKG4 is mounted (implemented) on the upper surface of the control wiring substrate PB2. FIGS. 40 and 41 are cross-sectional views of a structure in which the semiconductor device PKG5 is mounted (implemented) on the lower surface of the control wiring substrate PB2. FIGS. 42 and 43 are cross-sectional views of a structure in which the semiconductor device PKG6 is mounted (implemented) on the lower surface of the control wiring substrate PB2. Incidentally, FIG. 38 shows a cross-section corresponding to the FIG. 22, and FIG. 39 shows a cross-section corresponding to the FIG. 23. FIGS. 40 and 41 show cross-sections different from each other in the semiconductor device PKG5 mounted on the lower surface of the control wiring substrate PB2. FIGS. 42 and 43 show cross-sections different from each other in the semiconductor device PKG6 mounted on the lower surface of the control wiring substrate PB2.

In the control wiring substrate PB2, the wirings (WC1, WG1, WS1, and WV1) formed on the upper surface side are covered with the resist layer RS2a. The wirings (WC2, WG2, WS2, and WV2) formed on the lower surface side are covered with the resist layer RS2b. However, in the control wiring substrate PB2, connection units of the wirings (WC1, WG1, WS1, WV1, WC2, WG2, WS2, and WV2) with the terminals of the electronic components (the semiconductor devices PKG4, PKG5, and PKG6 in this case) are exposed from the resist layers RS2a and RS2b (an opening portion OP3 of the resist layer RS2a and an opening portion OP3 of the resist layer RS2b). Therefore, the terminals of the electronic components mounted on the control wiring substrate PB2 (the semiconductor devices PKG4, PKG5, and PKG6 in this case) can be electrically connected to the wirings (WC1, WG1, WS1, WV1, WC2, WG2, WS2, and WV2) of the control wiring substrate PB2 via a conductive bonding material (for example, solder).

First, the implementation structure of the semiconductor device PKG4 will be explained.

As can be understood from FIG. 38, FIG. 39, and the like, the die pad DP4 of the semiconductor device PKG4 overlaps, in the plan view, the ground wiring WG1 formed on the upper surface side of the control wiring substrate PB2, and is joined to and electrically connected to the ground wiring WG1 via a conductive bonding material SZ. The conductive bonding material SZ can use, for example, solder. The lead LD4a of the semiconductor device PKG4 overlaps, in the plan view, the power supply wiring WV1 formed on the upper surface side of the control wiring substrate PB2, and is joined to and electrically connected to the power supply wiring WV1 via a conductive bonding material SZ. The lead LD4b of the semiconductor device PKG4 overlaps, in the plan view, the power supply wiring WC1 formed on the upper surface side of the control wiring substrate PB2, and is joined to and electrically connected to the power supply wiring WC1 via a conductive bonding material SZ.

Therefore, the back surface electrode BE4 of the semiconductor chip CP4 incorporated in the semiconductor device PKG4 is electrically connected to the ground wiring WG1 via the die pad DP4 and the bonding material SZ. Therefore, the ground potential GND supplied from the ground cable CB2 to the ground wirings WG1 and WG2 of the control wiring substrate PB2 is supplied from the ground wiring WG1 to the die pad DP4 of the semiconductor device PKG4, and is further supplied to the back surface electrode BE4 of the semiconductor chip CP4 in the semiconductor device PKG4.

The pad PD4a of the semiconductor chip CP4 incorporated in the semiconductor device PKG4 is electrically connected to the power supply wiring WV1 via the wire WA4, the lead LD4a, and the bonding material SZ. Consequently, the power supply potential VIN supplied from the power supply cable CB1 to the power supply wirings WV1 and WV2 of the control wiring substrate PB2 is supplied from the power supply wiring WV1 to the lead LD4a of the semiconductor device PKG4, and is further inputted into the pad PD4a of the semiconductor chip CP4 in the semiconductor device PKG4.

The pad PD4b of the semiconductor chip CP4 incorporated in the semiconductor device PKG4 is electrically connected to the power supply wiring WC1 via the wire WA4, the lead LD4b, and the bonding material SZ, and is further electrically connected via the power supply wirings WC1 and WC2 to a lead (LD5b) for input of the voltage V1 in the semiconductor device PKG5 and/or a lead (LD6b) for input of the voltage V1 in the semiconductor device PKG6. The power supply potential VIN inputted from the pad PD4a into the semiconductor chip CP4 is converted into the voltage V1 by the regulator circuit (RE) formed in the semiconductor chip CP4, and the converted voltage V1 is outputted from the pad PD4b of the semiconductor chip CP4. The voltage V1 outputted from the pad PD4b of the semiconductor chip CP4 is outputted from the lead LD4b to the power supply wiring WC1 of the control wiring substrate PB2, and is supplied to the semiconductor devices PKG5 and PKG6 via the power supply wirings WC1 and WC2.

Subsequently, the implementation structure of the semiconductor device PKG5 will be explained.

As can be understood from FIG. 40, FIG. 41, and the like, each lead LD5 of the semiconductor device PKG5 overlaps, in the plan view, the wiring(s) formed on the lower surface side of the control wiring substrate PB2, and is joined to and electrically connected to the wiring via a conductive bonding material SZ (for example, solder). The semiconductor device PKG5 includes the plurality of leads LD5. The plurality of leads LD5 include: the leads LD5a connected to the signal wirings WS2; the lead LD5b connected to the power supply wiring WC2; and the lead LD5c connected to the ground wiring WG2. The leads LD5a connected to the signal wiring WS2 are the largest in umber among them. The semiconductor device PKG5 may not have any lead connected to the power supply wiring WV2.

Therefore, each pad PD5 of the semiconductor chip CP5 incorporated in the semiconductor device PKG5 is electrically connected to any one of the signal wirings WS2, the power supply wiring WC2, or the ground wiring WG2 via the wire WA5, the lead LD5, and the bonding material SZ.

The leads LD5a of the semiconductor device PKG5 are electrically connected to the leads LD6 (LD6a) of the semiconductor device PKG6 via the signal wirings WS1 and WS2. Therefore, signals are transmitted between the semiconductor device PKG5 (semiconductor chip CP5) and the semiconductor device PKG6 (semiconductor chip CP6) via the signal wirings WS1 and WS2. The leads LD5b of the semiconductor device PKG5 are electrically connected to the leads LD4b of the semiconductor device PKG4 via the power supply wirings WC1 and WC2. Therefore, the voltage V1 outputted from the leads LD4b of the semiconductor device PKG4 is supplied to the leads LD5b of the semiconductor device PKG5 via the power supply wirings WC1 and WC2, so that the voltage V1 is supplied to the semiconductor chip CP5 (control circuit unit CT) in the semiconductor device PKG5. The ground potential GND is supplied from the ground cable CB2 to the leads LD5c of the semiconductor device PKG5 via the ground wirings WG1 and WG2, so that the ground potential GND is supplied to the semiconductor chip CP5 in the semiconductor device PKG5.

Subsequently, the implementation structure of the semiconductor device PKG6 will be described.

As can be understood from FIG. 42, FIG. 43, and the like, the respective leads LD6 of the semiconductor device PKG6 overlap the wirings formed on the lower surface side of the control wiring substrate PB2 in the plan view, and are joined to and electrically connected to the wirings via the conductive bonding material SZ.

The semiconductor device PKG6 includes a plurality of leads LD6. The plurality of leads LD6 include: the leads LD6a connected to the signal wirings WS2; the leads LD6b connected to the power supply wiring WC2; the leads LD6c connected to the ground wiring WG2; and the leads LD6d connected to the power supply wiring WV2. The leads LD6a connected to the signal wiring WS2 are the largest in number among them.

Therefore, each pad PD6 of the semiconductor chip CP6 incorporated in the semiconductor device PKG6 is electrically connected to anyone of the signal wiring WS2, the power supply wiring WC2, the ground wiring WG2, or the power supply wiring WV2 via the wire WA6, the lead LD6, and the bonding material SZ.

The leads LD6a of the semiconductor device PKG6 are electrically connected to the leads LD5 (LD5a) of the semiconductor device PKG5 or the signal pins PN3 via the signal wirings WS1 and WS2. Therefore, signals are transmitted via the signal wirings WS1 and WS2 between the semiconductor device PKG5 (semiconductor chip CP5) and the semiconductor device PKG6 (semiconductor chip CP6) and between the semiconductor device PKG6 (semiconductor chip CP6) and the signal pins PN3. The leads LD6b of the semiconductor device PKG6 are electrically connected to the leads LD4b of the semiconductor device PKG4 via the power supply wirings WC1 and WC2. Therefore, the voltage V1 outputted from the leads LD4b of the semiconductor device PKG4 is supplied to the leads LD6b of the semiconductor device PKG6 via power supply wirings WC1 and WC2, so that the voltage V1 is supplied to the semiconductor chip CP6 (driver circuit unit DR) in the semiconductor device PKG6. The ground potential GND is supplied from the ground cable CB2 to the leads LD6c of the semiconductor device PKG6 via the ground wirings WG1 and WG2, so that the ground potential GND is supplied to the semiconductor chip CP6 in the semiconductor device PKG6. The power supply potential VIN is supplied from the power supply cable CB1 to the leads LD6d of the semiconductor device PKG6 via the power supply wirings WV1 and WV2, so that the power supply potential VIN is supplied to the semiconductor chip CP6 in the semiconductor device PKG6.

<Regarding Main Features and Effects>

The electronic device according to the present embodiment includes: the power wiring substrate PB1 (first wiring substrate) ; the control wiring substrate PB2 (second wiring substrate) opposed to the power wiring substrate PB1; and a connection member(s) electrically connecting the power wiring substrate PB1 and the control wiring substrate PB2. The signal pin PN3 is preferably used as the connection member for electrically connecting the power wiring substrate PB1 and the control wiring substrate PB2. The control wiring substrate PB2 includes the plurality of holes HC3 (first hole portions) each of which a connection member (the signal pin PN3 in this case) electrically connecting the power wiring substrate PB1 and the control wiring substrate PB2 is inserted through.

The electronic device according to the present embodiment further includes: the semiconductor devices PKG1, PKG2, and PKG3 (first semiconductor device) each having power transistor for switching (the power MOSFET in this case); and the semiconductor device PKG6 (second semiconductor device) having the driver circuit unit DR (driving circuit) driving the semiconductor devices PKG1, PKG2, and PKG3. The electronic device according to the present embodiment further includes the semiconductor device PKG4 (third semiconductor device) having the regulator RE (voltage generation circuit) for converting, into the voltage V1 (second power supply voltage), the power supply potential VIN (first power supply voltage) supplied from outside. The electronic device according to the present embodiment further includes the semiconductor device PKG5 (fourth semiconductor device) having the control circuit unit CT (control circuit) that operates with the voltage V1 (second power supply voltage) supplied from the semiconductor device PKG4 and controls the semiconductor device PKG6. The semiconductor devices PKG1, PKG2, and PKG3 are mounted on the power wiring substrate PB1, and the semiconductor devices PKG4, PKG5, and PKG6 are mounted on the control wiring substrate PB2.

One of main features of the present embodiment is that the semiconductor devices PKG5 and PKG6 are mounted on one principal surface (first principal surface) out of two principal surface (first principal surface and second principal surface) located opposite each other on the control wiring substrate PB2, and that the semiconductor device PKG4 is mounted on the other principal surface (second principal surface).

Incidentally, FIGS. 6, 10, and 11 illustrate a case where the semiconductor device PKG4 is mounted at the upper surface side of the control wiring substrate PB2, and the semiconductor devices PKG5 and PKG6 are mounted on the lower surface of the control wiring substrate PB2. Here, a description thereof will be made based on this case.

One of other main features of the present embodiment is as follows. That is, on the lower surface (first principal surface) of the control wiring substrate PB2, there are an area RG1 (second area) and an area RG2 (third area) which are adjacent to each other and between which an area (first area) for arranging the plurality of holes HC3 is interposed; and the semiconductor device PKG 5 and the semiconductor device PKG 6 are mounted on the area RG1 out of the above areas. In addition, on the upper surface (second principal surface) of the control wiring substrate PB2, there are an area RG3 (fourth area) located opposite the area RG1, and an area RG4 (fifth area) located opposite the area RG2, and the semiconductor device PKG4 is mounted in the area RG4 out of the above areas.

Here, the control wiring substrate PB2 is provided with the plurality of holes HC3 through which the signal pins PN3 are inserted. The plurality of holes HC3 are arranged (line up) substantially in an X direction in the plan view. More preferably, the plurality of holes HC3 line up substantially in the X direction. Hereinafter, on the control wiring substrate PB2, the entire arrangement of the plurality of holes HC3 will be referred to as "the row of the holes HC3". Therefore, the row of the holes HC3 also corresponds to an area where the plurality of holes HC3 are arranged, or an area where the plurality of holes HC3 are formed.

Incidentally, the X direction and a Y direction are shown in each plan view, but these X direction and Y direction are directions common to all of the plan views. The X direction and the Y direction are directions substantially parallel to the principal surface of the power wiring substrate PB1, and are directions substantially parallel to the principal surface of the control wiring substrate PB2. The Y direction is a direction crossing the X direction. More preferably, the Y direction is a direction orthogonal to the X direction. FIG. 11 corresponds to a case obtained by inversion of FIG. 10 in the X direction.

The principal surface of the control wiring substrate PB2 is divided (partitioned) into two areas by the row of the holes HC3. On the lower surface of the control wiring substrate PB2, an area on one side out of both sides of the row of the holes HC3 is the area RG1, and an area on the other side is the area RG2. On the upper surface of the control wiring substrate PB2, an area on one side out of both sides of the row of the holes HC3 is the area RG3, and an area on the other side is the area RG4. The areas RG1 and RG2 are indicated in FIG. 11 explained above. In FIG. 11, on the lower surface of the control wiring substrate PB2, an area on a lower side of the row of the holes HC3 corresponds to the area RG1, and an area on an upper side of the row of the holes HC3 corresponds to the area RG2. The semiconductor devices PKG5 and PKG6 are mounted in the area RG1. The areas RG3 and RG4 are indicated in FIG. 10 explained above. In FIG. 10, on the upper surface of the control wiring substrate PB2, an area on a lower side of the row of the holes HC3 corresponds to the area RG3, and an area on an upper side of the row of the holes HC3 corresponds to the area RG4. The semiconductor device PKG4 is mounted in the area RG4.

On the lower surface of the control wiring substrate PB2, the area RG1 and the area RG2 are adjacent to each other via the row of the holes HC3. In other words, the area RG1 and the area RG2 sandwich the row of the holes HC3 and are located opposite each other. That is, by regarding the row of the holes HC3 as a virtual boundary on the lower surface of the control wiring substrate PB2, one of the areas divided by the boundary is the area RG1, and the other area is the area RG2. On the upper surface of the control wiring substrate PB2, the area RG3 and the area RG4 are adjacent to each other via the row of the holes HC3. In other words, the area RG3 and the area RG4 sandwich the row of the holes HC3 and are located opposite each other. That is, by regarding the row of the holes HC3 as the virtual boundary on the upper surface of the control wiring substrate PB2, one of the areas divided by the boundary is the area RG3, and the other area is the area RG4. On the lower surface of the control wiring substrate PB2, the row of the holes HC3 is between the area RG1 and the area RG2. On the upper surface of the control wiring substrate PB2, the row of the holes HC3 is between the area RG3 and the area RG4.

The area RG1 on the lower surface of the control wiring substrate PB2 and the area RG3 on the upper surface of the control wiring substrate PB2 are located opposite each other and overlap each other in the plan view. The area RG2 on the lower surface of the control wiring substrate PB2 and the area RG4 on the upper surface of the control wiring substrate PB2 are located opposite each other and overlap each other in the plan view. That is, on the control wiring substrate PB2, a back side (opposite side) of the area RG1 is the area RG3; a back side (opposite side) of the area RG3 is the area RG1; a back side (opposite side) of the area RG2 is the area RG4; and a back side (opposite side) of the area RG4 is the area RG2. In other words, the area RG1 and area RG3 overlap each other in the plan view; the area RG1 and the area RG3 are in such relationship that one of them is front and the other is back; the area RG2 and area RG4 overlap each other in the plan view; and the area RG2 and the area RG4 are in such relationship that one of them is front, and the other is back.

In the present embodiment, instead of mounting all the semiconductor devices PKG4, PKG5, and PKG6 on one of the principal surfaces of the control wiring substrate PB2, the semiconductor device PKG5 and the semiconductor device PKG6 are mounted on one (the lower surface in this case) of the principal surfaces of the control wiring substrate PB2, and the semiconductor device PKG4 is mounted on the other (the upper surface in this case) of the principal surfaces of the control wiring substrate PB2. On the principal surface (the lower surface in this case) of the control wiring substrate PB2 on a side of mounting the semiconductor devices PKG5 and PKG6, both of the semiconductor device PKG5 and the semiconductor device PKG6 are mounted in the area RG1 out of the two areas RG1 and RG2 divided by the row of the holes HC3 so that neither the semiconductor device PKG5 nor the semiconductor device PKG6 is mounted in the other area RG2. On the principal surface (the upper surface in this case) of the control wiring substrate PB2 on a side of mounting the semiconductor device PKG4, the semiconductor device PKG4 is not mounted in the area RG3 that is located opposite the area RG1 and that is one of the two areas RG3 and RG4 divided by the row of the holes HC3, and the semiconductor device PKG4 is mounted in the area RG4 located opposite the area RG2. The reason for this will be hereinafter explained.

In an electronic device used for motor driving and the like, a plurality of semiconductor devices having different functions are mounted on a control wiring substrate, but there is a fear of performance of the electronic device deteriorating unless mounting positions of the semiconductor devices and layout of wirings are contrived in accordance with the functions of the semiconductor devices.

Therefore, in the present embodiment, the semiconductor devices PKG4, PKG5, and PKG6 are mounted on the control wiring substrate PB2, but the mounting positions thereof are contrived in view of the function of each of the semiconductor devices PKG4, PKG5, and PKG6.

That is, the semiconductor device generating the largest amount of heat among the semiconductor devices PKG4, PKG5, and PKG6 is the semiconductor device PKG4 having the voltage generation circuit (regulator RE) into which the power supply potential VIN (first power supply voltage) is inputted and that converts it into the voltage V1 (second power supply voltage). The semiconductor device most likely to be a source of noises among the semiconductor devices PKG4, PKG5, and PKG6 is also the semiconductor device PKG4 having voltage generation circuit (regulator RE). That is, the semiconductor device PKG4 among the semiconductor devices PKG4, PKG5, and PKG6 is likely to be a heat generation source and a noise generation source. If the semiconductor devices PKG5 and PKG6 are affected by the heat and noises generated by the semiconductor device PKG4, there is a fear of the performance of the electronic device deteriorating. Therefore, in order to improve the performance of the electronic device having the semiconductor devices PKG4, PKG5, and PKG6 mounted on the control wiring substrate PB2, it is important for the semiconductor device PKG5 and the semiconductor device PKG6 not to be affected by the heat and noises generated by the semiconductor device PKG4 as much as possible. Many wirings of the control wiring substrate PB2 are required for connection between the semiconductor device PKG6 and the semiconductor device PKG5 having the control circuit (CT) controlling the semiconductor device PKG6. Therefore, the semiconductor device PKG5 and the semiconductor device PKG6 are desirably arranged at such positions as to be easily connected by the wirings.

Therefore, in the present embodiment, on one (the lower surface in this case) of the principal surfaces of the control wiring substrate PB2, both of the semiconductor device PKG5 and the semiconductor device PKG6 are mounted in the area RG1 which is one of the two areas RG1 and RG2 divided by the row of the holes HC3.

Here, a case different from the present embodiment will be compared. The following case will be assumed: on one principal surface of the control wiring substrate PB2, the semiconductor device PKG5 is mounted in the area RG1 which is one of two areas RG1 and RG2 divided by the row of the holes HC3, and the semiconductor device PKG6 is mounted in the other area RG2. In this case, it is difficult to connect the semiconductor device PKG5 and the semiconductor device PKG6 by the wirings because the plurality of holes HC3 obstructing the connection. In contrast, in the present embodiment, on one principal surface (the lower surface in this case) of the control wiring substrate PB2, both of the semiconductor device PKG5 and the semiconductor device PKG6 are mounted in the area RG1. Therefore, in order to connect the semiconductor device PKG5 and the semiconductor device PKG6 by the wirings, the plurality of holes HC3 do not obstruct the connection. As a result, the connection between the semiconductor device PKG5 and the semiconductor device PKG6 is easy to make by the wirings.

In addition, in order for the semiconductor device PKG5 and the semiconductor device PKG6 not to be affected by the heat and noises generated by the semiconductor device PKG4 as much as possible, the semiconductor device PKG4 is preferably arranged at a position as faraway from the semiconductor device PKG5 and the semiconductor device PKG6 as possible in the plan view. In order for the semiconductor device PKG5 and the semiconductor device PKG6 not to be affected by the heat and noises generated by the semiconductor device PKG4 as much as possible, the semiconductor device PKG4 is preferably mounted on the principal surface (the upper surface in this case) opposite to the principal surface (the lower surface in this case) on a side on which the semiconductor devices PKG5 and PKG6 are mounted on the control wiring substrate PB2. Therefore, in the present embodiment, the semiconductor devices PKG5 and PKG6 are mounted in the area RG1 on the lower surface of the control wiring substrate PB2, and the semiconductor device PKG4 is mounted in the area RG4 on the upper surface of the control wiring substrate PB2.

Unlike the present embodiment, if the semiconductor device PKG4 is placed in the area RG1 on the lower surface of the control wiring substrate PB2 or in the area RG3 on the upper surface of the control wiring substrate PB2, a placement position of the semiconductor device PKG4 is closer to the semiconductor device PKG5 and the semiconductor device PKG6, and this makes the semiconductor device PKG5 and the semiconductor device PKG6 be likely to be affected by the heat and noises generated by the semiconductor device PKG4. In contrast, in the present embodiment, the semiconductor device PKG4 is mounted neither in the area RG1 where the semiconductor devices PKG5 and PKG6 are mounted nor in the area RG3 opposite to the area RG1, and the semiconductor device PKG4 is mounted in the area RGRG4, so that the semiconductor device PKG4 can be placed at a position away from the semiconductor device PKG5 and the semiconductor device PKG6 in the plan view. It can be suppressed or prevented that the semiconductor device PKG4 from affecting the semiconductor device PKG5 and the semiconductor device PKG6 are subjected to influences due to the heat and the noises generated by the semiconductor device PKG4.

In addition, in the present embodiment, the semiconductor devices PKG5 and PKG6 are arranged in the area RG1 on the lower surface of the control wiring substrate PB2, and so the row of the holes HC3 is not arranged between the semiconductor device PKG5 and the semiconductor device PKG6 in the plan view. Thus, the leads (LD5a) of the semiconductor device PKG5 and the leads (LD6a) of the semiconductor device PKG6 can be easily connected with each other by the wirings of the control wiring substrate PB2. However, the semiconductor devices PKG5 and PKG6 are arranged in the area RG1 on the lower surface of the control wiring substrate PB2, and the semiconductor device PKG4 is arranged in the area RG4 on the upper surface side of the control wiring substrate PB2. Therefore, in the plan view, the row of the holes HC3 is arranged between the semiconductor device PKG4 and the semiconductor device PKG5 and between the semiconductor device PKG4 and the semiconductor device PKG6. However, the wirings connecting the semiconductor device PKG4 and the semiconductor device PKG5, and the wirings connecting the semiconductor device PKG4 and the semiconductor device PKG6 are the power supply wirings WC1 and WC2 for supplying, to the semiconductor devices PKG5 and PKG6, the voltage V1 generated by the semiconductor device PKG4, and are less in number than the wirings connecting the semiconductor device PKG5 and the semiconductor device PKG6. For this reason, in the plan view, even if the row of the holes HC3 is arranged between the semiconductor device PKG4 and the semiconductor device PKG5 or between the semiconductor device PKG4 and the semiconductor device PKG6, this is less likely to cause a problem in drawing around the wirings connecting the semiconductor device PKG4 and the semiconductor device PKG5, and the wirings connecting the semiconductor device PKG4 and the semiconductor device PKG6.

In addition, in the control wiring substrate PB2, the heat and noises generated by the semiconductor device PKG4 are mainly transmitted through a conductive film(s) (wiring(s)) formed on the control wiring substrate PB2. Therefore, unlike the present embodiment, if the semiconductor device PKG5 and the semiconductor device PKG6 are mounted on the principal surface of mounting the semiconductor device PKG4 in the control wiring substrate PB2, the heat and noises generated by the semiconductor device PKG4 are likely to be transmitted to the semiconductor device PKG5 and the semiconductor device PKG6 through the wirings formed on its principal surface. In contrast, in the present embodiment, in the control wiring substrate PB2, the semiconductor devices PKG5 and PKG6 are mounted on the principal surface (the lower surface) opposite to the principal surface (the upper surface in this case) of mounting the semiconductor device PKG4. Therefore, the heat and noises generated by the semiconductor device PKG4 are less likely to be transmitted to the semiconductor device PKG5 and the semiconductor device PKG6 through the wirings formed on the control wiring substrate PB2. Therefore, it can be suppressed or prevented that the semiconductor device PKG5 and the semiconductor device PKG6 are subjected to influences due to the heat and noises generated by the semiconductor device PKG4.

Thus, in the present embodiment, in the control wiring substrate PB2, the semiconductor devices PKG5 and PKG6 are mounted in the area RG1 on one principal surface (the lower surface in this case), and the semiconductor device PKG4 is mounted in the area RG4 on the other principal surface (the upper surface in this case), so that the semiconductor device PKG4 can be thermally and electrically separated from the semiconductor devices PKG5 and PKG6. By this, it can be suppressed or prevented that the semiconductor device PKG5 and the semiconductor device PKG6 are subjected to influences due to the heat and noises generated by the semiconductor device PKG4. Accordingly, the performance of the electronic device in which the semiconductor devices PKG4, PKG5, and PKG6 are mounted on the control wiring substrate PB2 can be improved. In addition, even though the plane size of the control wiring substrate PB2 is not increased, the semiconductor device PKG4 can be thermally and electrically separated from the semiconductor devices PKG5 and PKG6, so that a size of the control wiring substrate PB2 can be reduced, and thereby a size of the electronic device can be reduced.

As a modification of the present embodiment, it is also possible that the semiconductor devices PKG5 and PKG6 are mounted in the area RG1 on the lower surface of the control wiring substrate PB2, and the semiconductor device PKG4 is mounted in the area RG2 on the lower surface of the control wiring substrate PB2. In this case, it becomes easy to connect the semiconductor device PKG5 and the semiconductor device PKG6 by the wirings, and the semiconductor device PKG4 can be arranged at a position away from the semiconductor devices PKG5 and PKG6 in the plan view, so that the following effect can be obtained: it is suppressed that the semiconductor device PKG5 and the semiconductor device PKG6 is subjected to the influences due to the heat and noises generated by the semiconductor device PKG4. However, as described above, if the semiconductor devices PKG5 and PKG6 are mounted on the principal surface of mounting the semiconductor device PKG4 the control wiring substrate PB2, the heat and noises generated by the semiconductor device PKG4 are more likely to be transmitted to the semiconductor devices PKG5 and PKG6 through the wirings formed on its principal surface. Therefore, from the perspective of making it less likely for the semiconductor devices PKG5 and PKG6 to be affected by the heat and noises generated by the semiconductor device PKG4 as much as possible, the semiconductor device PKG4 is preferably mounted in the area RG4 on the upper surface of the control wiring substrate PB2 similarly to the present embodiment instead of being mounted in the area RG2 on the lower surface of the control wiring substrate PB2. Therefore, it can be more appropriately suppressed or prevented that the semiconductor device PKG5 and the semiconductor device PKG6 are subjected to influences due to the heat and the noises generated by the semiconductor device PKG4.

In addition, unlike the present embodiment, when the semiconductor device PKG5 and the semiconductor device PKG6 are mounted on the principal surfaces opposite to each other in the control wiring substrate PB2, one of the semiconductor devices PKG5 and PKG6 and the semiconductor device PKG4 are mounted on the same principal surface of the control wiring substrate PB2. In this case, one of the semiconductor devices PKG5 and PKG6 is likely to be affected by the heat and noises generated by the semiconductor device PKG4. In contrast, in the present embodiment, the semiconductor device PKG5 and the semiconductor device PKG6 are mounted on the same principal surface (the lower surface in this case) in the control wiring substrate PB2, and the semiconductor device PKG4 is mounted on the principal surface (the upper surface in this case) opposite thereto. By this, both of the semiconductor devices PKG5 and PKG6 are less likely to be affected by the heat and noises generated by the semiconductor device PKG4. Therefore, the performance of the electronic device can be improved.

Hereinafter, still other features of the electronic device according to the present embodiment will be explained.

In the present embodiment, as shown in FIGS. 6, 10, and 11 explained above, the semiconductor device PKG4 is mounted on the upper surface of the control wiring substrate PB2, and the semiconductor devices PKG5 and PKG6 are mounted on the lower surface of the control wiring substrate PB2. That is, the principal surface (the lower surface in this case) of the control wiring substrate PB2 on which the semiconductor devices PKG5 and PKG6 are mounted is opposed to the power wiring substrate PB1. In another aspect, the control wiring substrate PB2 may be inverted up and down. In this case, the principal surface on which the power supply wiring WV2, the power supply wiring WC2, the ground wiring WG2, and the signal wiring WS2 are formed and on which the semiconductor devices PKG5 and PKG6 are mounted becomes the upper surface side of the control wiring substrate PB2, and a principal surface on which the power supply wiring WV1, the power supply wiring WC1, the ground wiring WG1, and the signal wiring WS1 are formed and on which the semiconductor device PKG4 is mounted becomes the lower surface of the control wiring substrate PB2.

However, a case like the present embodiment in which the semiconductor device PKG4 is mounted on the upper surface side of the control wiring substrate PB2 and the semiconductor devices PKG5 and PKG6 are mounted on the lower surface of the control wiring substrate PB2 is more advantageous in the following points than a case where the semiconductor devices PKG5 and PKG6 are mounted on the lower surface of the control wiring substrate PB2 and the semiconductor device PKG4 is mounted on the upper surface of the control wiring substrate PB2.

That is, the semiconductor device PKG4 generates a larger amount of heat during its operation than those of the semiconductor devices PKG5 and PKG6. Therefore, if the semiconductor device PKG4 is mounted on the lower surface of the control wiring substrate PB2, the front surface side of the semiconductor device PKG4 becomes covered with the power wiring substrate PB1, and the heat radiation from the semiconductor device PKG4 to air cannot be expected much. In contrast, if the semiconductor device PKG4 is mounted on the upper surface of the control wiring substrate PB2 like the present embodiment, the front surface side of the semiconductor device PKG4 does without being covered with the power wiring substrate PB1, so that the heat radiated from the semiconductor device PKG4 to air can be expected, and this is advantageous in suppressing the heat generated from the semiconductor device PKG4. In a case where each height (a size in a thickness direction) of the semiconductor devices PKG5 and PKG6 is less than the height (the size in the thickness direction) of the semiconductor device PKG4, the semiconductor devices PKG5, PKG6 are mounted on the principal surface (the lower surface in this case) of the control wiring substrate PB2 opposed to the power wiring substrate PB1, and thereby a height of the entire electronic device can be suppressed.

In addition, in the present embodiment, the power wiring substrate PB1 out of the control wiring substrate PB2 and the power wiring substrate PB1 is arranged at a side closer to the motor MOT. In another aspect, the control wiring substrate PB2 and the power wiring substrate PB1 are reversed up and down, so that the control wiring substrate PB2 can also be arranged at a side closer to the motor MOT. However, in a case where the power wiring substrate PB1 out of the control wiring substrate PB2 and the power wiring substrate PB1 is close to the motor MOT like the present embodiment, an output current from the power wiring substrate PB1 can be easily transmitted to (the coil of) the motor MOT, which is more preferable.

In addition, the wiring substrate, on which the wiring layers are formed on the upper surface and the lower surface of the base material layer BS2, is adopted as the control wiring substrate PB2, and the control wiring substrate PB2 includes two wiring layers. Therefore, manufacturing cost of the control wiring substrate PB2 can be reduced.

In addition, the plane shape of the control wiring substrate PB2 is a circular shape. Thereby, when the control wiring substrate PB2 is attached to a device (the motor MOT in this case) whose plane shape is a circular shape, a waste space(s) does without being generated. The plane shape of the power wiring substrate PB1 is also a circular shape. Therefore, when the power wiring substrate PB1 is attached to a device (in this case, i.e., the motor MOT) whose plane shape is a circular shape, a waste space(s) does without being generated.

In addition, in the plan view, the row of the holes HP3 is preferably arranged at such a position as to pass the vicinity of a center of the control wiring substrate PB2 having the circular shape, namely, such a position as to constitute substantially a diameter of the control wiring substrate PB2 having the circular shape. By this, when the diameter of the control wiring substrate PB2 is the same, the holes HP3 capable of being provided in the control wiring substrate PB2 can be made larger in umber. Therefore, the number of signal pins PN3 connecting the power wiring substrate PB1 and the control wiring substrate PB2 can be increased efficiently. From another point of view, the size of the control wiring substrate PB2 can be reduced while the number of signal pins PN3 is maintained.

In addition, on the lower surface of the control wiring substrate PB2, the plurality of holes HC3 are arranged (line up) in the X direction. On the lower surface of the control wiring substrate PB2, the semiconductor device PKG5 and the semiconductor device PKG6 are placed alongside in the X direction. That is, on the lower surface of the control wiring substrate PB2, the semiconductor devices PKG5 and PKG6 are arranged to be adjacent to the row of the holes HC3 in the Y direction, and the semiconductor device PKG5 and the semiconductor device PKG6 are arranged alongside in the X direction. When the semiconductor device PKG5 and the semiconductor device PKG6 line up in the Y direction on the lower surface of the control wiring substrate PB2 unlike the present embodiment, it is necessary to increase the plane size of the control wiring substrate PB2, which is disadvantageous in reducing the size of the electronic device. In the present embodiment, the semiconductor device PKG5 and the semiconductor device PKG6 line up in the X direction, and so even though the plane size of the control wiring substrate PB2 is not enlarged, the semiconductor device PKG5 and the semiconductor device PKG6 can be arranged, which is advantageous for reducing the size of the electronic device.

In addition, the control wiring substrate PB2 includes the plurality of holes (HT2, HC1, HC2, HC3, NH2, NH4a, and NH4b), but the hole HT2 is a hole having the largest area (plane size) among the holes (HT2, HC1, HC2, HC3, NH2, NH4a, and NH4b) that the control wiring substrate PB2 has, and therefore the hole HT2 is a hole having the largest diameter. The hole HT2 is a hole passing through a pipe (the discharge port TK in this case) through which the fuel sucked by the fuel pump PM passes, and in order to efficiently carry the fuel from the fuel pump PM to the engine ENG, it is necessary to increase a diameter of discharge port TK to some extent. Therefore, it is necessary to increase the area (diameter) of the hole HT2 to some extent.

When the hole HT2 having a large size of area is formed in the area RG1 (RG3) of the control wiring substrate PB2 unlike the present embodiment, the hole HT2 becomes an obstacle, which makes it difficult to connect the semiconductor device PKG5 and the semiconductor device PKG6 by the wirings. Therefore, as shown in the present embodiment, the control wiring substrate PB2 is preferably has the hole HT2 formed in the area RG4 (RG2) on a side, on which the semiconductor device PKG4 is mounted, instead of the area RG1 (area RG3) on a side on which the semiconductor devices PKG5 and PKG6 are mounted. Thereby, even if the hole HT2 having the large area is provided in the control wiring substrate PB2, the connection between the semiconductor device PKG5 and the semiconductor device PKG6 can be easily and appropriately made by the wirings.

In addition, the control wiring substrate PB2 needs to have the holes NH2 for fixing in order to be attached to the motor MOT. The plurality of holes NH2 for fixing are preferable provided in the control wiring substrate PB2, and three holes NH2 for fixing are more preferable provided in order to obtain stable fixation. Therefore, when the holes NH2 for fixing are provided in the control wiring substrate PB2, the number of holes NH2 provided in the area RG1 is preferably larger than the number of holes NH2 provided in the area RG2 on the lower surface of the control wiring substrate PB2. For example, when three holes NH2 for fixing are provided, it is preferable to provide one hole NH1 in the area RG1 and two holes NH1 in the area RG2 on the lower surface of the control wiring substrate PB2. On the lower surface of the control wiring substrate PB2, it is preferred that the hole NH2 is not formed in an area between the semiconductor device PKG5 and the semiconductor device PKG6. Thereby, even though the holes NH2 for fixing are provided in the control wiring substrate PB2, the connection between the semiconductor device PKG5 and the semiconductor device PKG6 can be easily made by the wirings.

In addition, the control wiring substrate PB2 includes a terminal to which the power supply potential VIN is supplied, and a terminal to which the ground potential GND is supplied. Here, the terminal to which the power supply potential VIN is supplied corresponds to: the connection unit of the power supply cable CB1 and the power supply wirings (WV1 and WV2) of the control wiring substrate PB2; the screw NG2a fixing and electrically connecting the power supply cable CB1 to the control wiring substrate PB2; or the hole NH4a in which the screw NG2a is inserted. The terminal to which the ground potential GND is supplied corresponds to: the connection unit of the ground cable CB2 and the ground wirings (WG1 and WG2) of the control wiring substrate PB2; the screw NG2b fixing and electrically connecting the ground cable CB2 to the control wiring substrate PB2; or the hole NH4b in which the screw NG2b is inserted.

In the control wiring substrate PB2, a distance between the terminal to which the power supply potential VIN is supplied and the semiconductor device PKG6 in the plan view is preferably less than a distance between the terminal to which the power supply potential VIN is supplied and the semiconductor device PKG5. That is, in the control wiring substrate PB2, a distance between the hole NH4a and the semiconductor device PKG6 in the plan view is preferably less than a distance between the hole NH4a and the semiconductor device PKG5. This is, it is preferable that, in the plan view, the semiconductor device PKG6 out of the semiconductor devices PKG5 and PKG6 is placed on a side closer to the hole NH4a, and the semiconductor device PKG5 is placed on a side farther from the hole NH4a. The reason for this is as follows.

That is, since the power supply potential VIN is supplied to the semiconductor device PKG6, it is preferably arranged on a side closer to the terminal to which the power supply potential VIN is supplied, so that the power supply potential VIN can be easily supplied to the semiconductor device PKG6 via the power supply wirings (WV1 and WV2) of the control wiring substrate PB2. On the other hand, it is not necessary to supply the power supply potential VIN to the semiconductor device PKG5, and so even if the semiconductor device PKG5 is placed at a position away from the terminal to which the power supply potential VIN is supplied, defects do without being generated.

In addition, in the case of the FIG. 10, the distance between the terminal to which the ground potential GND is supplied and the semiconductor device PKG6 on the control wiring substrate PB2 becomes less than the distance between the terminal to which the ground potential GND is supplied and the semiconductor device PKG5. That is, on the control wiring substrate PB2, the distance between the hole NH4b and the semiconductor device PKG6 becomes shorter than the distance between the hole NH4b and the semiconductor device PKG5.

In addition, as shown in FIG. 35, the control wiring substrate PB2 has ground wirings WG2 (first ground pattern) to which the ground potential GND is supplied on the lower surface side. On the lower surface side of the control wiring substrate PB2, those ground wirings WG2 include: ground wirings WG2b (second ground pattern) formed in the area RG1 and electrically connected to the semiconductor device PKG5; and ground wirings WG2a (third ground pattern) formed in the area RG2 and electrically connected to the semiconductor device PKG4. On the lower surface side of the control wiring substrate PB2, those ground wirings WG2 further include a ground wiring WG2c (fourth ground pattern) connecting the ground wirings WG2a and the ground wirings WG2b. It should be noted that the ground wiring WG2c is formed integrally with the ground wirings WG2b formed in the area RG1 and the ground wirings WG2a formed in the area RG2.

On the lower surface side of the control wiring substrate PB2, the ground wirings WG2b are formed in the area RG1 and electrically connected to the semiconductor device PKG5 (lead LD5c). Thereby, the ground potential GND can be supplied from the ground wiring WG2b to the semiconductor device PKG5 (lead LD5c). On the lower surface side of the control wiring substrate PB2, the ground wirings WG2a formed in the area RG2 are electrically connected via the via portion (VH) of the control wiring substrate PB2 to the ground wirings WG1a (see FIG. 31) formed in the area RG4 on the upper surface side of the control wiring substrate PB2. The ground wirings WG1a formed in the area RG4 on the upper surface side of the control wiring substrate PB2 are electrically connected to the semiconductor device PKG4 (die pad DP4).

Therefore, the semiconductor device PKG4 and the semiconductor device PKG5 become electrically connected via: the ground wirings WG1a formed in the area RG4; the via portion VH connecting the ground wirings WG1a and WG2a; the ground wirings WG2a formed in the area RG2; the ground wiring WG2c connecting the ground wirings WG2a and WG2b; and the ground wirings WG2b formed in the area RG1. In this case, when the semiconductor device PKG4 and the semiconductor device PKG5 are connected via the ground wirings by a low resistor(s) (low impedance), noises generated by the semiconductor device PKG4 are likely to be transmitted to the semiconductor device PKG5 through the ground wirings, so that the semiconductor device PKG5 is likely to be affected by the noises generated by the semiconductor device PKG4. In addition, heat generated by the semiconductor device PKG4 is also easily transmitted to the semiconductor device PKG5.

Therefore, in the present embodiment, since the ground wiring WG2c connecting the ground wirings WG2a and WG2b is contrived, it is suppressed or prevented that the noises and heat generated by the semiconductor device PKG4 are transmitted via the ground wirings to the semiconductor device PKG5. That is, on the lower surface of the control wiring substrate PB2, the ground wiring WG2c connecting the ground wirings WG2a and the ground wirings WG2b is formed in an area other than that between the semiconductor device PKG4 and the semiconductor device PKG5 in the plan view.

Figure 44:
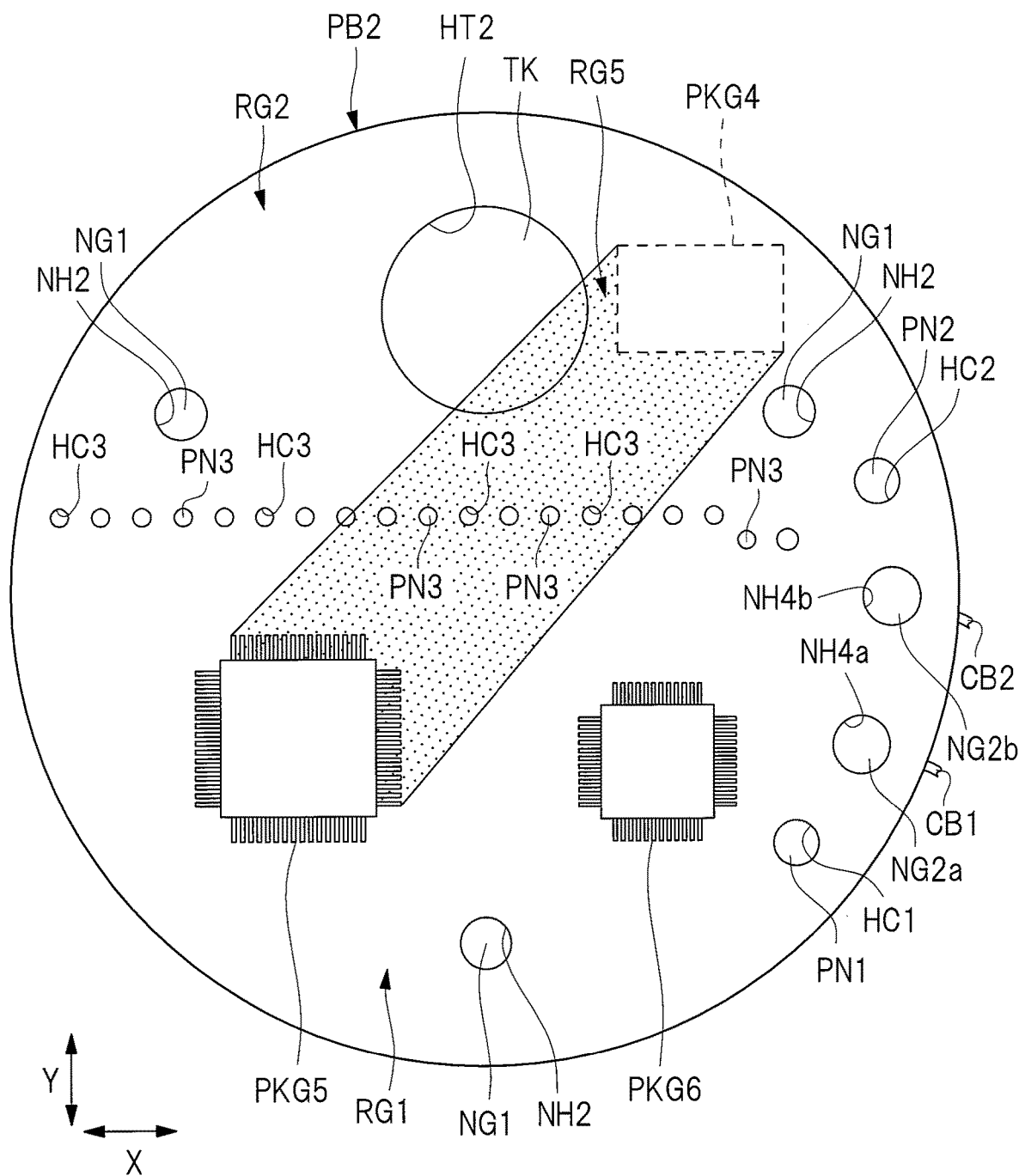
FIG. 44 is a bottom view of a control wiring substrate.

Here, FIG. 44 is a bottom view illustrating the control wiring substrate PB2, and is basically the same drawing as FIG. 11. But, in FIG. 44, the area RG5 between the semiconductor device PKG4 and the semiconductor device PKG5 in the plan view is indicated with dot hatching. To form the ground wiring WG2c in the area other than that between the semiconductor device PKG4 and the semiconductor device PKG5 in the plan view corresponds to not placing the ground wiring WG2c in the area RG5 indicated with the dot hatching of FIG. 44 but placing the ground wiring WG2c in an area other than the area RG5 indicated with the dot hatching of FIG. 44.

Unlike the present embodiment, it is assumed that the ground wiring WG2c connecting the ground wirings WG2a and WG2b is arranged in the area RG5 between the semiconductor device PKG4 and the semiconductor device PKG5 (see FIG. 44) in the plan view. In this case, a path connecting the semiconductor device PKG4 and the semiconductor device PKG5 via the ground wirings WG2b, the ground wiring WG2c, the ground wirings WG2a, the via portion VH, and the ground wirings WG1a has a small resistance. Therefore, the noises and heat generated by the semiconductor device PKG4 are likely to be transmitted via the ground wirings to the semiconductor device PKG5.

In contrast, in the present embodiment, as can be understood by referring to FIGS. 44 and 35, the ground wiring WG2c connecting the ground wirings WG2a and the ground wirings WG2b is formed in the area other than that between the semiconductor device PKG4 and the semiconductor device PKG5 (an area other than the area RG5 as shown in FIG. 44) in the plan view. Thereby, enhanced can be resistance (impedance) of the path connecting the semiconductor device PKG4 and the semiconductor device PKG5 via the ground wirings WG2b, the ground wiring WG2c, the ground wirings WG2a, the via portion VH, and the ground wirings WG1a. Therefore, it can be suppressed or prevented that the noises and heat generated by the semiconductor device PKG4 are transmitted via the ground wirings to the semiconductor device PKG5. Accordingly, it can be suppressed or prevented that the semiconductor device PKG5 is subjected to the influences due to the noises and heat generated by the semiconductor device PKG4.

In addition, as shown in FIG. 35, the ground wiring WG2c connecting the ground wirings WG2a and WG2b preferably pass between two adjacent holes HC3 out of the plurality of holes HC3. The ground wiring WG2c passes between the two adjacent holes HC, so that the ground wirings WG2a and WG2b can be appropriately connected, and a width of the ground wiring WG2c (a dimension in the X direction) becomes small. Therefore, the resistor component of the ground wiring WG2c becomes large, and thereby it is possible to enhance the resistance of the path for connecting the semiconductor device PKG4 and the semiconductor device PKG5 via the ground wirings WG2b, the ground wiring WG2c, the ground wirings WG2a, the via portion VH, and the ground wirings WG1a. Thereby, it can be further suppressed or prevented that the noises and heat generated by the semiconductor device PKG4 are transmitted via the ground wirings to the semiconductor device PKG5.

In addition, as shown in FIG. 31, the control wiring substrate PB2 has the ground wirings WG1 (fifth ground pattern) to which the ground potential GND is supplied on the upper surface. On the upper surface side of the control wiring substrate PB2, those ground wirings WG1 include: ground wirings WG1b (sixth ground pattern) formed in the area RG3 and electrically connected to the semiconductor device PKG5; and ground wirings WG1a (seventh ground pattern) formed in the area RG4 and electrically connected to the semiconductor device PKG4. On the upper surface side of the control wiring substrate PB2, those ground wirings WG1 further include ground wirings WG1c (eighth ground pattern) connecting the ground wirings WG1a and the ground wirings WG1b. It should be noted that the ground wiring WG1c is formed integrally with the ground wirings WG1b formed in the area RG3 and the ground wirings WG1a formed in the area RG4.

On the upper surface side of the control wiring substrate PB2, the ground wirings WG1a are formed in the area RG4 and electrically connected to the semiconductor device PKG4 (die pad DP4). Thereby, the ground potential GND can be supplied from the ground wirings WG1a to the semiconductor device PKG4 (die pad DP4). The ground wirings WG1b formed in the area RG3 on the upper surface side of the control wiring substrate PB2 are electrically connected via the via portions (VH) of the control wiring substrate PB2 to the ground wirings WG2b formed in the area RG1 on the lower surface side of the control wiring substrate PB2. The ground wirings WG2b formed in the area RG1 on the lower surface side of the control wiring substrate PB2 are electrically connected to the semiconductor device PKG5 (lead LD5c). Therefore, the semiconductor device PKG4 and the semiconductor device PKG5 are electrically connected via: the ground wirings WG1a formed in the area RG4; the ground wirings WG1c connecting the ground wirings WG1a and WG1b; the ground wirings WG1b formed in the area RG3; the via portions VH connecting the ground wirings WG1b and WG2b; and the ground wirings WG2b formed in the area RG1.

Therefore, in the present embodiment, as can be understood by referring to FIGS. 44 and 31, the ground wirings WG1c connecting the ground wirings WG1a and the ground wirings WG1b are formed in the area other than that between the semiconductor device PKG4 and the semiconductor device PKG5 in the plan view. That is, in the plan view, not only the ground wiring WG2c on the lower surface side of the control wiring substrate PB2 but also the ground wirings WG1c on the upper surface side of the control wiring substrate PB2 are arranged in an area other than the area RG5 indicated with dot hatching in FIG. 44. Thereby, increased can be the resistance of the path connecting the semiconductor device PKG4 and the semiconductor device PKG5 via: the ground wirings WG1a, the ground wirings WG1c; the ground wirings WG1b; the via portions VH; and the ground wirings WG2b. Therefore, it can be further suppressed or prevented that the noises and heat generated by the semiconductor device PKG4 are transmitted via the ground wirings to the semiconductor device PKG5.

In addition, as shown in FIG. 31, the ground wirings WG1c preferably pass between two adjacent holes HC3 among the plurality of holes HC3. The ground wirings WG1c pass between the two adjacent holes HC, so that the ground wirings WG1a and WG1b can be appropriately connected, and thereby the width of each ground wiring WG1c (size in the X direction) becomes small. Therefore, the resistor component of each ground wiring WG1c becomes large, and so it is possible to enhance the resistance of the path for connecting the semiconductor device PKG4 and the semiconductor device PKG5 via the ground wirings WG1a, the ground wirings WG1c, the ground wirings WG1b, the via portions VH, and the ground wirings WG2b. Thereby, it can be further suppressed or prevented that the noises and heat generated by the semiconductor device PKG4 are transmitted via the ground wirings to the semiconductor device PKG5.

Figure 45:
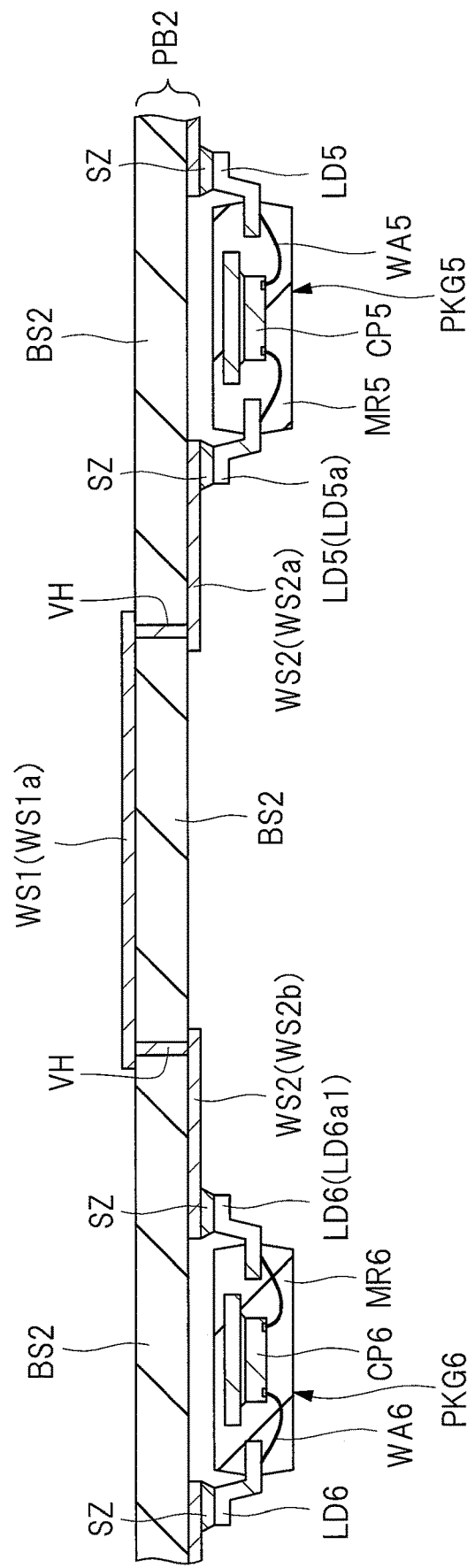
FIG. 45 is a cross-sectional view showing a portion of an electronic device.
Figure 46:
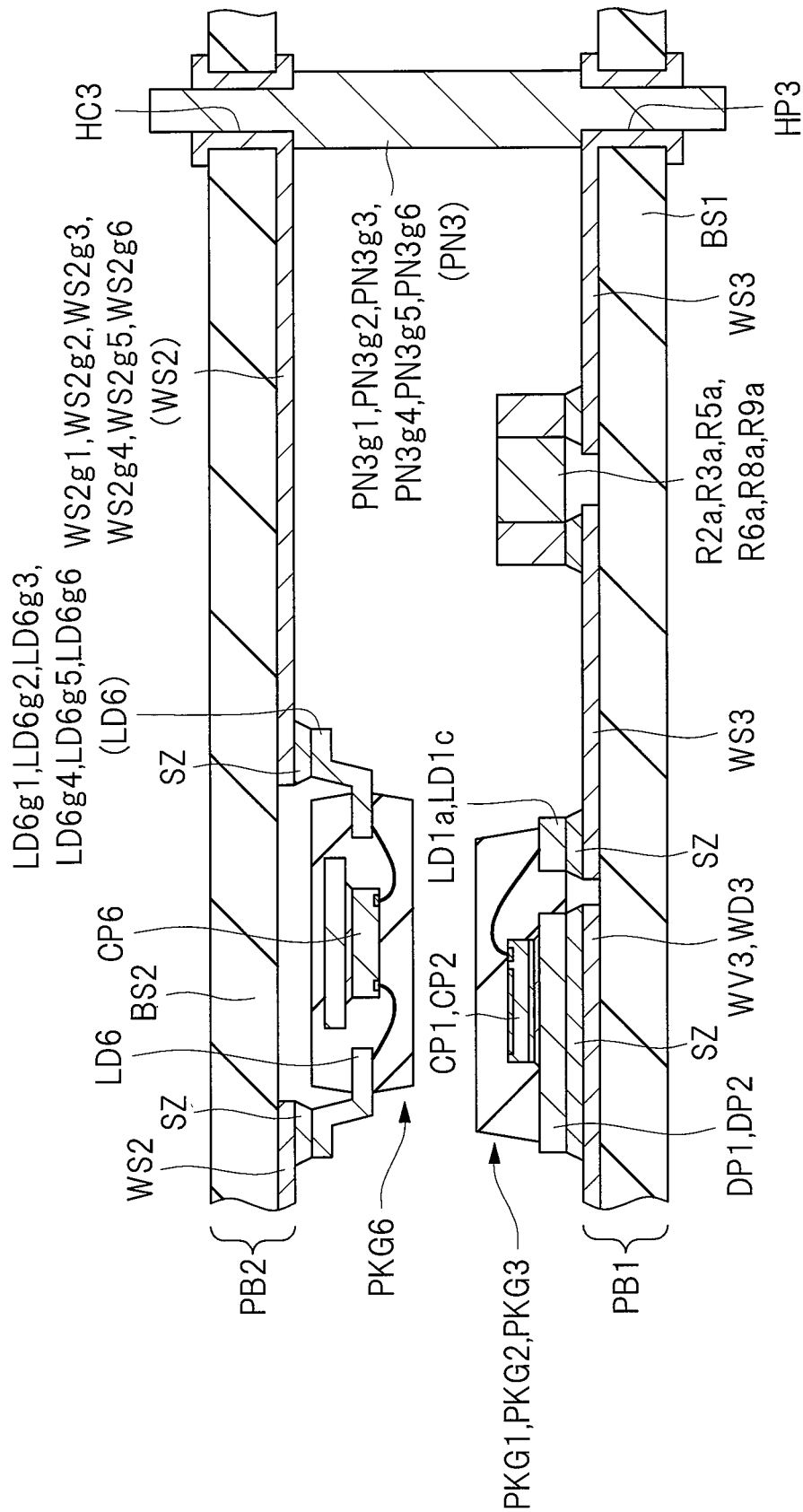
FIG. 46 is a cross-sectional view showing the portion of the electronic device.
Figure 47:
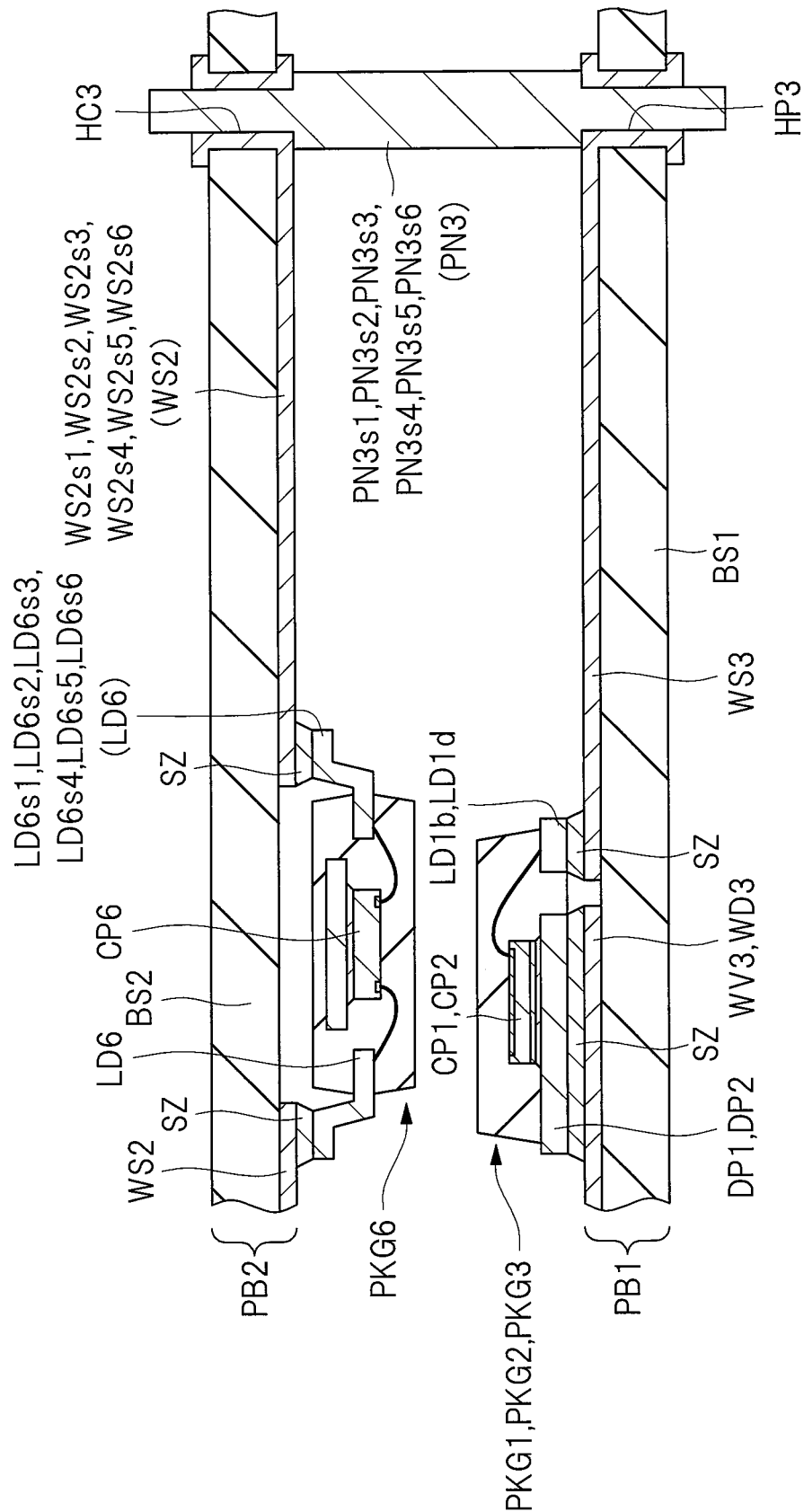
FIG. 47 is a cross-sectional view showing the portion of the electronic device.
Figure 48:
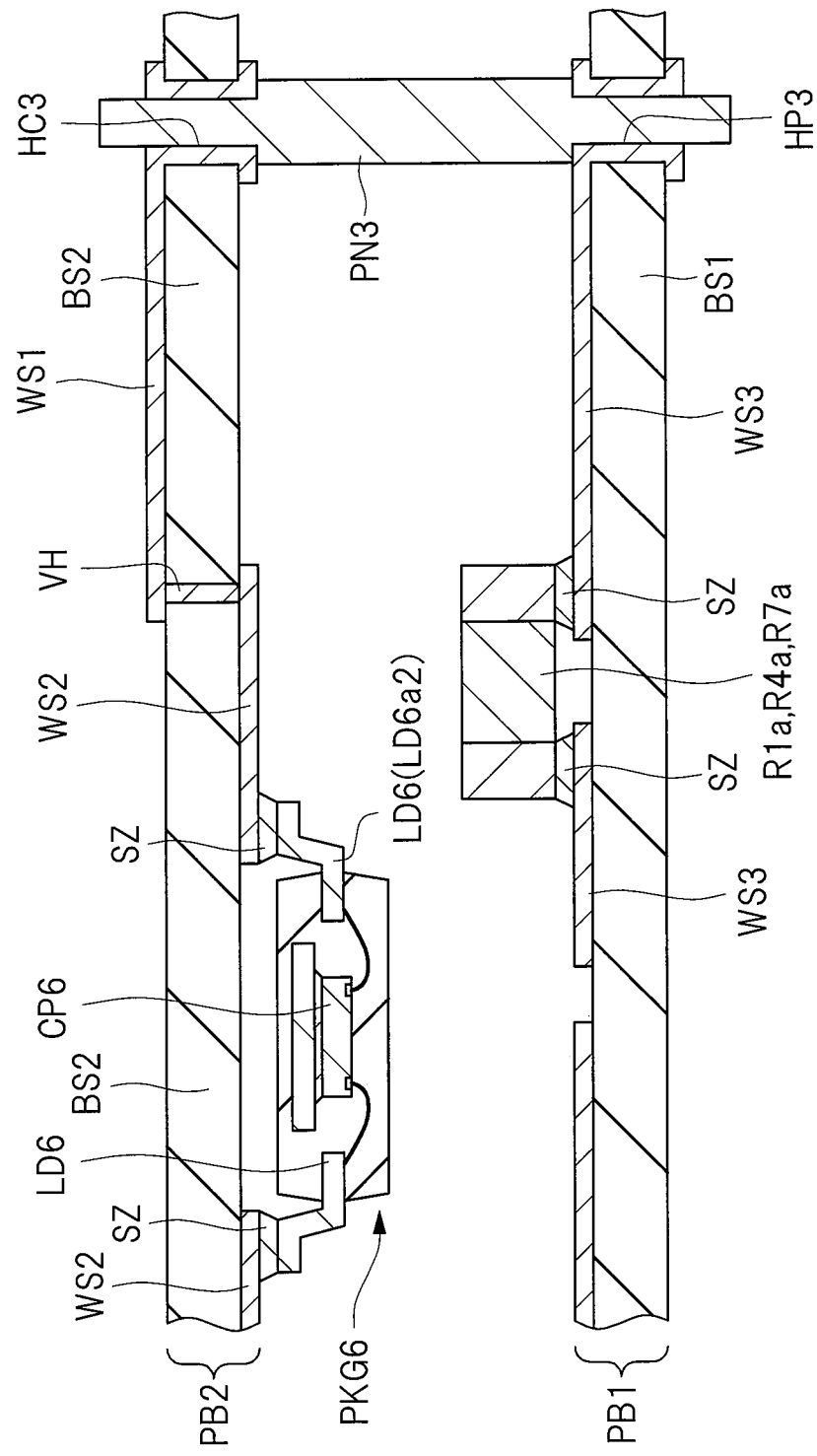
FIG. 48 is a cross-sectional view showing the portion of the electronic device.
Figure 49:
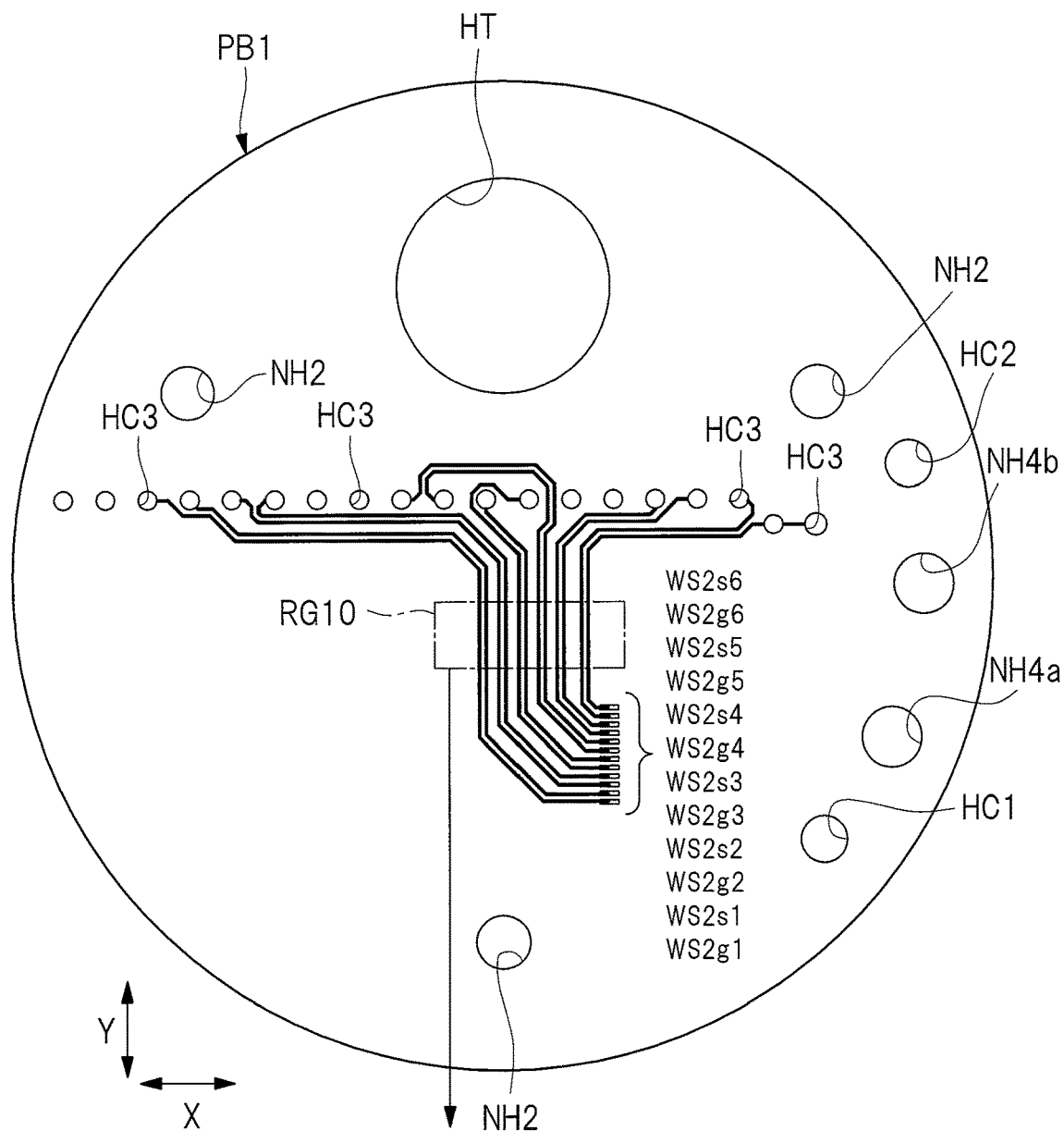
FIG. 49 is a perspective plan view of a lower surface of a control wiring substrate.
Figure 49:
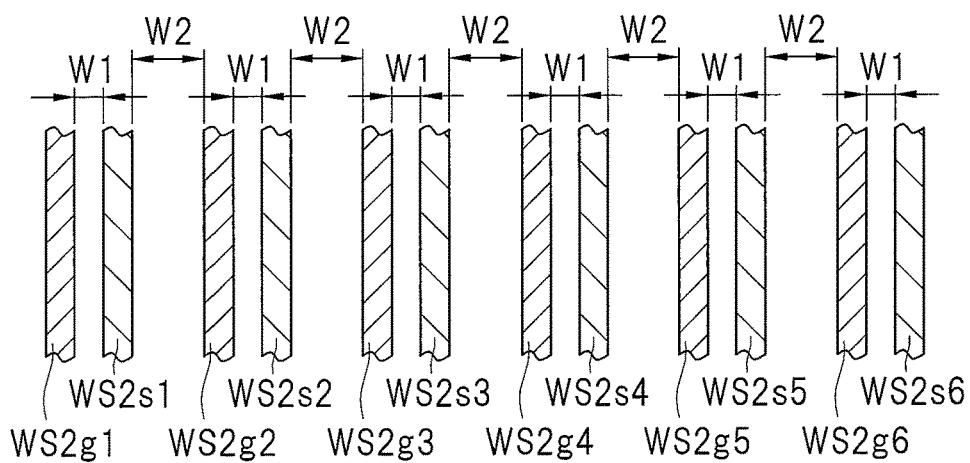

FIGS. 45 to 48 are cross-sectional views illustrating a portion of the electronic device according to the present embodiment. FIG. 45 illustrates a structure for electrically connecting the lead LD5a of the semiconductor device PKG5 and the lead LD6a1 of the semiconductor device PKG6 via the signal wiring of the control wiring substrate PB2. FIGS. 46 to 48 each illustrate a structure for electrically connecting the semiconductor device PKG6 mounted on the control wiring substrate PB2 and the semiconductor devices PKG1, PKG2, and PKG3 mounted on the power wiring substrate PB1 via the signal wiring of the control wiring substrate PB2, the signal pin PN3, and the wirings of the power wiring substrate PB1. However, in order to make the drawings easy to see, the resist layers RS2a and RS2b are not shown and are omitted in FIGS. 45 to 48. FIG. 49 is a plan perspective view illustrating the lower surface side of the control wiring substrate PB2. However, FIG. 49 shows gate signal wirings WS2g1, WS2g2, WS2g3, WS2g4, WS2g5, and WS2g6, and source wirings WS2s1, WS2s2, WS2s3, WS2s4, WS2s5, and WS2s6 as explained later among the wiring patterns on the lower surface of the control wiring substrate PB2 shown in FIG. 34 explained above, and does not show and omits a wiring(s) other than the above. In FIG. 49, the wiring patterns (the gate signal wirings WS2g1, WS2g2, WS2g3, WS2g4, WS2g5, and WS2g6, and the source wirings WS2s1, WS2s2, WS2s3, WS2s4, WS2s5, and WS2s6) of the area RG10 enclosed by an alternate long and short dashed line are enlarged and shown at a lower part of FIG. 49.

Each of the plurality of leads LD6 of the semiconductor device PKG6 includes a plurality of leads LD6a connected to the signal wirings WS2. Each of the leads LD6a of the semiconductor device PKG6 is electrically connected to the lead LD5 (LD5a) of the semiconductor device PKG5 or the signal pin PN3 via the signal wiring of the control wiring substrate PB2. Here, the lead LD6a which is one of the plurality of leads LD6a of the semiconductor device PKG6 and which is electrically connected to the lead LD5 (LD5a) of the semiconductor device PKG5 via the signal wiring of the control wiring substrate PB2 will be given reference symbol LD6a1 and referred to as a lead LD6a1. The lead LD6a which is one of the plurality of leads LD6a of the semiconductor device PKG6 and which is electrically connected to the signal pin PN3 via the signal wiring of the control wiring substrate PB2 will be given reference symbol LD6a2 and referred to as a lead LD6a2. The semiconductor device PKG6 includes the plurality of leads LD6a1 and the plurality of leads LD6a2.

First, a structure for electrically connecting the semiconductor device PKG5 and the semiconductor device PKG6 via the signal wiring(s) of the control wiring substrate PB2 will be explained with reference to FIG. 45.

As shown in FIG. 45, the lead LD5a of the semiconductor device PKG5 is joined to a signal wiring WS2 (WS2a) via a conductive bonding material SZ. The lead LD6a1 of the semiconductor device PKG6 is joined to a signal wiring WS2 (WS2b) via a conductive bonding material SZ. Here, the signal wiring WS2 joined to the lead LD5a of the semiconductor device PKG5 will be given reference symbol WS2a and referred to as a signal wiring WS2a. The signal wiring WS2 joined to the leads LD6a1 of the semiconductor device PKG6 will be given reference symbol WS2b and referred to as a reference symbol WS2b.

The signal wiring WS2a joined to the lead LD5a of the semiconductor device PKG5 is electrically connected to the signal wiring WS1a out of the signal wirings WS1 on the upper surface side of the control wiring substrate PB2 via the via portion VH of the control wiring substrate PB2. The signal wiring WS1a is electrically connected to the signal wiring WS2b through the via portion VH of the control wiring substrate PB2, and the lead LD6a1 of the semiconductor device PKG6 is joined to the signal wiring WS2b. Therefore, the lead LD5a of the semiconductor device PKG5 is electrically connected to the lead LD6a1 of the semiconductor device PKG6 via the signal wiring WS2a, the via portion VH connecting the signal wirings WS2a and WS1a, the signal wiring WS1a, the via portion VH connecting the signal wirings WS1a and WS2b, and the signal wiring WS2b.

Thus, in the present embodiment, the semiconductor device PKG5 (lead LD5a) and the semiconductor device PKG6 (lead LD6a1) are electrically connected via the wirings (WS2a and WS2b) formed on the lower surface side of the control wiring substrate PB2 and the wiring (WS1a) formed on the upper surface side of the control wiring substrate PB2. That is, the semiconductor device PKG5 (lead LD5a) and the semiconductor device PKG6 (lead LD6a1) are electrically connected using the wirings (WS2a and WS2b) on the lower surface side of the control wiring substrate PB2 as well as the wiring (WS1a) on the upper surface side of the control wiring substrate PB2. Namely, the semiconductor device PKG5 (lead LD5a) and the semiconductor device PKG6 (lead LD6a1) are electrically connected using two wiring layers of the wiring layer on the lower surface side of the control wiring substrate PB2 and the wiring layer on the upper surface side of the control wiring substrate PB2. Thereby, the signal wirings connecting the semiconductor device PKG6 and the signal pins PN3 become no obstacle, and the semiconductor device PKG5 and the semiconductor device PKG6 can be electrically connected via the signal wirings (WS1 and WS2), so that the semiconductor device PKG5 and the semiconductor device PKG6 can be easily connected.

Incidentally, the signal wirings (WS2a, WS1a, and WS2b) connecting the semiconductor device PKG5 and the semiconductor device PKG6 are mainly extended in the X direction, so that the semiconductor device PKG5 and the semiconductor device PKG6 can be easily connected. The signal wirings (the gate signal wirings WS2g1 to WS2g6, and the source wirings WS2s1 to WS2s6, and the like explained later) connecting the semiconductor device PKG6 and the signal pin PN3 are extended in the Y direction up to such a position as to approach the arrangement of the plurality of holes HC3, so that the semiconductor device PKG6 and the signal pin PN3 can be easily connected.

Subsequently, a structure for electrically connecting the semiconductor device PKG6 mounted on the control wiring substrate PB2 and the semiconductor devices PKG1, PKG2, and PKG3 mounted on the power wiring substrate PB1 via the signal wiring of the control wiring substrate PB2, the signal pin PN3, and the wirings of the power wiring substrate PB1 will be explained with reference to FIGS. 46 to 48.

The semiconductor device PKG6 includes the above-described driver circuit unit. The semiconductor device PKG1 has the power MOSFETs 1 and 2. The semiconductor device PKG2 has the power MOSFETs 3 and 4. The semiconductor device PKG3 has the power MOSFETs 5 and 6. Therefore, the gate signals for driving the power MOSFETs are transmitted from the semiconductor device PKG6 to the gate leads LD1a and LD1c of each of the semiconductor devices PKG1, PKG2, and PKG3. The semiconductor device PKG6 is mounted on the lower surface of the control wiring substrate PB2, and the semiconductor devices PKG1, PKG2, and PKG3 are mounted on the power wiring substrate PB1. Therefore, the gate leads LD1a and LD1c of each of the semiconductor devices PKG1, PKG2, and PKG3 are electrically connected to any one of the leads LD6a2 of the semiconductor device PKG6 via the signal wiring (WS3) of the power wiring substrate PB1, the signal pin PN3, and the signal wiring (WS2) of the control wiring substrate PB2.

The driver circuit unit DR in the semiconductor device PKG6 is a circuit for driving the power MOSFETs 1, 2, 3, 4, 5, and 6, and the gate signal transmitted from the semiconductor device PKG6 to the gate leads LD1a and LD1c of each of the semiconductor devices PKG1, PKG2, and PKG3 is desired so as to enhance its signal quality, that is, so as not to mix noises etc. as much as possible.

Therefore, in the present embodiment, the conductive path (transmission path of the gate signal) between each of the gate leads LD1a and LD1c of each of the semiconductor devices PKG1, PKG2, and PKG3 and the lead LD6 of the semiconductor device PKG6 uses the signal wiring WS2 on the lower surface side of the control wiring substrate PB2 but does not use the signal wiring WS1 on the upper surface side of the control wiring substrate PB2. That is, the gate signal is transmitted from the semiconductor device PKG6 (driver circuit unit DR) to the gate leads LD1$a$ and LD1$c$ of each of the semiconductor devices PKG1, PKG2, and PKG3 (i.e., each gate of the power MOSFETs 1, 2, 3, 4, 5, and 6) through the signal wiring WS2 on the lower surface side of the control wiring substrate PB2 but not through the signal wiring WS1 on the upper surface side of the control wiring substrate PB2. Thereby, the gate signal transmitted from the semiconductor device PKG6 to each of the gate leads LD1$a$ and LD1$c$ of each of the semiconductor devices PKG1, PKG2, and PKG3 does not pass through the via portion (VH) of the control wiring substrate PB2, so that a phenomenon of deteriorating signal quality passing through the via portion (VH) does without being generated. Therefore, it is possible to further improve the signal quality of the gate signal transmitted from the semiconductor device PKG6 to the gate leads LD1$a$ and LD1$c$ of each of the semiconductor devices PKG1, PKG2, and PKG3. Thereby, the performance and the reliability of the electronic device can be further improved.

Hereinafter, a concrete connection relationship will be explained with reference to FIG. 46.

As shown in FIG. 46, each of the leads LD6$g$1, LD6$g$2, LD6$g$3, LD6$g$4, LD6$g$5, and LD6$g$6 of the semiconductor device PKG6 is joined to the signal wiring WS2 on the lower surface side of the control wiring substrate PB2 via the conductive bonding materials SZ, and electrically connected to the signal pin PN3 via the signal wiring WS2.

Here, the lead LD6 for transmitting the gate signal to the gate lead LD1$a$ of the semiconductor device PKG1 will be referred to as the lead LD6$g$1. The lead LD6 for transmitting the gate signal to the gate lead LD1$c$ of the semiconductor device PKG1 will be referred to as the lead LD6$g$2. The lead LD6 for transmitting the gate signal to the gate lead LD1$a$ of the semiconductor device PKG2 will be referred to as the lead LD6$g$3. The lead LD6 for transmitting the gate signal to the gate lead LD1$c$ of the semiconductor device PKG2 will be referred to as the lead LD6$g$4. The lead LD6 for transmitting the gate signal to the gate lead LD1$a$ of the semiconductor device PKG3 will be referred to as the lead LD6$g$5. The lead LD6 for transmitting the gate signal to the gate lead LD1$c$ of the semiconductor device PKG3 will be referred to as the lead LD6$g$6. The leads LD6$g$1, LD6$g$2, LD6$g$3, LD6$g$4, LD6$g$5, and LD6$g$6 are included in the plurality of leads LD6$a$2 that the semiconductor device PKG6 explained above has.

In addition, the signal wiring WS2 to which the lead LD6$g$1 is connected will be referred to as the gate signal wiring WS2$g$1. The signal wiring WS2 to which the lead LD6$g$2 is connected will be referred to as the gate signal wiring WS2$g$2. The signal wiring WS2 to which the lead LD6$g$3 is connected will be referred to as the gate signal wiring WS2$g$3. The signal wiring WS2 to which the lead LD6$g$4 is connected will be referred to as the gate signal wiring WS2$g$4. The signal wiring WS2 to which the lead LD6$g$5 is connected will be referred to as the gate signal wiring WS2$g$5. The signal wiring WS2 to which the lead LD6$g$6 is connected will be referred to as the gate signal wiring WS2$g$6.

In addition, the signal pin PN3 electrically connected to the lead LD6$g$1 via the gate signal wiring WS2$g$1 will be referred to as the signal pin PN3$g$1. The signal pin PN3 electrically connected to the lead LD6$g$2 via the gate signal wiring WS2$g$2 will be referred to as the signal pin PN3$g$2. The signal pin PN3 electrically connected to the lead LD6$g$3 via the gate signal wiring WS2$g$3 will be referred to as the signal pin PN3$g$3. The signal pin PN3 electrically connected to the lead LD6$g$4 via the gate signal wiring WS2$g$4 will be referred to as the signal pin PN3$g$4. The signal pin PN3 electrically connected to the lead LD6$g$5 via the gate signal wiring WS2$g$5 will be referred to as the signal pin PN3$g$5. The signal pin PN3 electrically connected to the lead LD6$g$6 via the gate signal wiring WS2$g$6 will be referred to as the signal pin PN3$g$6.

The gate signal wirings WS2$g$1, WS2$g$2, WS2$g$3, WS2$g$4, WS2$g$5, and WS2$g$6 are wirings for transmitting the gate signals from the semiconductor device PKG6 (driver circuit unit DR) to each gate of the power MOSFETs 1, 2, 3, 4, 5, and 6, and are formed on the lower surface side of the control wiring substrate PB2. Plane layout of the gate signal wirings WS2$g$1, WS2$g$2, WS2$g$3, WS2$g$4, WS2$g$5, and WS2$g$6 is shown in FIG. 49.

As can be understood from FIG. 46, the lead LD6$g$1 of the semiconductor device PKG6 is electrically connected to the gate signal wiring WS2$g$1 via the conductive bonding material SZ, and is electrically connected to the signal pin PN3$g$1 via the gate signal wiring WS2$g$1. This signal pin PN3$g$1 is electrically connected to the gate lead LD1$a$ of the semiconductor device PKG1 via the signal wiring WS3 of the power wiring substrate PB1 and the chip resistor R2$a$. The lead LD6$g$2 of the semiconductor device PKG6 is electrically connected to the gate signal wiring WS2$g$2 via the conductive bonding material SZ, and is electrically connected to the signal pin PN3$g$2 via the gate signal wiring WS2$g$2. This signal pin PN3$g$2 is electrically connected to the gate lead LD1$c$ of the semiconductor device PKG1 via the signal wiring WS3 of the power wiring substrate PB1 and the chip resistor R3$a$. The lead LD6$g$3 of the semiconductor device PKG6 is electrically connected to the gate signal wiring WS2$g$3 via the conductive bonding material SZ, and is electrically connected to the signal pin PN3$g$3 via the gate signal wiring WS2$g$3. This signal pin PN3$g$3 is electrically connected to the gate lead LD1$a$ of the semiconductor device PKG2 via the signal wiring WS3 of the power wiring substrate PB1 and the chip resistor R5$a$. The lead LD6$g$4 of the semiconductor device PKG6 is electrically connected to the gate signal wiring WS2$g$4 via the conductive bonding material SZ, and is electrically connected to the signal pin PN3$g$4 via the gate signal wiring WS2$g$4. This signal pin PN3$g$4 is electrically connected to the gate lead LD1$c$ of the semiconductor device PKG2 via the signal wiring WS3 of the power wiring substrate PB1 and the chip resistor R6$a$. The lead LD6$g$5 of the semiconductor device PKG6 is electrically connected to the gate signal wiring WS2$g$5 via the conductive bonding material SZ, and is electrically connected to the signal pin PN3$g$5 via the gate signal wiring WS2$g$5. This signal pin PN3$g$5 is electrically connected to the gate lead LD1$a$ of the semiconductor device PKG3 via the signal wiring WS3 of the power wiring substrate PB1 and the chip resistor R8$a$. The lead LD6$g$6 of the semiconductor device PKG6 is electrically connected to the gate signal wiring WS2$g$6 via the conductive bonding material SZ, and is electrically connected to the signal pin PN3$g$6 via the gate signal wiring WS2$g$6. This signal pin PN3$g$6 is electrically connected to the gate lead LD1$c$ of the semiconductor device PKG3 via the signal wiring WS3 of the power wiring substrate PB1 and the chip resistor R9$a$.

Thus, the gate signals inputted into the respective gates of the power MOSFETs 1 to 6 are transmitted from the semiconductor device PKG6 to the signal pins PN3$g$1 to PN3$g$6 via the gate signal wirings WS2$g$1 to WS2$g$6 formed on the lower surface side of the control wiring substrate PB2. The conductive path between the signal pin PN3g1 and the lead LD6g1, the conductive path between the signal pin PN3g2 and the lead LD6g2, and the conductive path between the signal pin PN3g3 and the lead LD6g3 use the signal wiring WS2 on the lower surface side of the control wiring substrate PB2, but do not use the signal wiring WS1 on the upper surface side of the control wiring substrate PB2. The conductive path between the signal pin PN3g4 and the lead LD6g4, the conductive path between the signal pin PN3g5 and the lead LD6g5, and the conductive path between the signal pin PN3g6 and the lead LD6g6 also use the signal wiring WS2 on the lower surface side of the control wiring substrate PB2, but do not use the signal wiring WS1 on the upper surface side of the control wiring substrate PB2. Therefore, the gate signals transmitted from the leads LD6g1, LD6g2, LD6g3, LD6g4, LD6g5, and LD6g6 of the semiconductor device PKG6 to gate leads LD1a and LD1c of each of the semiconductor devices PKG1, PKG2, and PKG3 do without passing through the via portion (VH) of the control wiring substrate PB2. Thereby, it is possible to enhance the signal quality of the gate signal transmitted from the semiconductor device PKG6 to the gate leads LD1a and LD1c of each of the semiconductor devices PKG1, PKG2, and PKG3.

In addition, as shown in FIG. 47, each of the leads LD6s1, LD6s2, LD6s3, LD6s4, LD6s5, and LD6s6 of the semiconductor device PKG6 is joined to the signal wiring WS2 on the lower surface side of the control wiring substrate PB2 via the conductive bonding material SZ, and is electrically connected to the signal pin PN3 via the signal wiring WS2.

Here, the lead LD6 electrically connected to the source lead LD1b of the semiconductor device PKG1 via the wirings (WS2 and WS3) and the signal pin PN3 will be referred to as the lead LD6s1. The lead LD6 electrically connected to the source lead LD1d of the semiconductor device PKG1 via the wirings (WS2 and WS3) and the signal pin PN3 will be referred to as the lead LD6s2. The lead LD6 electrically connected to the source lead LD1b of the semiconductor device PKG2 via the wirings (WS2 and WS3) and the signal pin PN3 will be referred to as the lead LD6s3. The lead LD6 electrically connected to the source lead LD1d of the semiconductor device PKG2 via the wirings (WS2 and WS3) and the signal pin PN3 will be referred to as the lead LD6s4. The lead LD6 electrically connected to the source lead LD1b of the semiconductor device PKG3 via the wirings (WS2 and WS3) and the signal pin PN3 will be referred to as the lead LD6s5. The lead LD6 electrically connected to the source lead LD1d of the semiconductor device PKG3 via the wirings (WS2 and WS3) and the signal pin PN3 will be referred to as the lead LD6s6. The leads LD6s1, LD6s2, LD6s3, LD6s4, LD6s5, and LD6s6 are included in the plurality of leads LD6a2 that the semiconductor device PKG6 explained above has.

In addition, the signal wiring WS2 connected to the lead LD6s1 will be referred to as the source wiring WS2s1. The signal wiring WS2 connected to the lead LD6s2 will be referred to as the source wiring WS2s2. The signal wiring WS2 connected to the lead LD6s3 will be referred to as the source wiring WS2s3. The signal wiring WS2 connected to the lead LD6s4 will be referred to as the source wiring WS2s4. The signal wiring WS2 connected to the lead LD6s5 will be referred to as the source wiring WS2s5. The signal wiring WS2 connected to the lead LD6s6 will be referred to as the source wiring WS2s6.

The source wirings WS2s1, WS2s2, WS2s3, WS2s4, WS2s5, and WS2s6 are respectively wirings electrically connected to the sources of the power MOSFETs 1, 2, 3, 4, 5, and 6, and are formed on the lower surface side of the control wiring substrate PB2. Plane layout of the source wirings WS2s1, WS2s2, WS2s3, WS2s4, WS2s5, and WS2s6 is shown in FIG. 49.

In addition, the signal pin PN3 electrically connected to the lead LD6s1 via the source wiring WS2s1 will be referred to as the signal pin PN3s1. The signal pin PN3 electrically connected to the lead LD6s2 via the source wiring WS2s2 will be referred to as the signal pin PN3s2. The signal pin PN3 electrically connected to the lead LD6s3 via the source wiring WS2s3 will be referred to as the signal pin PN3s3. The signal pin PN3 electrically connected to the lead LD6s4 via the source wiring WS2s4 will be referred to as the signal pin PN3s4. The signal pin PN3 electrically connected to the lead LD6s5 via the source wiring WS2s5 will be referred to as the signal pin PN3s5. The signal pin PN3 electrically connected to the lead LD6s6 via the source wiring WS2s6 will be referred to as the signal pin PN3s6.

As can be understood from FIG. 47, the lead LD6s1 of the semiconductor device PKG6 is electrically connected to the source wiring WS2s1 via the conductive bonding material SZ, and is electrically connected to the signal pin PN3s1 via the source wiring WS2s1. This signal pin PN3s1 is electrically connected to the source lead LD1b of the semiconductor device PKG1 via the signal wiring (WS3) of the power wiring substrate PB1. The lead LD6s2 of the semiconductor device PKG6 is electrically connected to the source wiring WS2s2 via the conductive bonding material SZ, and is electrically connected to the signal pin PN3s2 via the source wiring WS2s2. This signal pin PN3s2 is electrically connected to the source lead LD1d of the semiconductor device PKG1 via the signal wiring (WS3) of the power wiring substrate PB1. The lead LD6s3 of the semiconductor device PKG6 is electrically connected to the source wiring WS2s3 via the conductive bonding material SZ, and is electrically connected to the signal pin PN3s3 via the source wiring WS2s3. This signal pin PN3s3 is electrically connected to the source lead LD1b of the semiconductor device PKG2 via the signal wiring (WS3) of the power wiring substrate PB1. The lead LD6s4 of the semiconductor device PKG6 is electrically connected to the source wiring WS2s4 via the conductive bonding material SZ, and is electrically connected to the signal pin PN3s4 via the source wiring WS2s4. This signal pin PN3s4 is electrically connected to the source lead LD1d of the semiconductor device PKG2 via the signal wiring (WS3) of the power wiring substrate PB1. The lead LD6s5 of the semiconductor device PKG6 is electrically connected to the source wiring WS2s5 with a conductive bonding material SZ interposed therebetween, and is electrically connected to the signal pin PN3s5 via the source wiring WS2s5. This signal pin PN3s5 is electrically connected to the source lead LD1b of the semiconductor device PKG3 via the signal wiring (WS3) of the power wiring substrate PB1. The lead LD6s6 of the semiconductor device PKG6 is electrically connected to the source wiring WS2s6 via the conductive bonding material SZ, and is electrically connected to the signal pin PN3s6 via the source wiring WS2s6. This signal pin PN3s6 is electrically connected to the source lead LD1d of the semiconductor device PKG3 via the signal wiring (WS3) of the power wiring substrate PB1.

As can be understood from FIG. 49, on the lower surface side of the control wiring substrate PB2, the source wiring WS2s1 electrically connected to the source of the power MOSFET 1 is formed to run in parallel with the gate signal wiring WS2g1 electrically connected to the gate of the power MOSFET 1. That is, the source wiring WS2s1 extends along the gate signal wiring WS2g1. On the lower surface side of the control wiring substrate PB2, the source wiring WS2s2 electrically connected to the source of the power MOSFET 2 is formed to run in parallel with the gate signal wiring WS2g2 electrically connected to the gate of the power MOSFET 2. That is, the source wiring WS2s2 extends along the gate signal wiring WS2g2. On the lower surface side of the control wiring substrate PB2, the source wiring WS2s3 electrically connected to the source of the power MOSFET 3 is formed to run in parallel with the gate signal wiring WS2g3 electrically connected to the gate of the power MOSFET 3. That is, the source wiring WS2s3 extends along the gate signal wiring WS2g3. On the lower surface side of the control wiring substrate PB2, the source wiring WS2s4 electrically connected to the source of the power MOSFET 4 is formed to run in parallel with the gate signal wiring WS2g4 electrically connected to the gate of the power MOSFET 4. That is, the source wiring WS2s4 extends along the gate signal wiring WS2g4. On the lower surface side of the control wiring substrate PB2, the source wiring WS2s5 electrically connected to the source of the power MOSFET 5 is formed to run in parallel with the gate signal wiring WS2g5 electrically connected to the gate of the power MOSFET 5. That is, the source wiring WS2s5 extends along the gate signal wiring WS2g5. On the lower surface side of the control wiring substrate PB2, the source wiring WS2s6 electrically connected to the source of the power MOSFET 6 is formed to run in parallel with the gate signal wiring WS2g6 electrically connected to the gate of the power MOSFET 6. That is, the source wiring WS2s6 extends along the gate signal wiring WS2g6.

Thus, the respective source wirings WS2s1 to WS2s6 electrically connected to the sources of the power MOSFETs 1 to 6 are provided to run adjacently to and in parallel with the respective gate signal wirings WS2g1 to WS2g6 electrically connected to the gates of the power MOSFETs 1 to 6. At this occasion, the gate signal wiring and the source wiring electrically connected to the gate and the source of the same power MOSFET run (extend) adjacently to and in parallel with each other. Thereby, the gate signal wiring and the source wiring electrically connected to the gate and the source of the same power MOSFET are combined (coupled) respectively, and the respective gate signal wirings (WS2g1, WS2g2, WS2g3, WS2g4, WS2g5, and WS2g6) are less likely to be subjected to influences due to wirings other than the source wirings running adjacently to them. Therefore, the respective gate signal wirings (WS2g1, WS2g2, WS2g3, WS2g4, WS2g5, and WS2g6) are less likely to be subjected to influences due to signals other than the signals (gate signals) to be transmitted therethrough. Accordingly, it is possible to enhance the signal quality of the gate signal transmitted through the gate signal wiring, and to further improve the performance and the reliability of the electronic device.

In addition, in the case of FIG. 49, the gate signal wiring WS2g1, the source wiring WS2s1, the gate signal wiring WS2g2, the source wiring WS2s2, the gate signal wiring WS2g3, the source wiring WS2s3, the gate signal wiring WS2g4, the source wiring WS2s4, the gate signal wiring WS2g5, the source wiring WS2s5, the gate signal wiring WS2g6, and the source wiring WS2s6 are arranged in this order.

As can be understood from FIG. 49, the source wiring WS2s1 is arranged between the gate signal wiring WS2g1 and the gate signal wiring WS2g2, but a distance (W1) between the source wiring WS2s1 and the gate signal wiring WS2g1 is preferably less than a distance (W2) between the source wiring WS2s1 and the gate signal wiring WS2g2 (i.e., W1<W2). Thereby, the gate signal wiring WS2g1 and the source wiring WS2s1 electrically connected to the gate and the source of the same power MOSFET 1 approach each other and are coupled more strongly, so that the signal quality of the gate signal transmitted through the gate signal wiring WS2g1 can be further improved.

Likewise, the source wiring WS2s2 is arranged between the gate signal wiring WS2g2 and the gate signal wiring WS2g3, but a distance (W1) between the source wiring WS2s2 and the gate signal wiring WS2g2 is preferably less than a distance (W2) between the source wiring WS2s2 and the gate signal wiring WS2g3. The source wiring WS2s3 is arranged between the gate signal wiring WS2g3 and the gate signal wiring WS2g4, but a distance (W1) between the source wiring WS2s3 and the gate signal wiring WS2g3 is preferably less than a distance (W2) between the source wiring WS2s3 and the gate signal wiring WS2g4. The source wiring WS2s4 is arranged between the gate signal wiring WS2g4 and the gate signal wiring WS2g5, but a distance (W1) between the source wiring WS2s4 and the gate signal wiring WS2g4 is preferably less than a distance (W2) between the source wiring WS2s4 and the gate signal wiring WS2g5. The source wiring WS2s5 is arranged between the gate signal wiring WS2g5 and the gate signal wiring WS2g6, but a distance (W1) between the source wiring WS2s5 and the gate signal wiring WS2g5 is preferably less than a distance (W2) between the source wiring WS2s5 and the gate signal wiring WS2g6. Thereby, the gate signal wiring and the source wiring electrically connected to the gate and the source of the same power MOSFET approach each other and are coupled more strongly, so that the signal quality of the gate signal transmitted through each gate signal wiring can be further improved.

From another point of view, the gate signal wiring WS2g2 is arranged between the source wiring WS2s1 and the source wiring WS2s2, but the distance (W1) between the gate signal wiring WS2g2 and the source wiring WS2s2 is preferably less than the distance (W2) between the gate signal wiring WS2g2 and the source wiring WS2s1. Likewise, the gate signal wiring WS2g3 is arranged between the source wiring WS2s2 and the source wiring WS2s3, but the distance (W1) between the gate signal wiring WS2g3 and the source wiring WS2s3 is preferably less than the distance (W2) between the gate signal wiring WS2g3 and the source wiring WS2s2. The gate signal wiring WS2g4 is arranged between the source wiring WS2s3 and the source wiring WS2s4, but the distance (W1) between the gate signal wiring WS2g4 and the source wiring WS2s4 is preferably less than the distance (W2) between the gate signal wiring WS2g4 and the source wiring WS2s3. The gate signal wiring WS2g5 is arranged between the source wiring WS2s4 and the source wiring WS2s5, but the distance (W1) between the gate signal wiring WS2g5 and the source wiring WS2s5 is preferably less than the distance (W2) between the gate signal wiring WS2g5 and the source wiring WS2s4. The gate signal wiring WS2g6 is arranged between the source wiring WS2s5 and the source wiring WS2s6, but the distance (W1) between the gate signal wiring WS2g6 and the source wiring WS2s6 is preferably less than the distance (W2) between the gate signal wiring WS2g6 and the source wiring WS2s5. Therefore, the gate signal wiring and the source wiring electrically connected to the gate and the source of the same power MOSFET are arranged more closely to each other to be coupled more strongly, so that the signal quality of the gate signal transmitted through each gate signal wiring can be further improved.

Namely, in FIG. 49, the distance W1 and the distance W2 preferably satisfy the relationship of W1<W2.

Incidentally, FIG. 49 shows the case where the distance (W1) between the gate signal wiring WS2g1 and the source wiring WS2s1, the distance (W1) between the gate signal wiring WS2g2 and the source wiring WS2s2, the distance (W1) between the gate signal wiring WS2g3 and the source wiring WS2s3, the distance (W1) between the gate signal wiring WS2g4 and the source wiring WS2s4, the distance (W1) between the gate signal wiring WS2g5 and the source wiring WS2s5, and the distance (W1) between the gate signal wiring WS2g6 and the source wiring WS2s6 are the same as each other, but may not be necessarily the same.

Incidentally, in FIG. 49, positions of the gate signal wiring and the source wiring may be replaced with each other. In such a case, the source wiring WS2s1, the gate signal wiring WS2g1, the source wiring WS2s2, the gate signal wiring WS2g2, the source wiring WS2s3, the gate signal wiring WS2g3, the source wiring WS2s4, the gate signal wiring WS2g4, the source wiring WS2s5, the gate signal wiring WS2g5, the source wiring WS2s6, and the gate signal wiring WS2g6 are arranged in this order. In this case, the source wiring WS2s2 is arranged between the gate signal wiring WS2g1 and the gate signal wiring WS2g2, but the distance between the source wiring WS2s2 and the gate signal wiring WS2g2 is preferably less than the distance between the source wiring WS2s2 and the gate signal wiring WS2g1. The source wiring WS2s3 is arranged between the gate signal wiring WS2g2 and the gate signal wiring WS2g3, but the distance between the source wiring WS2s3 and the gate signal wiring WS2g3 is preferably less than the distance between the source wiring WS2s3 and the gate signal wiring WS2g2. The source wirings WS2s4, WS2s5, and WS2s6 are also arranged in a similar manner.

Subsequently, a structure in which the semiconductor device PKG6 mounted on the control wiring substrate PB2 and the chip resistors R1a, R4a, and R7a mounted on the power wiring substrate PB1 are electrically connected via the signal wiring of the control wiring substrate PB2, the signal pin PN3, and the wirings of the power wiring substrate PB1 will be explained with reference of FIG. 48.

As explained with reference to above FIG. 1, both ends of each of the resistors R1, R4, and R7 are connected to the detection circuit in the driver circuit unit DR. Therefore, as shown in FIG. 48, both electrodes of each of the chip resistors R1a, R4a, and R7a are electrically connected to any lead LD6a2 of the semiconductor device PKG6 via the signal wiring (WS3) of the power wiring substrate PB1, the signal pin PN3, and the signal wirings (WS2 and WS1) of the control wiring substrate PB2, respectively. Incidentally, both electrodes of each of the chip resistors R1a, R4a, and R7a are joined to and electrically connected to the signal wiring (WS3) of the power wiring substrate via the conductive bonding material SZ.

In the present embodiment, the conductive path of the control wiring substrate PB2 out of the conductive paths electrically connecting each of both electrodes of each of the chip resistors R1a, R4a, and R7a and the lead LD6 of the semiconductor device PKG6, uses the signal wiring WS2 on the lower surface side of the control wiring substrate PB2, the signal wiring WS1 on the upper surface side of the control wiring substrate PB2, and the via portion VH connecting the signal wirings WS1 and WS2. That is, each of the both electrodes of each of the chip resistors R1a, R4a, and R7a is electrically connected to the lead LD6 of the semiconductor device PKG6 via the signal wiring of the power wiring substrate PB1 (WS3), the signal pin PN3, the signal wiring WS1 on the upper surface side of the control wiring substrate PB2, the via portion VH connecting the signal wiring WS1 and WS2, the signal wiring WS2 on the lower surface side of the control wiring substrate PB2.

The gate signal wirings WS2g1 to WS2g6 and the source wirings WS2s1 to WS2s6 are formed by the signal wiring WS2 on the lower surface side of the control wiring substrate PB2, and does not use the wiring (WS1) on the upper surface side of the control wiring substrate PB2. On the other hand, the conductive path electrically connecting both electrodes of each of the chip resistors R1a, R4a, and R7a and the lead LD6 of the semiconductor device PKG6 uses not only the signal wiring WS2 on the lower surface side of the control wiring substrate PB2 but also the signal wiring WS1 at the upper surface side of the control wiring substrate PB2. Thereby, the gate signal wirings WS2g1 to WS2g6 and the source wirings WS2s1 to WS2s6 do not become the obstacles, and both electrodes of each of the chip resistors R1a, R4a, and R7a and the lead LD6 of the semiconductor device PKG6 can be electrically connected by using the wirings (WS1 and WS2) on both surfaces of the control wiring substrate PB2. The gate signal wirings WS2g1 to WS2g6 are required to enhance their signal quality for the gate signal(s) transmitted therethrough. In contrast, the conductive path electrically connecting the both electrodes of each of the chip resistors R1a, R4a, and R7a and the lead LD6 of the semiconductor device PKG6 does not required to have such high high signal quality. Therefore, the transmission path of the gate signal to the power MOSFETs 1 to 6 does not pass through the via portion (VH) of the control wiring substrate PB2, but even if the conductive path electrically connecting the both electrodes of each of the chip resistors R1a, R4a, and R7a and the lead LD6 of the semiconductor device PKG6 passes through the via portion (VH) of the control wiring substrate PB2, a problem does without arising.

Subsequently, the implementation structure of the semiconductor devices PKG1, PKG2, and PKG3 onto the power wiring substrate PB1 will be briefly explained with reference to FIGS. 46 and 47.

As can be understood from FIG. 46, each die pad DP1 of the semiconductor devices PKG1, PKG2, and PKG3 is joined to and electrically connected, via the conductive bonding material SZ (for example, solder), to the power supply wiring WV3 formed at the upper surface side of the power wiring substrate PB1. The power supply wiring WV3 connected to the die pad DP1 of the semiconductor device PKG1, the power supply wiring WV3 connected to the die pad DP1 of the semiconductor device PKG2, and the power supply wiring WV3 connected to the die pad DP1 of the semiconductor device PKG3 are electrically connected by linking with each other. The power supply wiring WV3 is electrically connected to the power supply connection pin PN1. Thereby, the power supply potential VIN supplied from the power supply connection pin PN1 to the power supply wiring WV3 is supplied to each die pad DP1 of the semiconductor devices PKG1, PKG2, and PKG3, and further supplied to a back surface electrode BE1 of each semiconductor chip CP1 of the semiconductor devices PKG1, PKG2, and PKG3 (i.e., each drain of the power MOSFETs 1, 3, and 5).

In addition, as can be understood from FIG. 47, each die pad DP2 of the semiconductor devices PKG1, PKG2, and PKG3 is joined to and electrically connected, via the conductive bonding material SZ, to an output wiring WD3 formed on the upper surface side of the power wiring substrate PB1. However, the output wiring WD3 connected to the die pad DP2 of the semiconductor device PKG1, the output wiring WD3 connected to the die pad DP2 of the semiconductor device PKG2, and the output wiring WD3 connected to the die pad DP2 of the semiconductor device PKG3 are separated from each other and are not electrically connected to each other. The output wiring WD3 connected to the die pad DP2 of the semiconductor device PKG1 is electrically connected to the connection pin BB1. The output wiring WD3 connected to the die pad DP2 of the semiconductor device PKG2 is electrically connected to the connection pin BB2. The output wiring WD3 connected to the die pad DP2 of the semiconductor device PKG3 is electrically connected to the connection pin BB3. Thereby, an output (an output current or an output voltage) from the die pad DP2 of the semiconductor device PKG1 can pass through the output wiring WD3 and the connection pin BB1, and be transmitted (supplied) to (the U-phase coil of) the motor MOT. An output (an output current or an output voltage) from the die pad DP2 of the semiconductor device PKG2 can pass through the output wiring WD3 and the connection pin BB2, and be transmitted (supplied) to (the V-phase coil of) the motor MOT. An output (an output current or an output voltage) from the die pad DP2 of the semiconductor device PKG3 can pass through the output wiring WD3 and the connection pin BB3, and be transmitted (supplied) to (the W-phase coil of) the motor MOT. That is, the output (the output current or the output voltage) from each die pad DP2 of the semiconductor devices PKG1, PKG2, and PKG3 is supplied to the motor MOT, so that the motor MOT can be driven.

In addition, each of the gate leads LD1$a$ and LD1$c$ of the semiconductor devices PKG1, PKG2, and PKG3 is joined to and electrically connected, via the conductive bonding material SZ, to the signal wiring WS3 formed on the upper surface side of the power wiring substrate PB1, and is electrically connected to the signal pin PN3 (PN3$g$1, PN3$g$2, PN3$g$3, PN3$g$4, PN3$g$5, and PN3$g$6) via the signal wiring WS3 and the like. Each of the source leads LD1$b$ and LD1$d$ of the semiconductor devices PKG1, PKG2, and PKG3 is joined to and electrically connected, via the conductive bonding material SZ, to the signal wiring WS3 formed on the upper surface side of the power wiring substrate PB1, and is electrically connected to the signal pin PN3 (PN3$s$1, PN3$s$2, PN3$s$3, PN3$s$4, PN3$s$5, and PN3$s$6) via the signal wiring WS3 and the like.

In addition, each source lead LD1$d$ of the semiconductor devices PKG1, PKG2, and PKG3 is electrically connected also to the ground wiring of the power wiring substrate PB1. The ground wiring of the power wiring substrate PB1 is electrically connected to the ground connection pin PN2, and the ground potential GND supplied from the ground connection pin PN2 to the ground wiring of the power wiring substrate PB1 is supplied to each source lead LD1$d$ of the semiconductor devices PKG1, PKG2, and PKG3. Thereby, the ground potential GND is supplied to the source pad PDS of each semiconductor chip CP2 of the semiconductor devices PKG1, PKG2, and PKG3 (i.e., each source of the power MOSFET 2, 4, and 6). In each of the semiconductor devices PKG1, PKG2, and PKG3, the source lead LD1$b$ (the source of the high side MOSFET) and the die pad DP2 (the drain of the low side MOSFET) are electrically connected to each other via the wirings of the power wiring substrate PB1 and the like.

In addition, in the present embodiment, a plurality of semiconductor devices having power transistors for switching (corresponding to the semiconductor devices PKG1, PKG2, and PKG3 in this case) are mounted on the power wiring substrate PB1. More particularly, three semiconductor devices having power transistors for switching are mounted on the power wiring substrate PB1. This reflects the fact that a target to be driven by the electronic device according to the present embodiment is a three-phase motor. In a case where the target to be driven is those other than the three-phase motor, the number of semiconductor devices (semiconductor devices having power transistors for switching) mounted on the power wiring substrate PB1 may be other than three. For example, one semiconductor device having a power transistor(s) for switching may be mounted on the power wiring substrate PB1, or a plurality of semiconductor devices having power transistors for switching may be mounted on the power wiring substrate PB1.

In the foregoing, the invention made by the inventors of the present invention has been concretely described based on the embodiments. However, it is needless to say that the present invention is not limited to the foregoing embodiments and various modifications and alterations can be made within the scope of the present invention.

REFERENCE SIGNS LIST 1, 2, 3, 4, 5, and 6 power MOSFET
11, 12 ECU
BB, BB1, BB2, BB3 connection pin
BD1, BD2, BD4, BD5, BD6 bonding material
BE1, BE4 back surface electrode
BS1, BS2 base material layer
CB cable
CB1 power supply cable
CB2 ground cable
CD1$a$, CD1$b$, CD1$c$, CD2$a$, CD2$b$, CD2$c$ conductive film
CP1, CP2 semiconductor chip
CT control circuit unit
CV cover member
DP1, DP2, DP4, DP5, DP6 die pad
ENG engine
GS fuel
HC, HC1, HC2, HC3, HM, HM1, HM2, HM3, HP, HP1, HP2, HP3, HT1, HT2, NH1, NH2, NH2$a$, NH2$b$, NH4$a$, NH4$b$ hole
HS heat radiation sheet
IMP impeller
LD1, LD4, LD4$a$, LD4$b$, LD5, LD5$a$, LD5$b$, LD5$c$, LD6, LD6$a$, LD6$a$1, LD6$a$2, LD6$b$, LD6$c$, LD6$d$, LD6$g$l to LD6$g$6, LD6$s$1 to LD6$s$6 lead
LD1$e$, LD1$f$, LD1$g$, LD1$h$ drain lead
LD1$a$, LD1$c$ gate lead
LD1$b$, LD1$c$ source lead
MOT motor
MR1, MR4, MR5, MR6 sealing portion
NG1, NG2$a$, NG2$b$ screw
NH3 screw hole
OP1, OP2, OP3, OP4 opening portion
PB1 power wiring substrate
PB2 control wiring substrate
PDG gate pad
PDS source pad
PK power system circuit configuration unit
PKG1, PKG2, and PKG3, PKG4, PKG5, PKG6 semiconductor device
PM fuel pump
PN connection pin
PN1 power supply connection pin
PN2 ground connection pin
PN3, PN3$g$1 to PN3$g$6, PN3$s$1 to PN3$s$6 signal pin R1 to R9 resistor
R1a to R9a chip resistor
RE regulator
RG1, RG2, RG3, RG4, RG5 area
RS1a, RS1b, RS2a, RS2b resist layer
SFT shaft
SK control system circuit configuration unit
SZ bonding material
TK discharge port
VH via portion
WA1, WA4, WA5, WA6, wire
WD3 output wiring
WG1, WG1a, WG1b, WG1c, WG2, WG2a, WG2b, WG2c, WG3 ground wiring
WS1, WS1a, WS2, WS2a, WS2b, WS2g1 to WS2g6, WS2s1 to WS2s6, WS3 signal wiring
WC1, WC2, WV1, WV2, WV3 power supply wiring

The invention claimed is:

1. An electronic device comprising:
a first wiring substrate including a first principal surface and a second principal surface opposite to the first principal surface;
a second wiring substrate including a third principal surface and a fourth principal surface opposite to the third principal surface;
a first semiconductor device having a power transistor for switching;
a second semiconductor device including a driving circuit for driving the first semiconductor device;
a third semiconductor device including a voltage generation circuit for converting, into a second power supply voltage, a first power supply voltage supplied from outside;
a fourth semiconductor device including a control circuit operating with the second power supply voltage supplied from the third semiconductor device, the control circuit controlling the second semiconductor device; and
a plurality of connection members electrically connecting the first wiring substrate and the second wiring substrate,
wherein the first wiring substrate and the second wiring substrate oppose each other,
the first wiring substrate includes a plurality of first hole portions through which the plurality of connection members are inserted,
the first semiconductor device is mounted on the third principal surface of the second wiring substrate,
the second semiconductor device and the fourth semiconductor device are mounted on the first principal surface of the first wiring substrate,
the third semiconductor device is mounted on the second principal surface of the first wiring substrate,
out of a second area and a third area adjacent to each other via a first area in which the plurality of first hole portions are arranged on the first principal surface of the first wiring substrate, the second semiconductor device and the fourth semiconductor device are mounted on the second area, and
out of a fourth area positioned opposite the second area and a fifth area positioned opposite the third area on the second principal surface of the first wiring substrate, the third semiconductor device is mounted on the fifth area.

2. The electronic device according to claim 1,
wherein the plurality of first hole portions are arranged in a first direction on the first principal surface of the first wiring substrate.

3. The electronic device according to claim 2,
wherein the second semiconductor device and the fourth semiconductor device are arranged alongside in the first direction on the first principal surface of the first wiring substrate.

4. The electronic device according to claim 1,
wherein the first wiring substrate includes a first ground pattern supplying a ground potential on a first principal surface side,
the first ground pattern includes: a second ground pattern formed in the second area and electrically connected to the third semiconductor device; a third ground pattern formed in the third area and electrically connected to the fourth semiconductor device; and a fourth ground pattern connecting the second ground pattern and the third ground pattern, and
in a plan view, the fourth ground pattern is formed in an area other than that between the third semiconductor device and the fourth semiconductor device.

5. The electronic device according to claim 4,
wherein the fourth ground pattern passes between the two adjacent first hole portions among the plurality of first hole portions.

6. The electronic device according to claim 4,
wherein the first wiring substrate includes a fifth ground pattern supplying the ground potential on a second principal surface side,
the fifth ground pattern includes: a sixth ground pattern formed in the fourth area and electrically connected to the third semiconductor device; a seventh ground pattern formed in the fifth area and electrically connected to the fourth semiconductor device; and an eighth ground pattern connecting the sixth ground pattern and the seventh ground pattern, and
in a plan view, the eighth ground pattern is formed in an area other than that between the third semiconductor device and the fourth semiconductor device.

7. The electronic device according to claim 1,
wherein a plane shape of the first wiring substrate is a circular shape.

8. The electronic device according to claim 1,
wherein the plurality of connection members are a plurality of connection pins.

9. The electronic device according to claim 1,
wherein the first wiring substrate and the second wiring substrate are attached to a motor, and
an output from the first semiconductor device is supplied to the motor in order to drive the motor.

10. The electronic device according to claim 1,
wherein the first principal surface of the first wiring substrate opposes the second wiring substrate.

11. The electronic device according to claim 1,
wherein a gate signal inputted into a gate of the power transistor is transmitted to any one of the plurality of connection members from the second semiconductor device via a gate signal wiring formed on the first principal surface side of the first wiring substrate.

12. The electronic device according to claim 11,
wherein a source wiring electrically connected to a source of the power transistor is formed on the first principal surface side of the first wiring substrate so as to run in parallel with the gate signal wiring.

13. The electronic device according to claim 1,
wherein the first semiconductor device includes a first semiconductor chip with a first power MOSFET, and a second semiconductor chip with a second power MOSFET,
the power transistor is configured by the first power MOSFET and the second power MOSFET connected in series;
a first gate signal wiring transmitting a gate signal inputted into a gate of the first power MOSFET, a first source wiring electrically connected to a source of the first power MOSFET, a second gate signal wiring transmitting a gate signal inputted into a gate of the second power MOSFET, and a second source wiring electrically connected to a source of the second power MOSFET are formed on the first principal surface side of the first wiring substrate,
the first source wiring is formed to run in parallel with the first gate signal wiring,
the second source wiring is formed to run in parallel with the second gate signal wiring,
the first source wiring is placed between the first gate signal wiring and the second gate signal wiring, and
the first source wiring is placed at a position closer to the first gate signal wiring than the second gate signal wiring.

14. The electronic device according to claim 1,
wherein the second semiconductor device and the fourth semiconductor device are electrically connected via a second wiring formed on the first principal surface side of the first wiring substrate and a third wiring formed on the second principal surface side of the first wiring substrate.

15. The electronic device according to claim 1,
wherein the first wiring substrate includes a first terminal to which the first power supply voltage is supplied, and
a distance between the second semiconductor device and the first terminal is less than a distance between the fourth semiconductor device and the first terminal.

16. The electronic device according to claim 1,
wherein the first semiconductor device mounted on the third principal surface of the second wiring substrate is two or more in number.

17. The electronic device according to claim 1,
wherein the first wiring substrate includes a second hole portion at a position encompassed in the third area, and
the second hole portion is a hole having the largest area among holes that the first wiring substrate has.

18. The electronic device according to claim 17,
wherein a pipe passes through the second hole portion.

19. The electronic device according to claim 18,
wherein the first wiring substrate and the second wiring substrate are attached to the motor for a fuel pump,
outputs from the plurality of output terminals are supplied to the motor in order to drive the motor, and
fuel sucked by the fuel pump passes through the pipe.

* * * * *